US007436902B2

(12) United States Patent
Shen et al.

(10) Patent No.: US 7,436,902 B2
(45) Date of Patent: Oct. 14, 2008

(54) MULTI-DIMENSIONAL SPACE GRAY CODE MAPS FOR MULTI-DIMENSIONAL PHASE MODULATION AS APPLIED TO LDPC (LOW DENSITY PARITY CHECK) CODED MODULATION

(75) Inventors: Ba-Zhong Shen, Irvine, CA (US); Tak K. Lee, Irvine, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 658 days.

(21) Appl. No.: 10/866,542

(22) Filed: Jun. 12, 2004

(65) Prior Publication Data

US 2004/0258177 A1 Dec. 23, 2004

Related U.S. Application Data

(60) Provisional application No. 60/478,690, filed on Jun. 13, 2003, provisional application No. 60/523,272, filed on Nov. 19, 2003.

(51) Int. Cl.
*H04L 27/20* (2006.01)
*H04L 27/18* (2006.01)
*H04L 5/12* (2006.01)

(52) U.S. Cl. ................ 375/308; 375/279; 375/302; 375/280; 375/265

(58) Field of Classification Search ........... 375/259, 375/260, 265, 268, 262, 264, 341, 333, 301, 375/302, 308, 320, 322, 323, 329, 330, 279–280, 375/271, 273; 332/103, 108, 112, 115, 119, 332/120, 144, 145, 149, 161
See application file for complete search history.

(56) References Cited

U.S. PATENT DOCUMENTS 2,632,058 A 3/1953 Gray (Continued)

FOREIGN PATENT DOCUMENTS

EP 0 836 305 A2 4/1998

OTHER PUBLICATIONS

R. Gallager, Low-Density Parity-Check Codes, Cambridge, MA: MIT Press, 1963.

(Continued)

*Primary Examiner*—David C. Payne
*Assistant Examiner*—Linda Wong
(74) *Attorney, Agent, or Firm*—Garlick Harrison & Markison; Shayne X. Short

(57) ABSTRACT

Multi-dimensional space Gray code maps for multi-dimensional phase modulation as applied to LDPC (Low Density Parity Check) coded modulation. A novel approach is provided within LDPC coded modulation communication systems that employ multi-dimensional phase modulation, using m-D (multi-dimensional) Gray code maps, to provide for improved performance when compared to communication systems employing 1-D (single-dimensional) Gray code maps. This approach can generate all possible m-D Gray code maps for a 2m-D M PSK modulation system. For example, all of the 2-D Gray code maps may be generated for a communication system using 4-D 8 PSK modulation system (where m=2, and M=8). A variety decoding processing approaches may be employed to perform LDPC coded modulation decoding of multi-dimensional space Gray code mapped signals. The slightly increased decoding complexity (when compared to decoding 1-D Gray code mapped signals) is the computation of symbol metrics and their decomposition to bit metrics.

33 Claims, 41 Drawing Sheets

U.S. PATENT DOCUMENTS

| | | | |
|---|---|---|---|
| 3,542,756 | A | 11/1970 | Gallager |
| 3,665,396 | A | 5/1972 | Forney, Jr. |
| 4,295,218 | A | 10/1981 | Tanner |
| 6,430,233 | B1 | 8/2002 | Dillon et al. |
| 6,473,010 | B1 | 10/2002 | Vityaev et al. |
| 6,473,878 | B1 * | 10/2002 | Wei .............................. 714/755 |
| 6,567,465 | B2 | 5/2003 | Goldstein et al. |
| 6,633,856 | B2 | 10/2003 | Richardson et al. |
| 6,950,461 | B2 * | 9/2005 | Goldstein et al. ............ 375/222 |
| 7,173,978 | B2 * | 2/2007 | Zhang et al. ................. 375/298 |
| 2002/0034261 | A1 * | 3/2002 | Eidson et al. ................ 375/298 |
| 2002/0042899 | A1 | 4/2002 | Tzannes et al. |
| 2003/0074626 | A1 | 4/2003 | Coker et al. |
| 2003/0104788 | A1 | 6/2003 | Sungwook |
| 2004/0128610 | A1 * | 7/2004 | Wei .............................. 714/792 |
| 2004/0184398 | A1 * | 9/2004 | Walton et al. ................ 370/203 |

OTHER PUBLICATIONS

M. Luby, M. Mitzenmacher, A. Shokrollahi, D. Spielman, and V. Stemann, "Practical loss-resilient codes," 1997.

T. J. Richardson and R. L. Urbanke, "The capacity of low-density parity-check code under message-passing decoding," IEEE Trans. Inform. Theory, vol. 47, pp. 599-618, Feb. 2001.

E. Eleftheriou and S. Olcer, "Low-Density Parity-Check Codes For Digital Subscriber Lines," 0-7803-7400-2/02, IEEE, 2002, pp. 1752-1757.

S. S. Pietrobon, R. H. Deng A. Lafanechere, G. Ungerboeck and D. J. Costello, Jr., "Trellis-Coded Multidimensional phase modulation," IEEE Trans. Inform. Theory, vol. 36, pp. 63-89, Jan. 1990.

Moe Wheatley, "WinPSK Technical Reference Manual", 46 pages, Dec. 28, 1999.

Forney G D et al: "Efficient Modulation for Band-Limited Channels", IEEE Journal on Selected Areas in Communications, IEEE Inc. New York, US, vol. 2, No. 5, Sep. 1984, pp. 632-647.

Wadayama T: "A Coded Modulation Scheme Based on Low Density Parity Check Codes", IEICE Transactions on Fundamentals of Electronics, Communications and Computer Sciences, Institute of Electronics Infmormation and Comm. Eng. Tokyo, JP, vol. E84A, No. 10, Oct. 2001, pp. 2523-2527.

Wei L-F; "Trellis-Coded Modulation With Multidimensional Constellations", IEEE Transactions on Information Theory, IEEE Inc., New York, US, vol. IT-33, No. 4, Jul. 1987, pp. 483-501.

Eleftheriou E et al: "Low-Density Parity-Check Codes for Digital Subscriber Lines" ICC 2002. 2002 IEEE International Conference on Communications. Conference Proceedings. New York, NY, Apr. 28-May 2, 2002, vol. 1 of 5, Apr. 28, 2002, pp. 1752-1757.

* cited by examiner

HDTV (High Definition Television) communication system bi-directional cellular communication system uni-directional microwave communication system bi-directional microwave communication system uni-directional point-to-point radio communication system bi-directional point-to-point radio communication system uni-directional communication system bi-directional communication system one to many communication system WLAN (Wireless Local Area Network) communication system DSL (Digital Subscriber Line) communication system satellite receiver STB (Set Top Box) system communication system LDPC (Low Density Parity Check) code bipartite graph direct combining of LDPC (Low Density Parity Check) coding and modulation BICM (Bit Interleaved Coded Modulation)

multilevel coded modulation variable signal mapping LDPC (Low Density Parity Check) coded modulation system LDPC (Low Density Parity Check) coded modulation decoding functionality using bit metric alternative LDPC coded modulation decoding functionality using bit metric (when performing n number of iterations)

LDPC (Low Density Parity Check) coded modulation decoding functionality using bit metric (with bit metric updating)

alternative LDPC coded modulation decoding functionality using bit metric (with bit metric updating) (when performing n number of iterations)

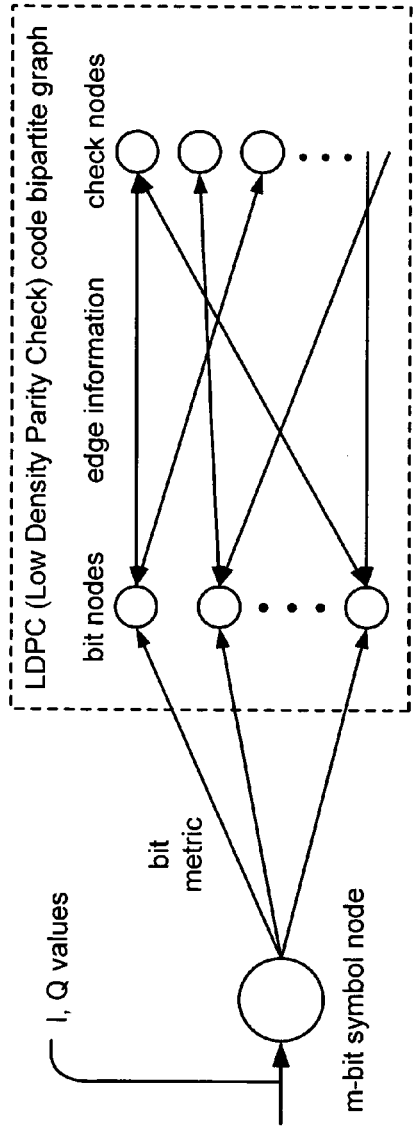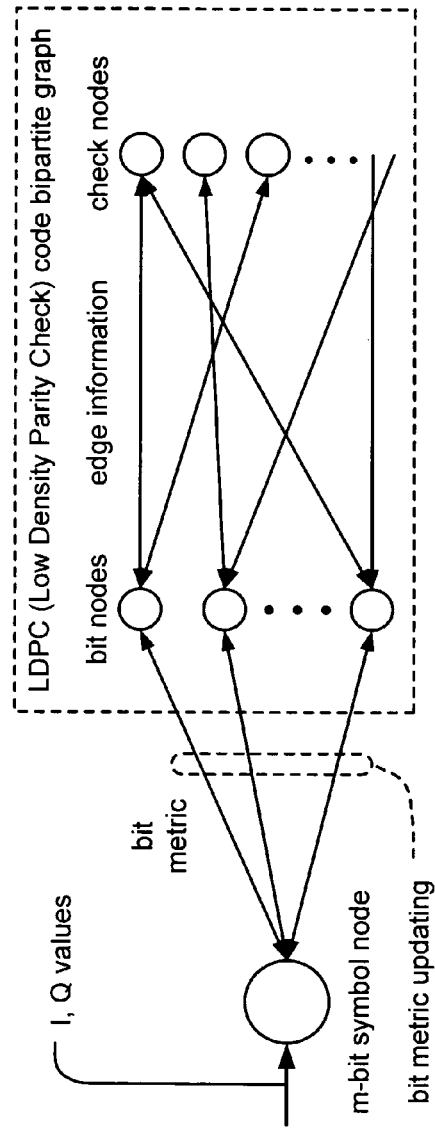
Fig. 26A  bit decoding using bit metric (shown with respect to LDPC code bipartite graph)
Fig. 26B  bit decoding using bit metric updating (shown with respect to LDPC code bipartite graph)

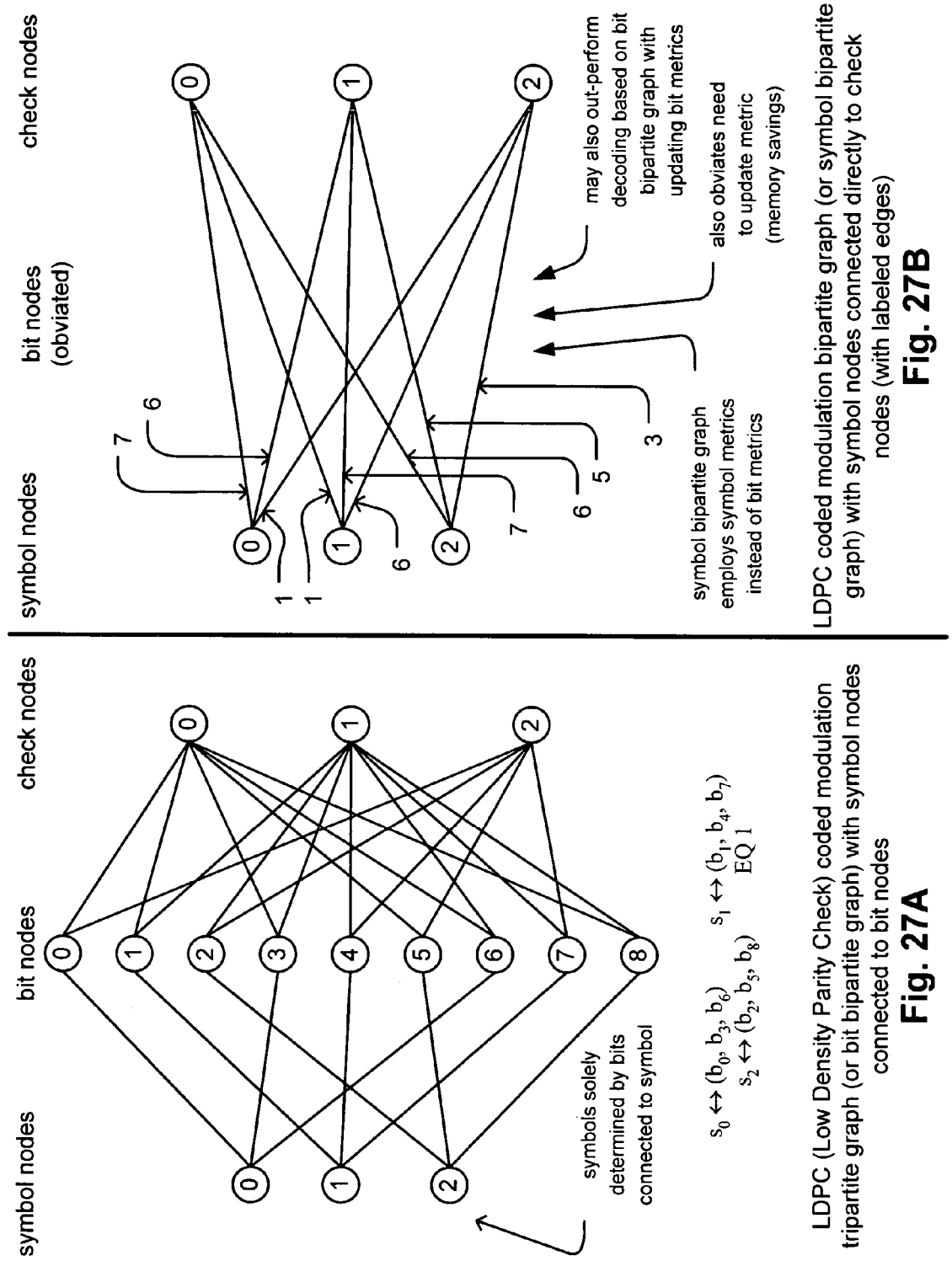

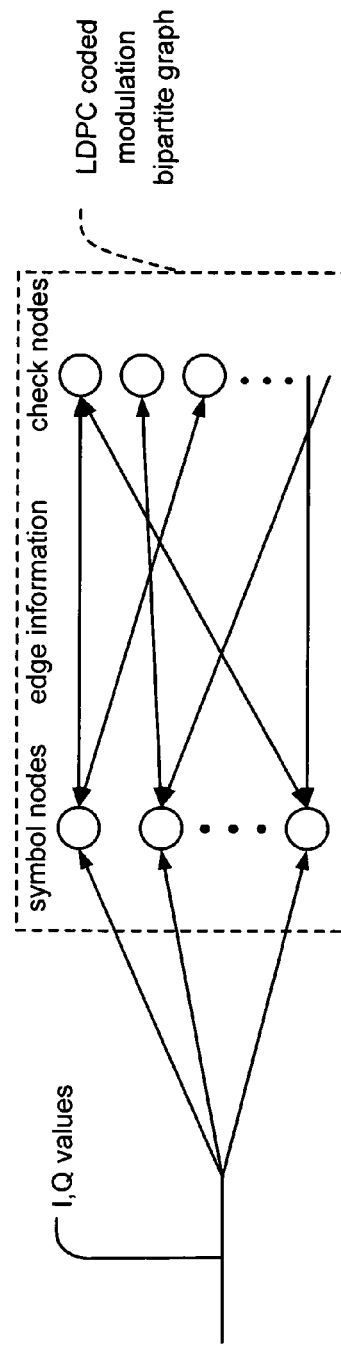
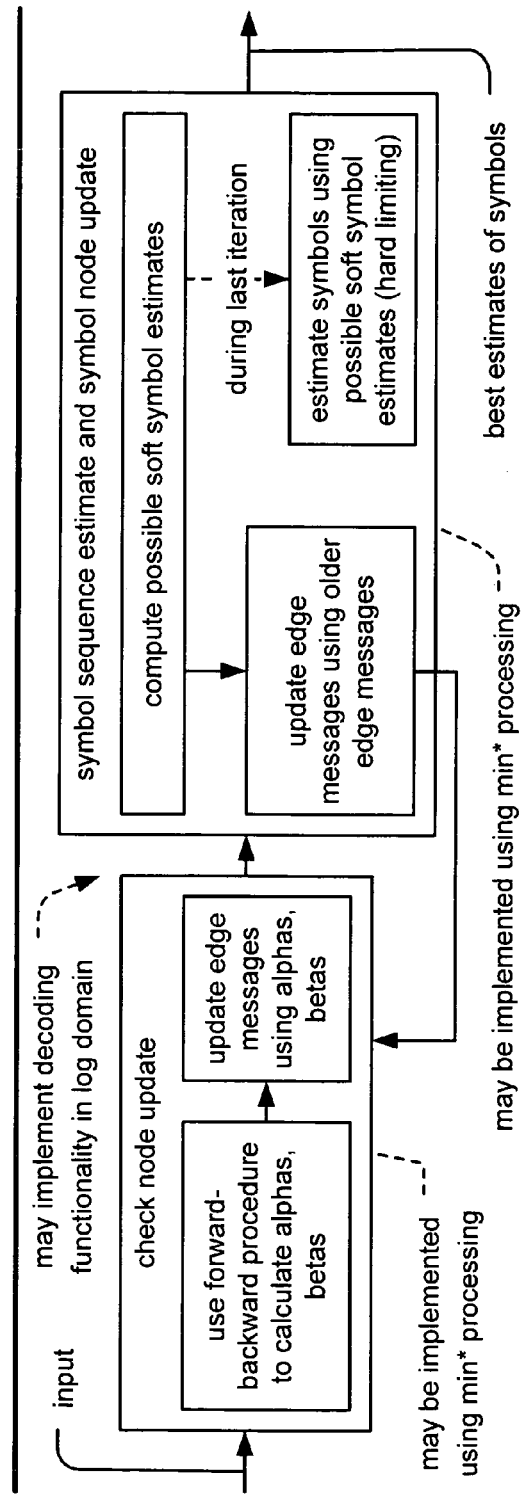

4-D (4-dimensional) QPSK constellation

4-D (4-dimensional) 8 PSK constellation alternative representation of 4-D 8 PSK constellation set method for m-D (m-dimensional) Gray code map construction for 2m-D M PSK modulation (where M is an integer)

functionality of LDPC coded modulation encoding with multi-dimensional space Gray code maps temporal representation of 2m-D M PSK Gray code mapped symbols LDPC coded modulation encoding to support 4-D (4-dimensional) phase modulation $m$-D ($m$-dimensional) Gray code map (shown where $m=2$) constructed using two 1-D (1-dimensional) 3 bit basic Gray code maps (shown using 8 PSK shaped constellations)

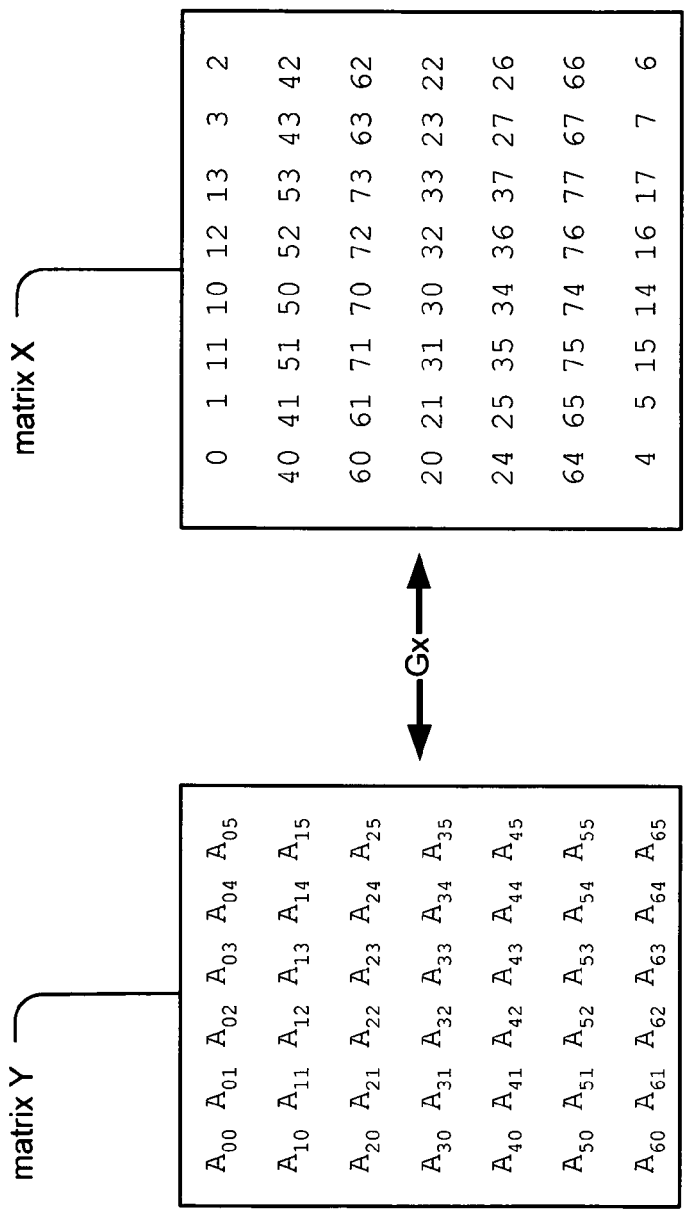
Fig. 37  2-D (2-dimensional) Gray code map (Gx) for rate 5/6 8PSK LDPC coded modulation method for transmit processing multi-dimensional space Gray code mapped LDPC coded modulation signals method for receive processing multi-dimensional space Gray code mapped LDPC coded modulation signals

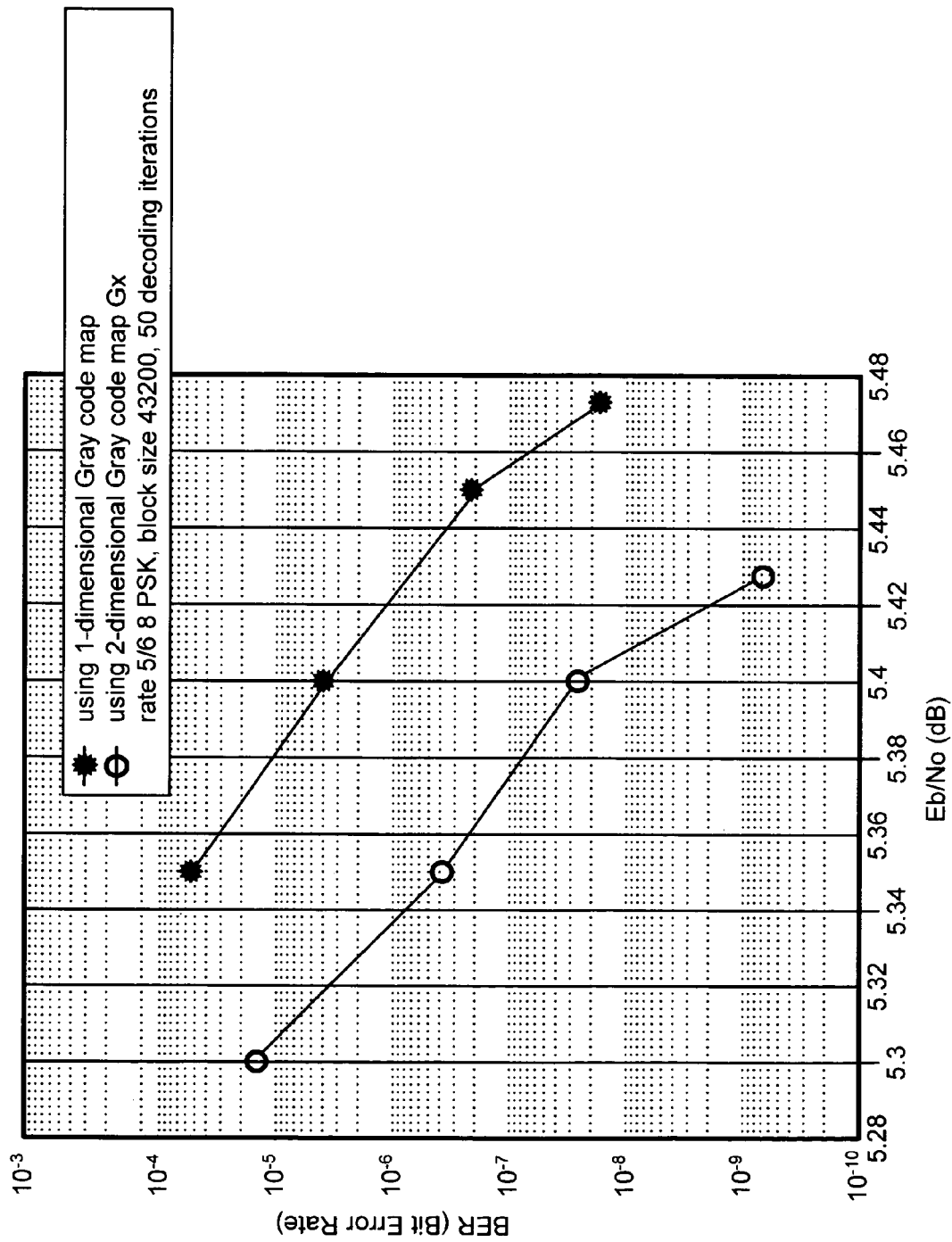
Fig. 41 performance comparison of two LDPC (Low Density Parity Check) coded modulation systems

MULTI-DIMENSIONAL SPACE GRAY CODE MAPS FOR MULTI-DIMENSIONAL PHASE MODULATION AS APPLIED TO LDPC (LOW DENSITY PARITY CHECK) CODED MODULATION

CROSS REFERENCE TO RELATED PATENTS/PATENT APPLICATIONS

The present U.S. patent application claims priority pursuant to 35 U.S.C. § 119(e) to the following U.S. Provisional Patent Applications which are hereby incorporated herein by reference in their entirety and made part of the present U.S. patent application for all purposes:

1. U.S. Provisional Application Ser. No. 60/478,690, "Coded modulation with LDPC (Low Density Parity Check) code using variable maps and metric updating," filed Jun. 13, 2003, pending.

2. U.S. Provisional Application Ser. No. 60/523,272, "Multi-dimensional space Gray maps for multi-dimensional phase modulation as applied to LDPC (Low Density Parity Check) coded modulation," filed Nov. 19, 2003, pending.

The following U.S. patent applications is hereby incorporated herein by reference in its entirety and made part of the present U.S. patent application for all purposes:

1. U.S. patent application Ser. No. 10/669,066, entitled "Variable modulation within combined LDPC (Low Density Parity Check) coding and modulation coding systems," filed Sep. 23, 2003, now U.S. Pat. No. 7,139,964 B2, issued on Nov. 21, 2006, which claims priority pursuant to 35 U.S.C. § 119(e) to U.S. Provisional Application Ser. No. 60/478,690, "Coded modulation with LDPC (Low Density Parity Check) code using variable maps and metric updating," filed Jun. 13, 2003.

BACKGROUND OF THE INVENTION

1. Technical Field of the Invention

The invention relates generally to communication systems; and, more particularly, it relates to coding (either one or both of encoding and decoding) of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical encoding of LDPC coded modulation signals is performed by generating a signal that includes symbols each having a common code rate and being mapped to a singular modulation (e.g., a singular constellation shape having a singular mapping of the constellation points included therein). That is to say, all of the symbols of such an LDPC coded modulation signal have the same code rate and the same modulation (the same constellation shape whose constellation points have the singular mapping). Oftentimes, such prior art encoding designs are implemented as to maximize the hardware and processing efficiencies of the particular design employed to generate the LDPC coded modulation signal having the single code rate and single modulation for all of the symbols generated therein.

Certain prior art coding approaches have sought to extend modulation coding to multiple dimensions. For example, one prior art approach is to separate a binary symbol into a plurality of parts and then map each of those parts to a corresponding constellation (according to its corresponding mapping). This approach may be viewed as being a joint mapping for multi-dimensional phase modulation based on squared Euclidean distance. This prior art approach was presented with respect to TCM (Trellis Coded Modulation) in the following reference:

[1] S. S. Pietrobon, R. H. Deng A. Lafanechere, G. Ungerboeck and D. J. Costello, Jr., "Trellis-Coded Multidimensional phase modulation," IEEE Trans. Inform. Theory, Vol. 36, pp. 63-89, January 1990. (hereinafter referred to as [1] Pietrobon et al.)

However, this approach does not work well for coded modulation with block codes such as LDPC codes. As such, there is a need in the art to provide a workable solution for the combination of multi-dimensional phase modulation that also allows for the combination of block codes such as LDPC codes. More specifically, there is a need in the art to provide a solution that allows the benefits of LDPC codes to be combined with multi-dimensional phase modulation.

BRIEF SUMMARY OF THE INVENTION

Various aspects of the invention can be found in any number of devices that perform processing of a multi-dimensional space Gray code mapped LDPC coded modulation signals. In some instances this involves transmit processing (which may also include encoding) of a multi-dimensional space Gray code mapped LDPC coded modulation signal. In other instances, this involves receive processing (which may also include decoding) of a multi-dimensional space Gray code mapped LDPC coded modulation signal. Various types of communication devices are included within the scope and spirit of the invention that allow for the processing of such multi-dimensional space Gray code mapped LDPC coded modulation signals.

As one example of the functionality included in the invention, an encoder is described. Various aspects of the invention can be found in an encoder that is operable to generate a multi-dimensional space Gray code mapped LDPC (Low Density Parity Check) coded modulation signal. At a minimum, the encoder includes an LDPC encoder and a multi-dimensional space Gray code mapper. The LDPC encoder is operable to encode a plurality of information bits thereby generating an LDPC codeword that includes a plurality of LDPC coded bits. The plurality of LDPC coded bits is arranged into a plurality of symbols such that each symbol has a predetermined plurality (n) of bits (e.g., n is an integer). The multi-dimensional space Gray code mapper is operable to map each symbol of the plurality of symbols to a 2m-D (2m-dimensional) M PSK (Phase Shift Key) modulation using an m-D (m-dimensional) Gray code map thereby generating a sequence of discrete-valued modulation symbols (e.g., m and M are integers). The sequence of discrete-valued modulation symbols form a digital format of the multi-dimensional space Gray code mapped LDPC coded modulation signal, wherein m and M are integers. Each symbol of the sequence of discrete-valued modulation symbols includes at least two pairs of I, Q (In-phase, Quadrature) values that are output from the multi-dimensional space Gray code mapper sequentially as a function of time.

In certain embodiments, the encoder also includes an interleaver. Such an interleaver is interposed between the LDPC encoder and the multi-dimensional space Gray code mapper. The interleaver interleaves the plurality of LDPC coded bits of the LDPC codeword thereby generating the plurality of symbols. Also, in some instances, the 2m-D M PSK modulation includes a first 1-D (1-dimensional) M PSK shaped constellation whose constellation points are mapped according to a first 1-D space Gray code mapping, and the 2m-D M PSK modulation includes a second 1-D M PSK shaped constellation whose constellation points are mapped according to a second 1-D space Gray code mapping.

In even other embodiments, n is equal to 6, m is equal to 2, and M is equal to 8. In this situation, each symbol of the plurality of symbols includes 6 bits, and the multi-dimensional space Gray code mapper that maps each 6 bit symbol of the plurality of symbols to a 4-D 8 PSK modulation using a 2-D (2-dimensional) Gray code map. Also in this instance, the 4-D 8 PSK modulation includes a first 1-D (1-dimensional) 8 PSK shaped constellation whose constellation points are mapped according to a first 1-D space Gray code mapping, and the 4-D 8 PSK modulation includes a second 1-D 8 PSK shaped constellation whose constellation points are mapped according to a second 1-D space Gray code mapping. Each symbol of the discrete-valued modulation symbols includes two pairs of I, Q values.

In some embodiments, the LDPC encoder employs a rate 5/6 LDPC code, and n is equal to 6 such that each symbol of the plurality of symbols includes 6 bits and each symbol within the plurality of symbols includes a redundancy bit.

The functionality of the multi-dimensional space Gray code mapper may be implemented as follows: the multi-dimensional space Gray code mapper may be implemented to generate an LDPC codeword matrix whose elements include each n bit symbol of the plurality of symbols. The multi-dimensional space Gray code mapper may then map the LDPC codeword matrix according to the m-D Gray code map thereby generating a matrix whose elements include a plurality of 2m-D M PSK Gray code mapped symbols, and the plurality of 2m-D M PSK Gray code mapped symbols are output from the multi-dimensional space Gray code mapper according to a predetermined order thereby generating the sequence of discrete-valued modulation symbols.

As mentioned above, the functionality of the invention may be implemented within an encoder that may be implemented within a communication device. Such a communication device may be implemented in any number of types of communication systems including a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and/or a DSL (Digital Subscriber Line) communication system.

The invention envisions any type of communication device that supports the functionality and/or processing described herein. Moreover, various types of methods may be performed to support the functionality described herein without departing from the scope and spirit of the invention as well.

BRIEF DESCRIPTION OF THE SEVERAL VIEWS OF THE DRAWINGS

FIG. 26A is a diagram illustrating bit decoding using bit metric (shown with respect to an LDPC (Low Density Parity Check) code bipartite graph) according to the invention.

FIG. 26B is a diagram illustrating bit decoding using bit metric updating (shown with respect to an LDPC (Low Density Parity Check) code bipartite graph) according to the invention.

FIG. 27A is a diagram illustrating an LDPC (Low Density Parity Check) coded modulation tripartite graph with symbol nodes connected to bit nodes according to the invention.

FIG. 27B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 27A).

FIG. 28A is a diagram illustrating symbol decoding (shown with respect to an LDPC (Low Density Parity Check) coded modulation bipartite graph) according to the invention.

FIG. 28B is a diagram illustrating an embodiment of symbol decoding functionality (supported with an LDPC (Low Density Parity Check) coded modulation bipartite graph) according to the invention.

FIG. 37 is a diagram illustrating an embodiment of a 2-D (2-dimensional) Gray code map (Gx) for rate 5/6 8 PSK LDPC coded modulation according to the invention.

FIG. 41 is a diagram illustrating an embodiment of performance comparison of performance comparison of two LDPC (Low Density Parity Check) coded modulation systems according to certain aspects of the invention.

DETAILED DESCRIPTION OF THE INVENTION

Figure 1:
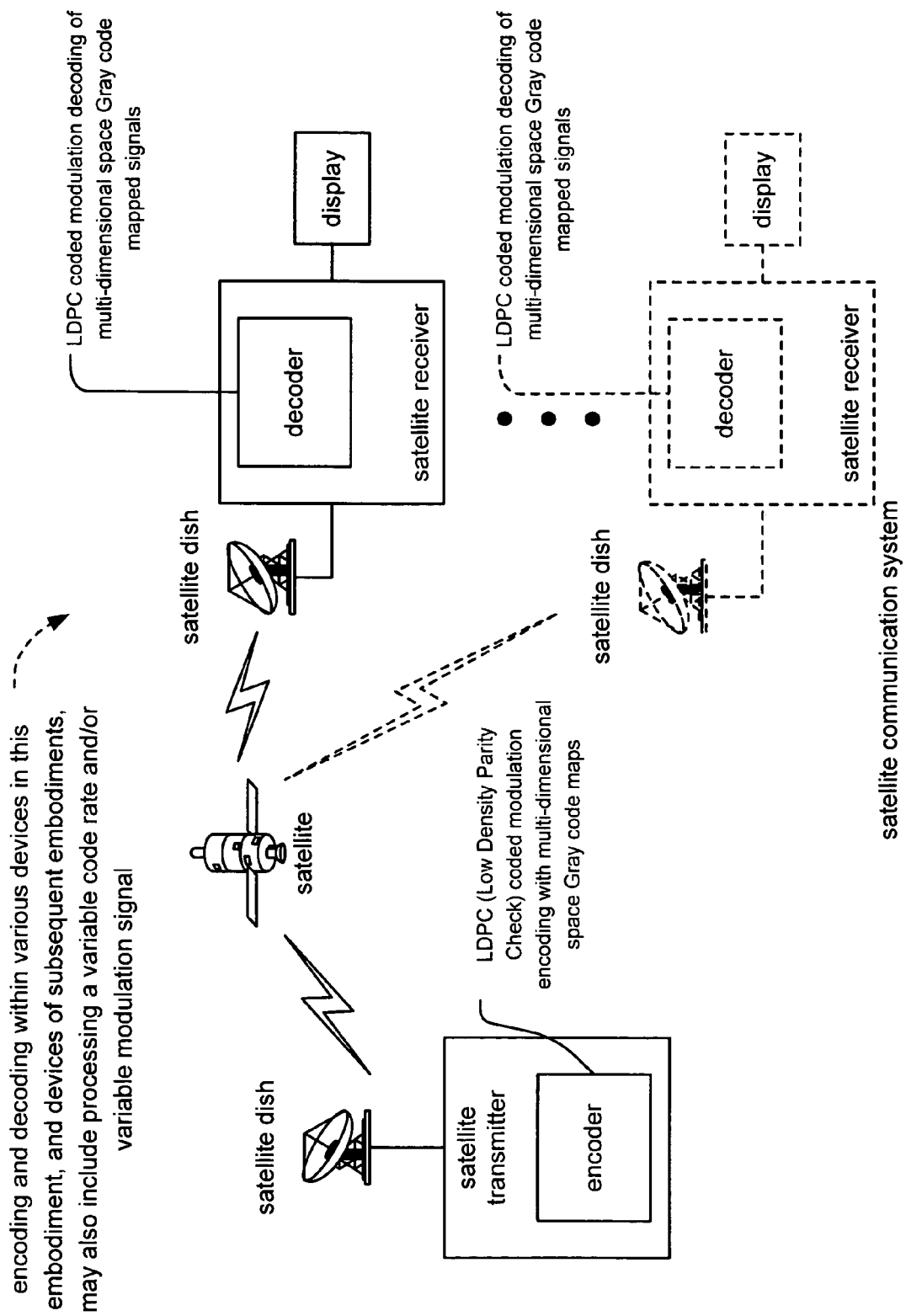
FIG. 1 is a system diagram illustrating an embodiment of a satellite communication system that is built according to the invention.

Various aspects of the invention may be found in any number of devices that perform either one or both of encoding and decoding of LDPC (Low Density Parity Check) coded modulation signals that have been mapped using multi-dimensional space Gray code maps. In some embodiments, the encoding is implemented by combining LDPC coding and multi-dimensional phase modulation coding to generate a multi-dimensional space Gray code mapped LDPC coded modulation signal. In some instances of the invention, the LDPC coded modulation encoding with multi-dimensional space Gray code maps is implemented to generate a variable modulation signal whose modulation may vary as frequently as on a symbol by symbol basis. That is to say, the constellation and/or mapping of the symbols of a multi-dimensional space Gray code mapped LDPC coded modulation signal may vary as frequently as on a symbol by symbol basis. In addition, the code rate of the symbols of the coded signal may also vary as frequently as on a symbol by symbol basis. In such instances, a multi-dimensional space Gray code mapped LDPC coded modulation signal generated according to the encoding aspects of the invention may also be characterized as a variable code rate and/or modulation signal.

Various aspects of the invention may be found in any number of devices that perform transmit processing (including encoding) as well as receive processing (including decoding) of multi-dimensional space Gray code mapped LDPC coded modulation signals. It is also noted that any of a variety of LDPC decoding approaches may be implemented to perform receive processing (including decoding) of multi-dimensional space Gray code mapped LDPC coded modulation signals in accordance with certain aspects of the invention. For example, any of the following LDPC decoding approaches may be employed without departing from the scope and spirit of the invention: LDPC bit decoding only, LDPC bit decoding with update metric, LDPC coded modulation symbol decoding, and LDPC coded modulation hybrid decoding. The complexity of decoding of such multi-dimensional space Gray code mapped LDPC coded modulation signals is not significantly increased when compared to decoding of single-dimensional space Gray code mapped LDPC coded modulation signals. So long as the symbol metrics that have been computed with respect to the received symbols are decomposed to bit metrics, any of a variety of LDPC decoding approaches may be employed to perform decoding processing of such multi-dimensional space Gray code mapped LDPC coded modulation signals.

The decoding aspects of the invention are adaptable to accommodate decoding of such LDPC signals having variable modulation and/or variable code rate. Still, the decoding aspects of the invention are also adaptable to accommodate decoding of LDPC signals that have a single code rate and/or single modulation for all of the symbols of the LDPC signal. For example, for an LDPC signal whose symbols all have a common code rate and a common modulation (constellation and mapping), any of the LDPC decoding approaches enumerated above (and described below in more detail) may be employed to decode such a multi-dimensional space Gray code mapped LDPC coded modulation signal.

Various communication system and communication device type embodiments are described below where any of the various aspects of the invention may be implemented. In general, any device that performs transmit processing (including encoding) as well as receive processing (including decoding) of multi-dimensional space Gray code mapped LDPC coded modulation signals may benefit from the invention. Again, this also includes those LDPC coded signals that have variable code rate and/or variable modulation as well as those that include combined LDPC coding and modulation coding.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 2:
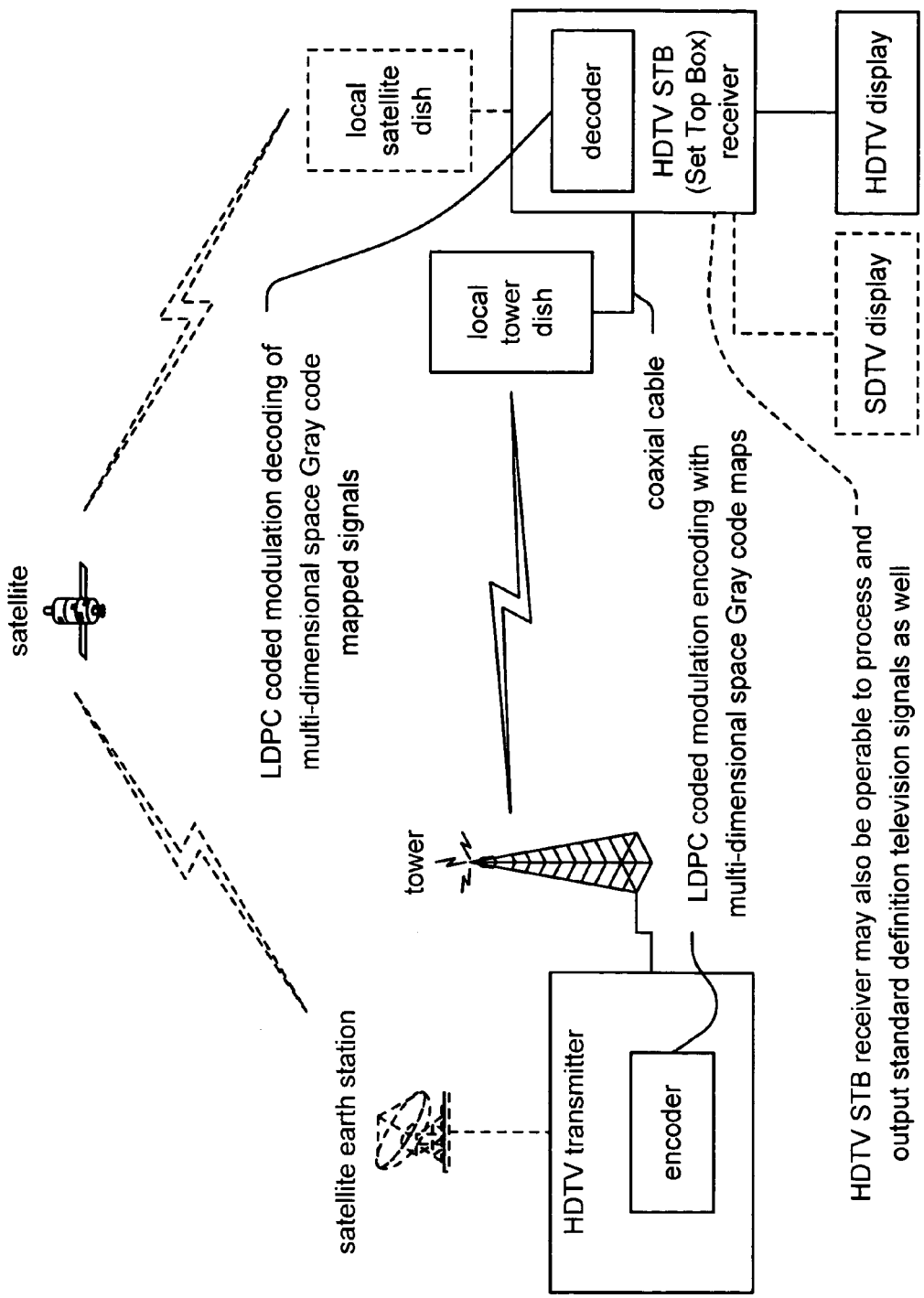
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV STB receiver may also be operable to process and output standard definition television signals as well. For example, when the HDTV display is also operable to display standard definition television signals, and when certain video/audio is only available in standard definition format, then the HDTV STB receiver is operable to process those standard definition television signals for use by the HDTV display.

The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 3A:
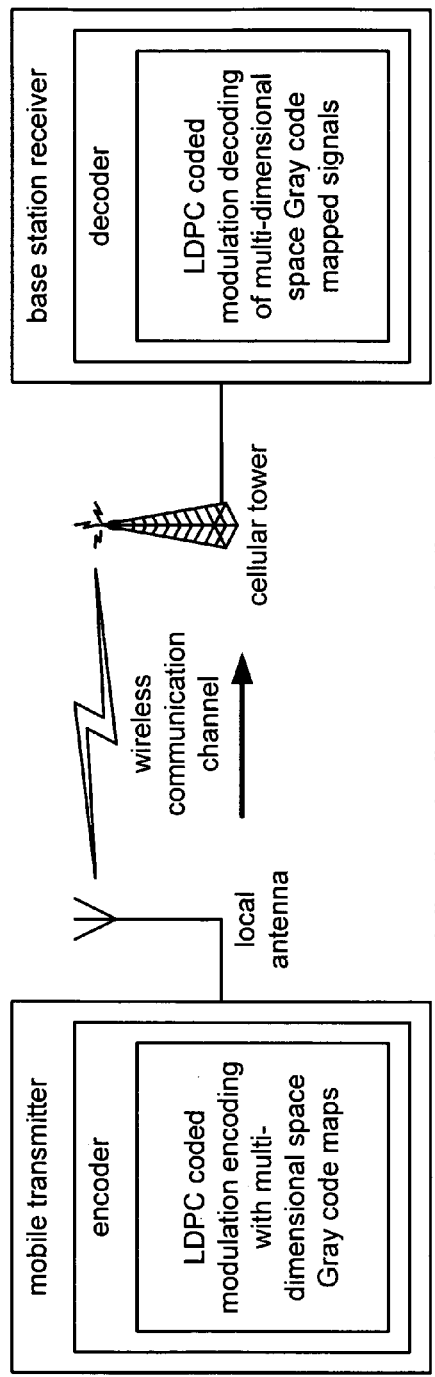
FIG. 3A and FIG. 3B are system diagrams illustrating embodiment of uni-directional cellular communication systems that are built according to the invention.
Figure 3B:
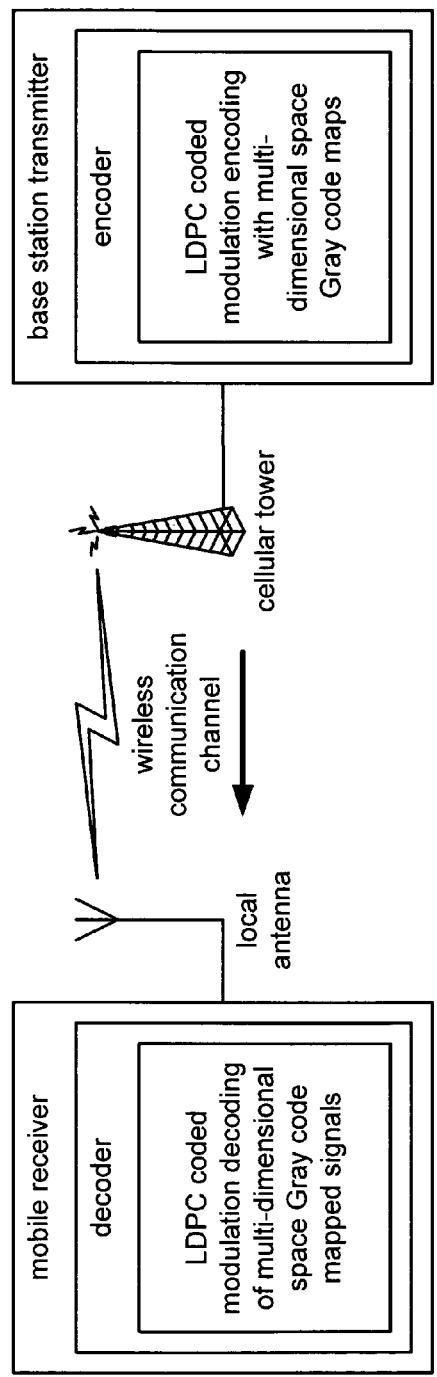

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
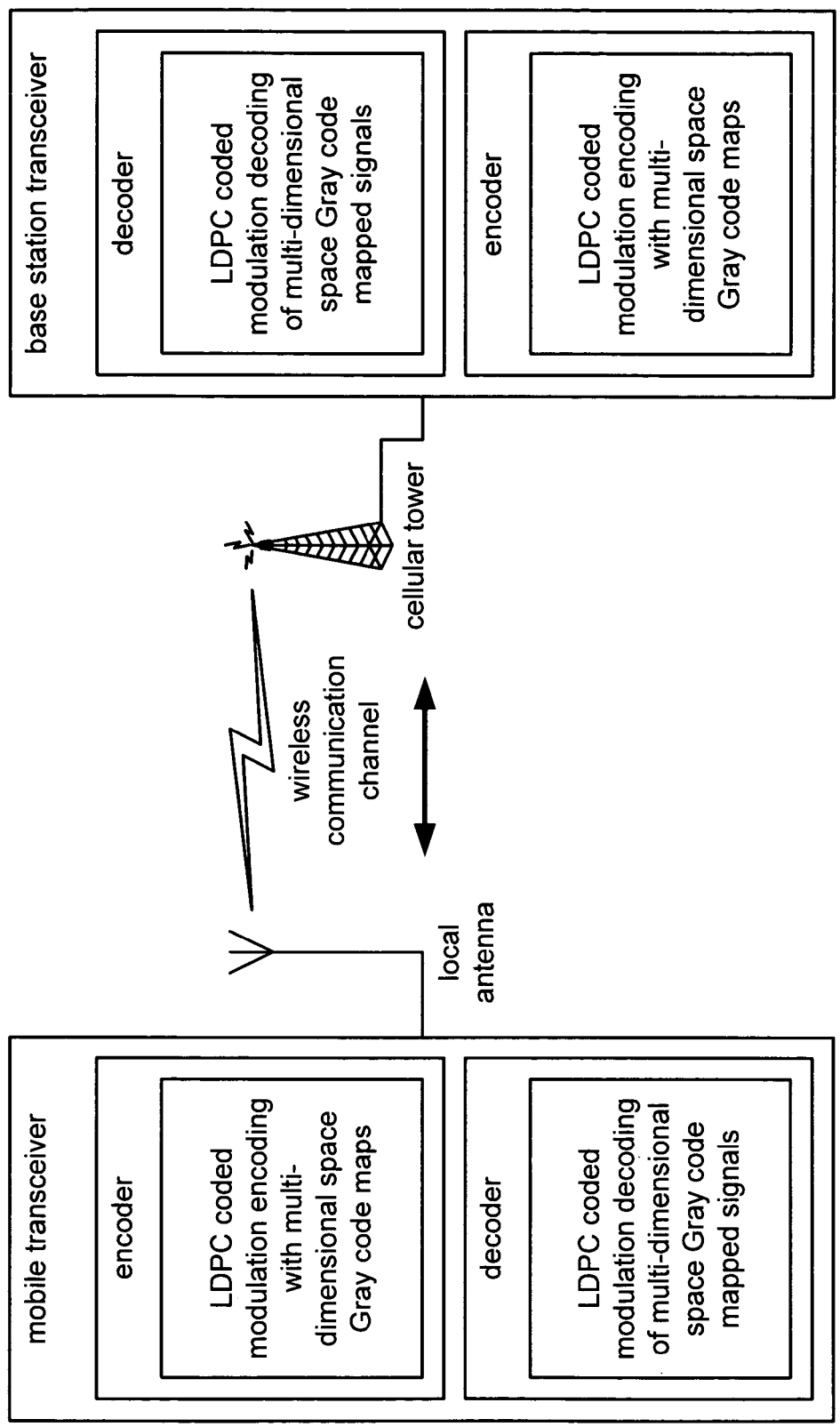
FIG. 4 is a system diagram illustrating an embodiment of a bi-directional cellular communication system that is built according to the invention.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 5:
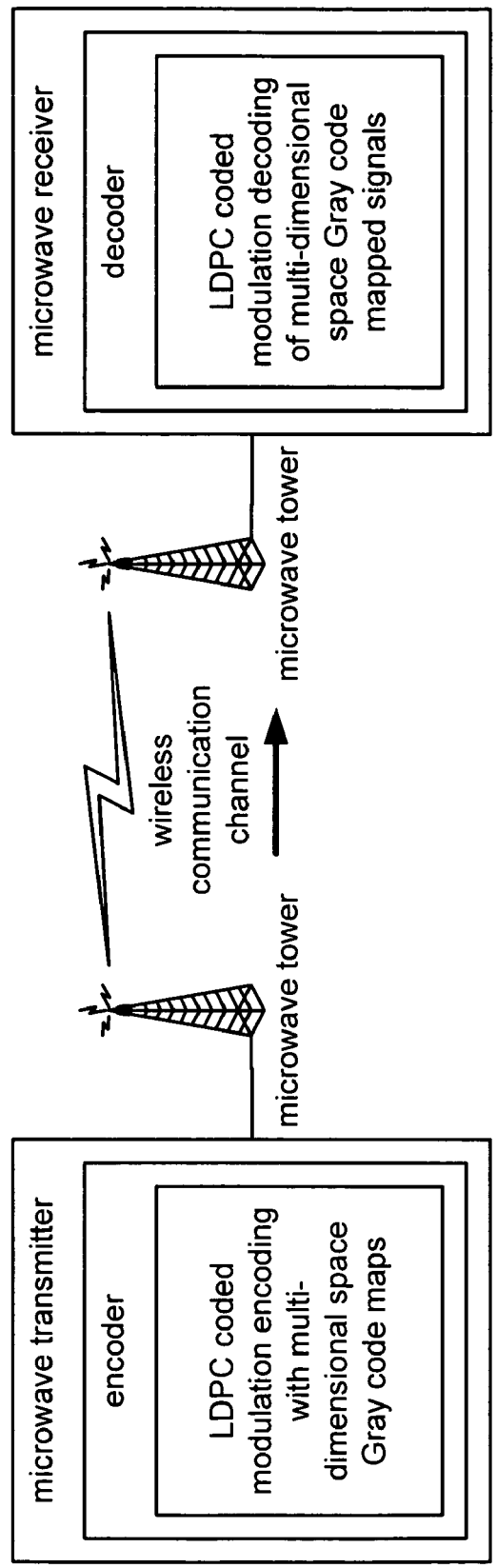
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 6:
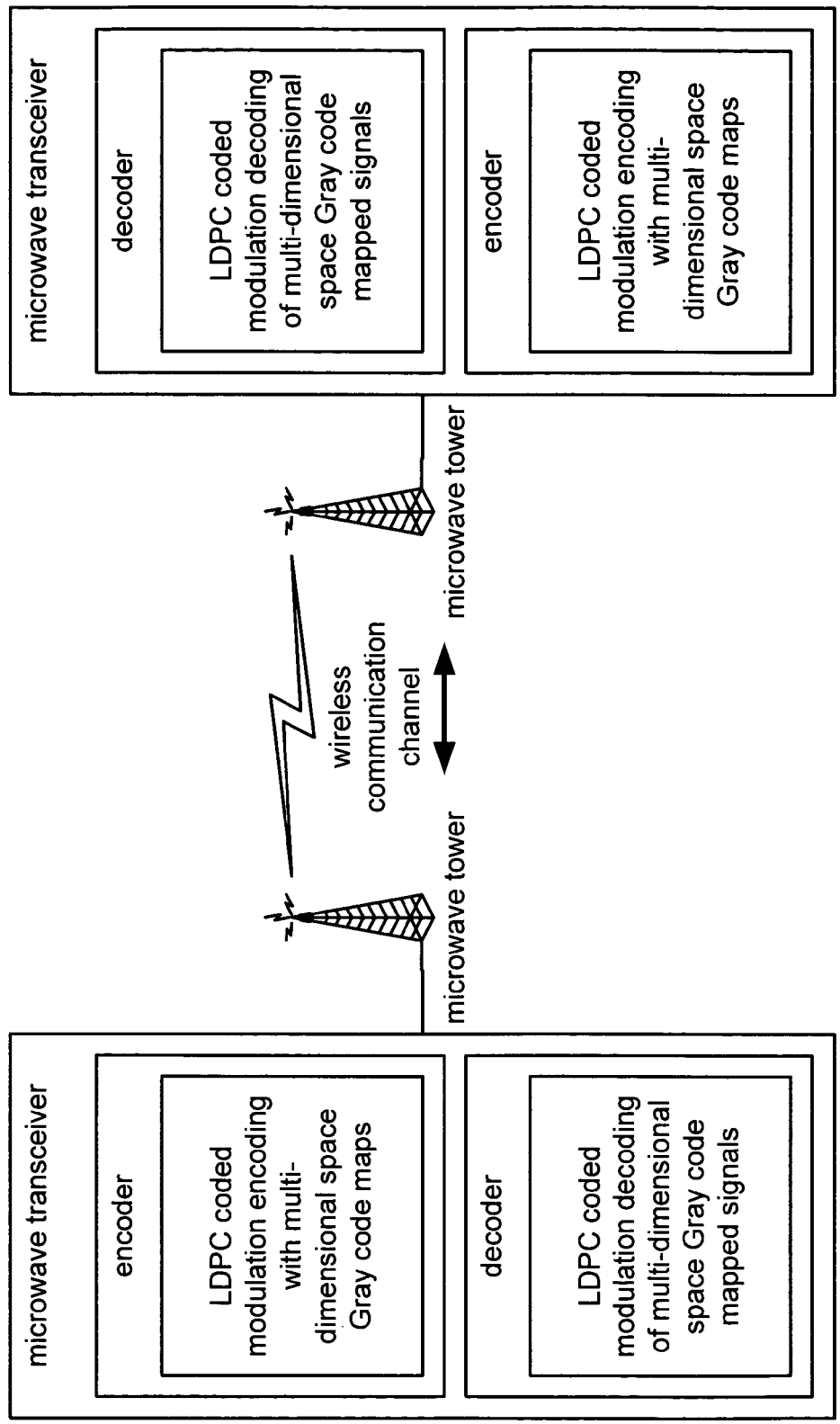
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 7:
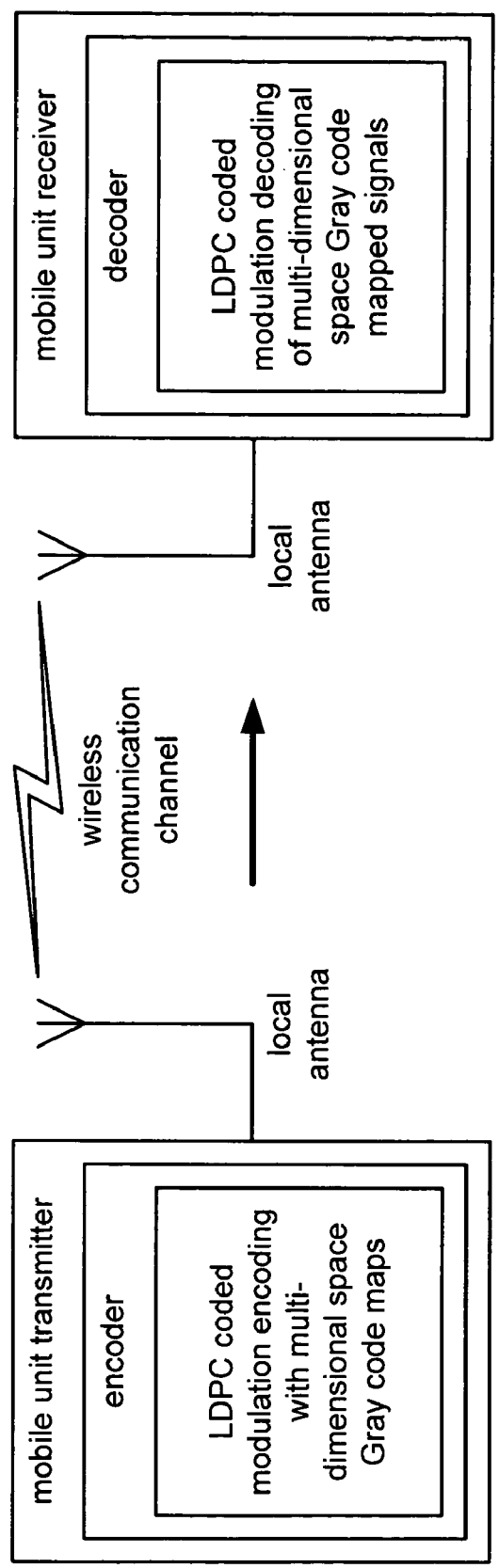
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 8:
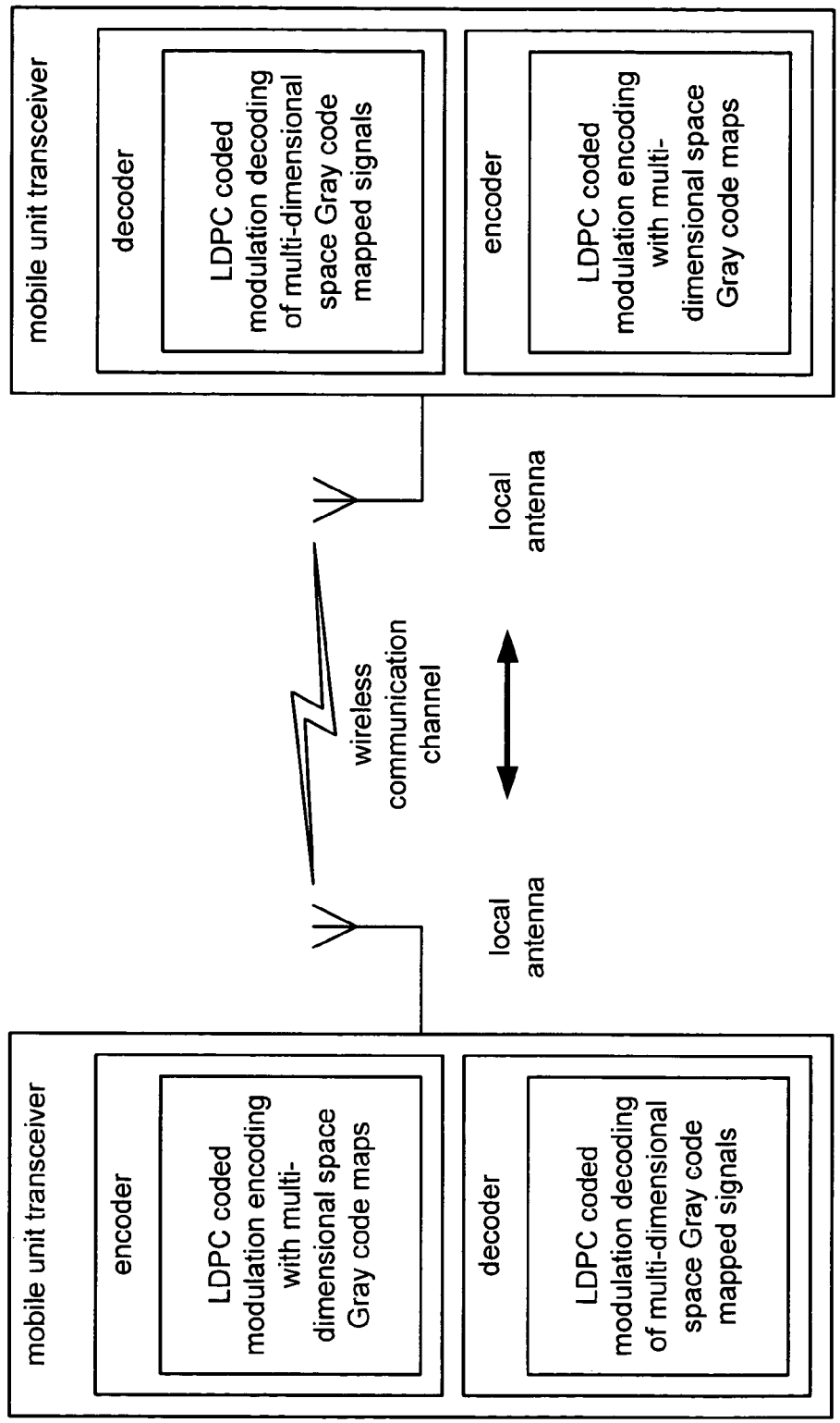
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 9:
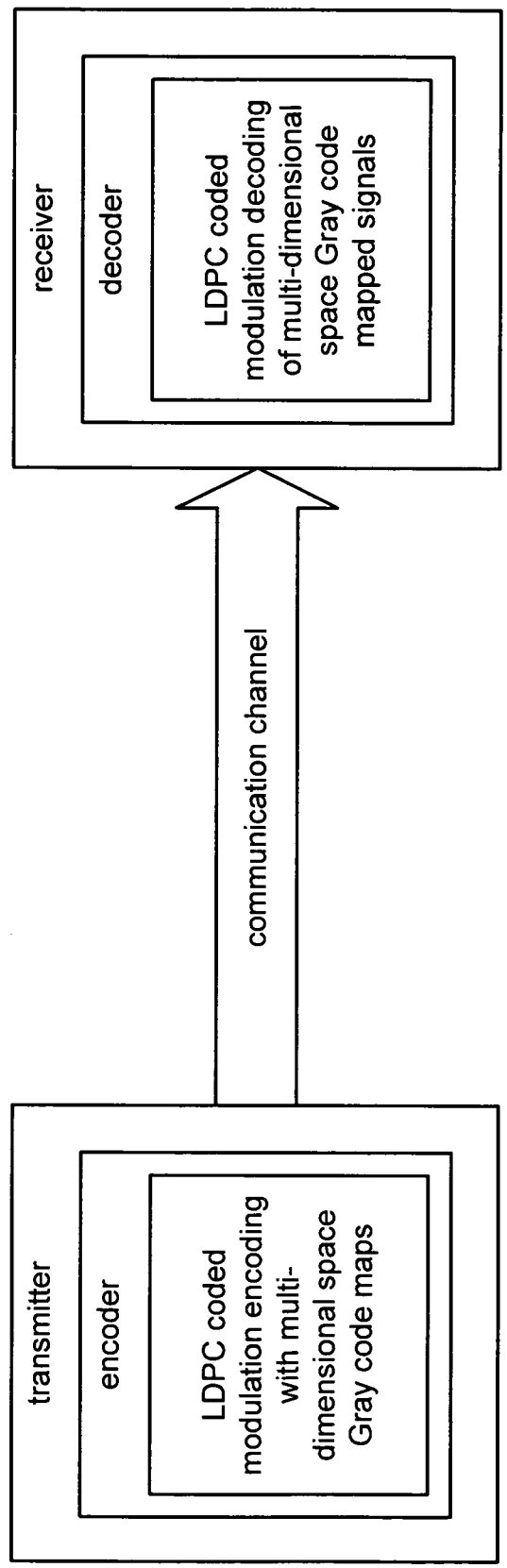
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 10:
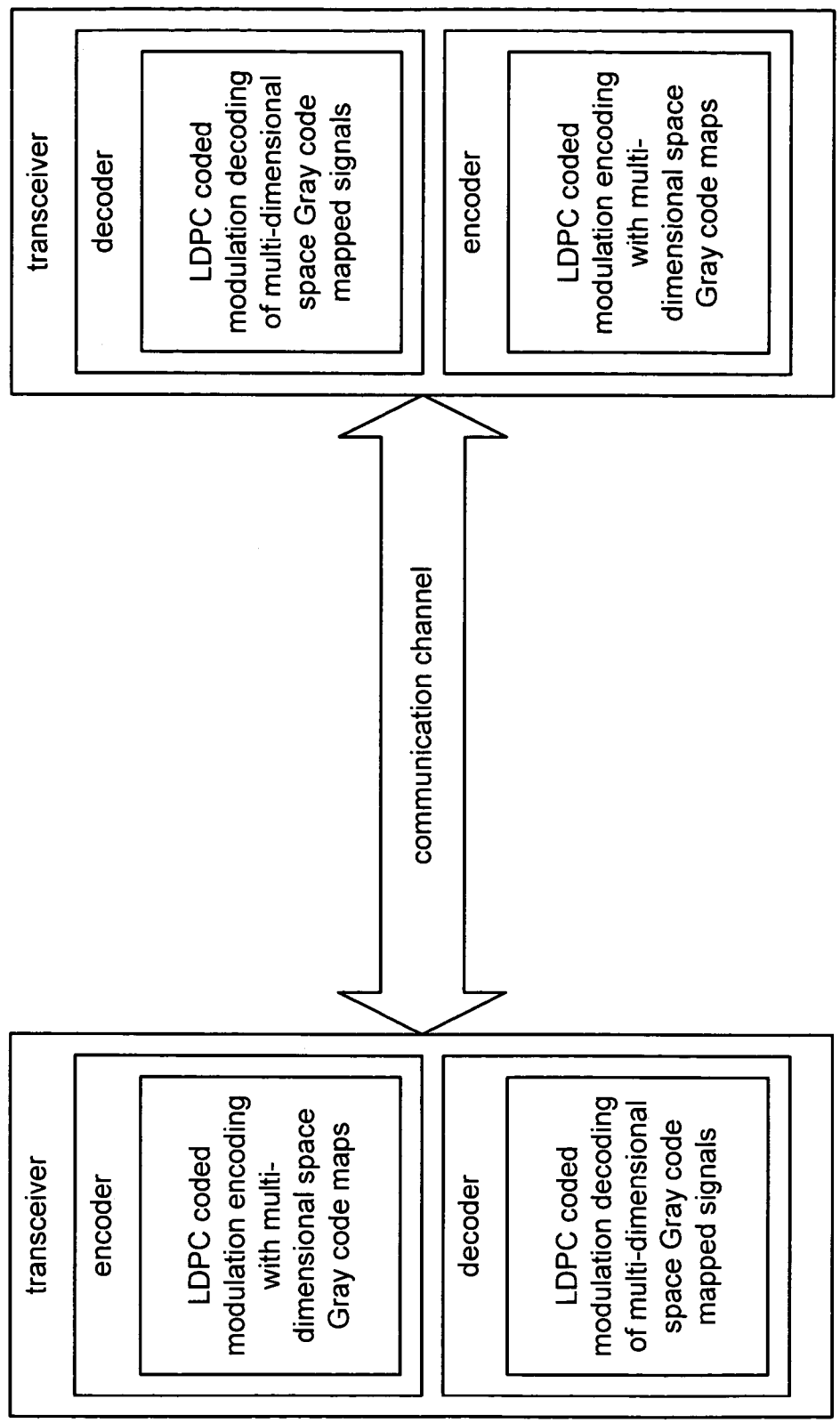
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 11:
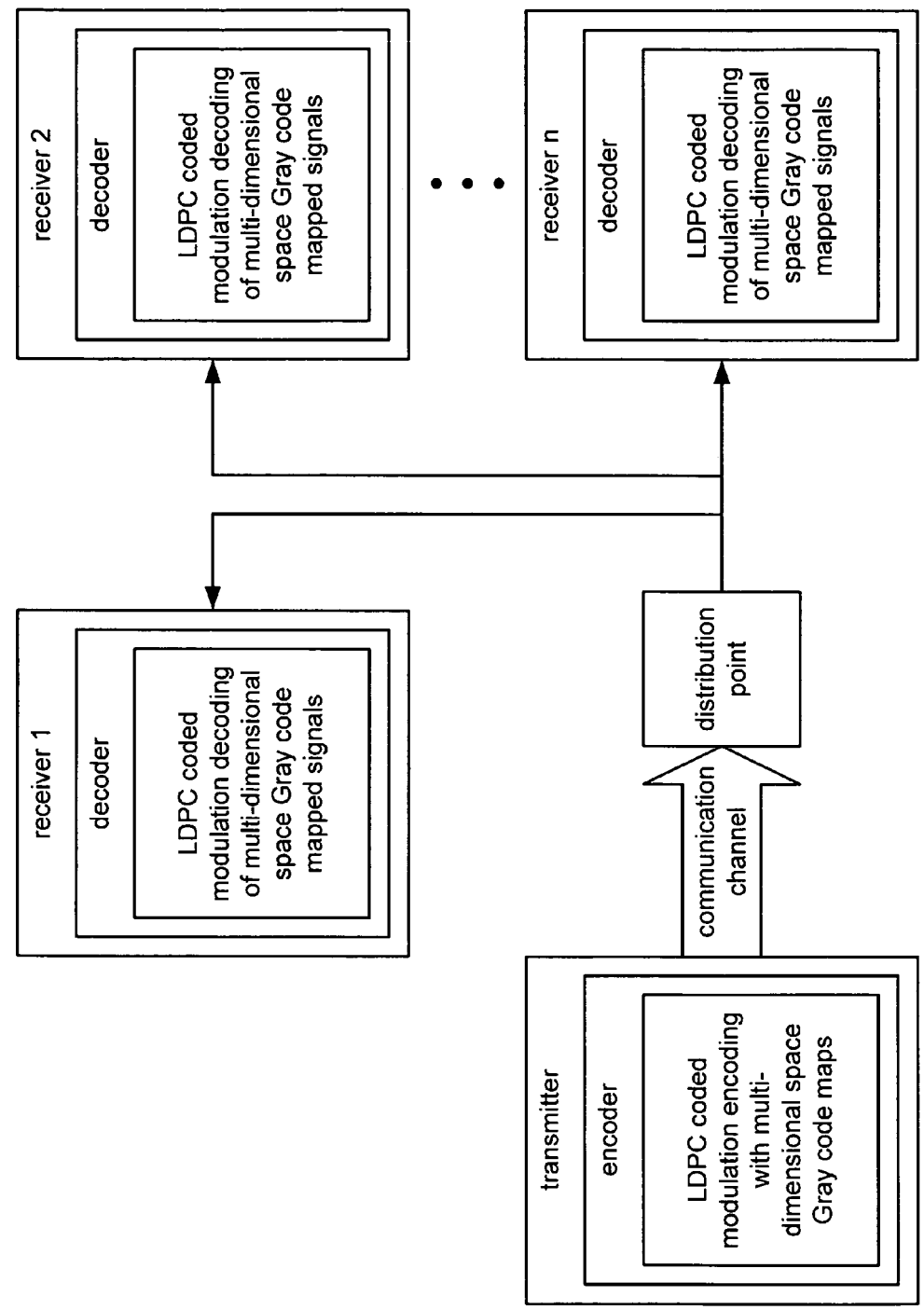
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring." Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, 2, . . . , and n. Each of the receivers 1, 2, . . . , and n is operable to decode a signal (using a corresponding decoder) received from the communication channel in a manner in accordance with the functionality and/or processing of at least some of the various aspects of the invention. This diagram shows yet another embodiment where one or more of the various aspects of the invention may be found.

Figure 12:
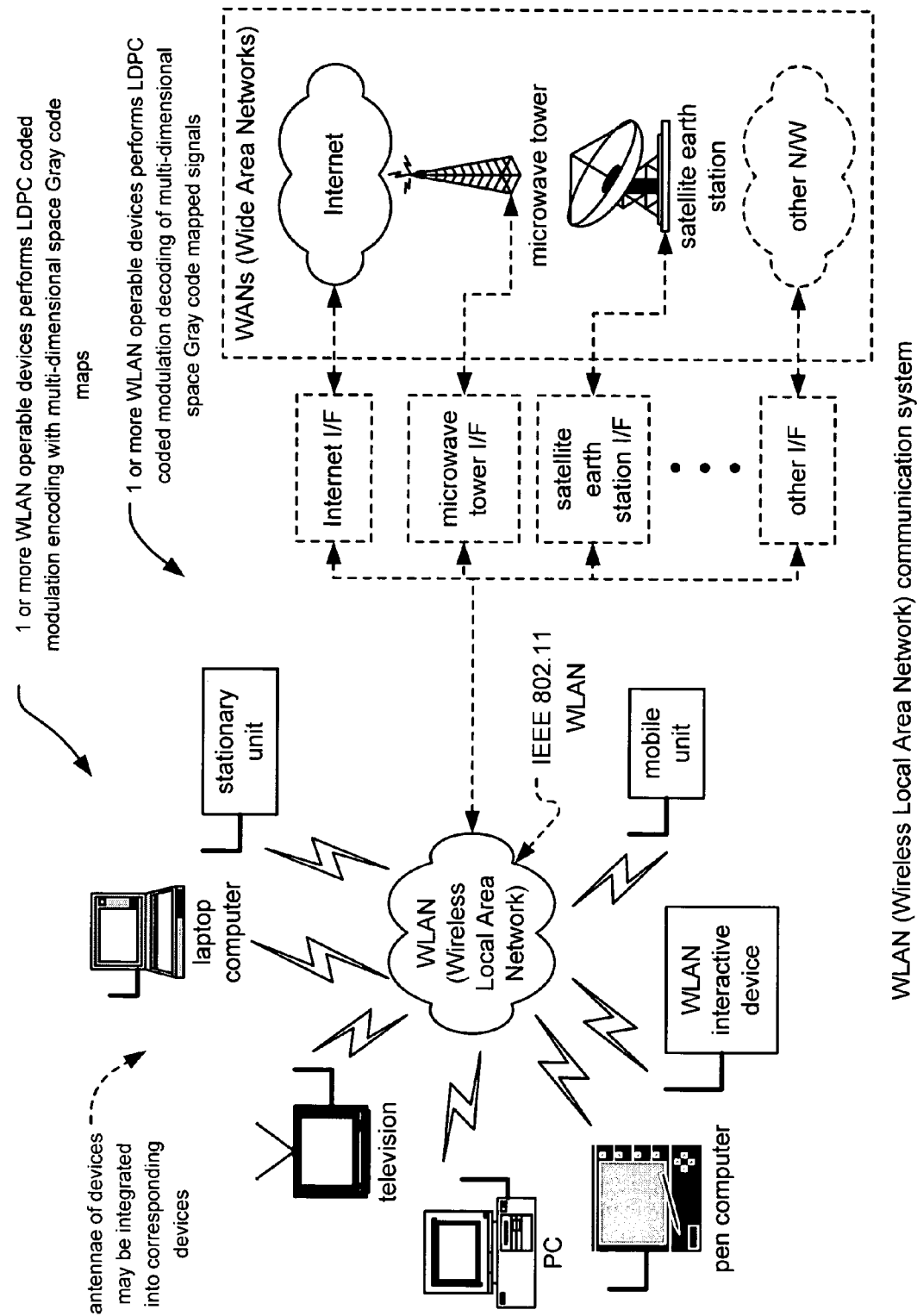
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an IEEE 802.11 operable device may be an IEEE 802.11a operable device, an IEEE 802.11b operable device, or an IEEE 802.11g operable device. Sometimes, an IEEE 802.11 operable device is operable to communicate according to more than one of the standards (e.g., both IEEE 802.11a and IEEE 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the IEEE 802.11b standard. The IEEE 802.11a standard uses a different frame format with OFDM (Orthogonal Frequency Division Multiplexing) to transmit at rates up to 54 Mbps with carrier frequencies in the 5 GHz range. The IEEE 802.11g specification allows for such OFDM frames to coexist with DSSS/CCK frames at 2.4 GHz.

Figure 13:
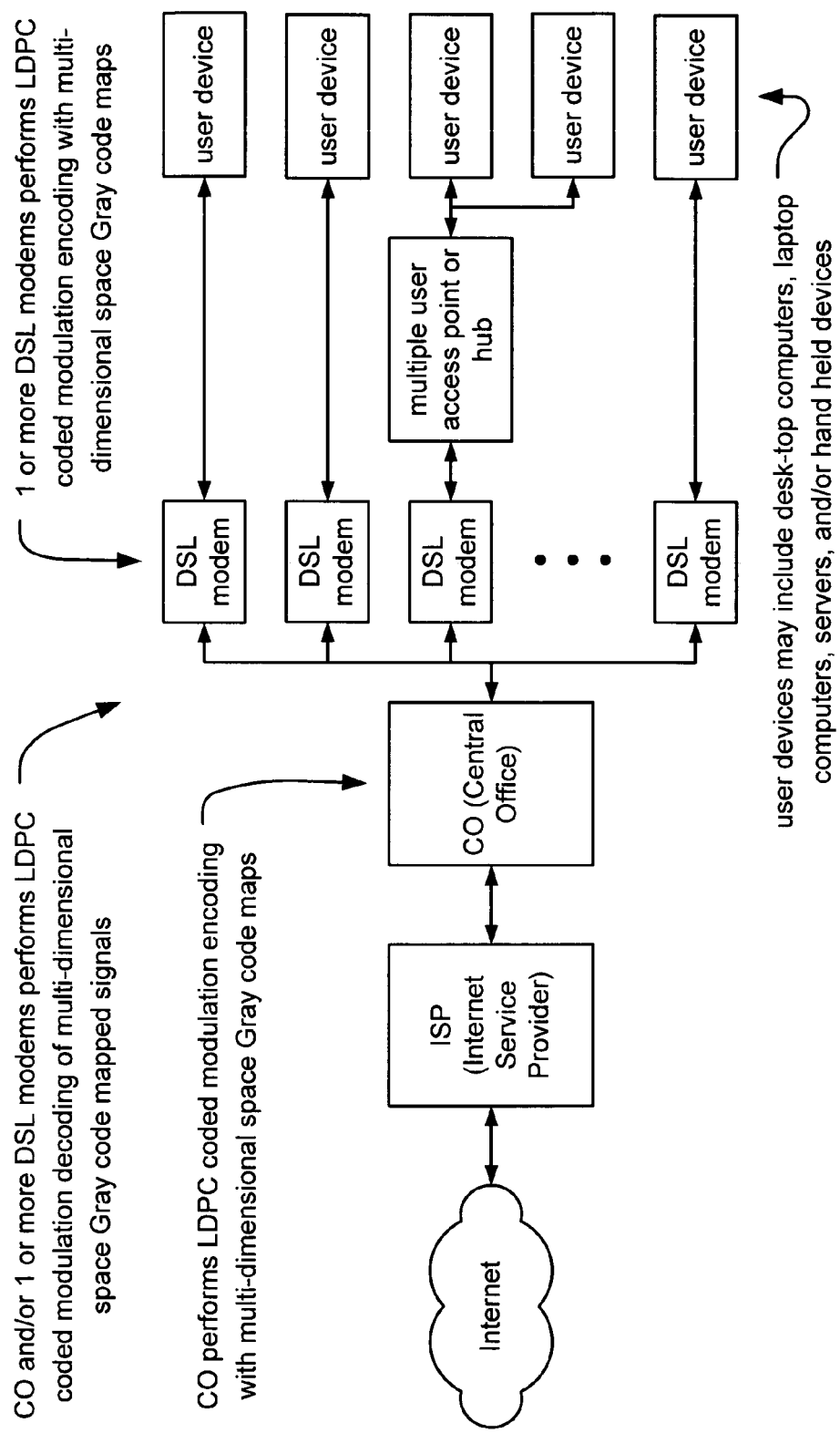
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 14:
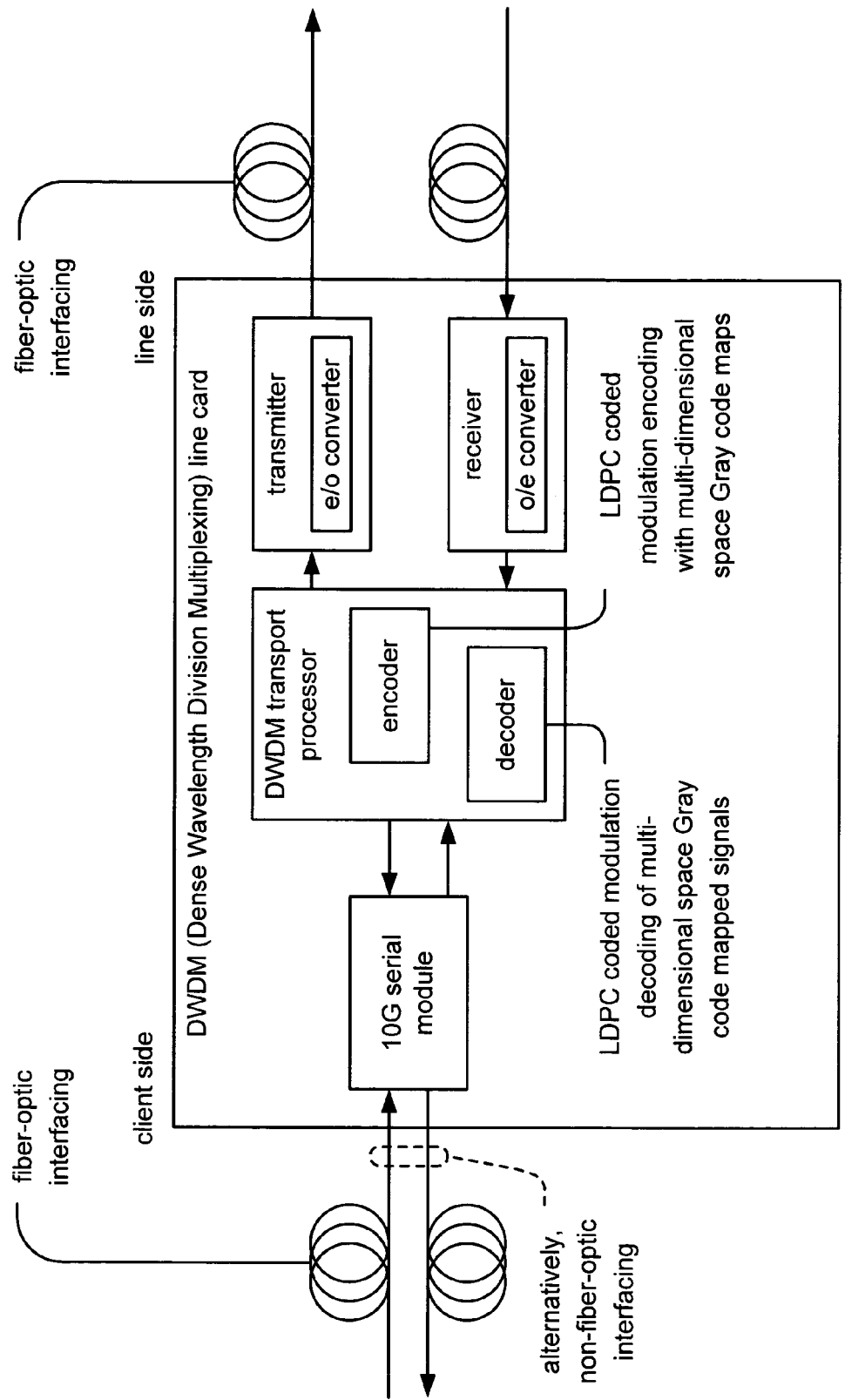
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (PHYsical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 15:
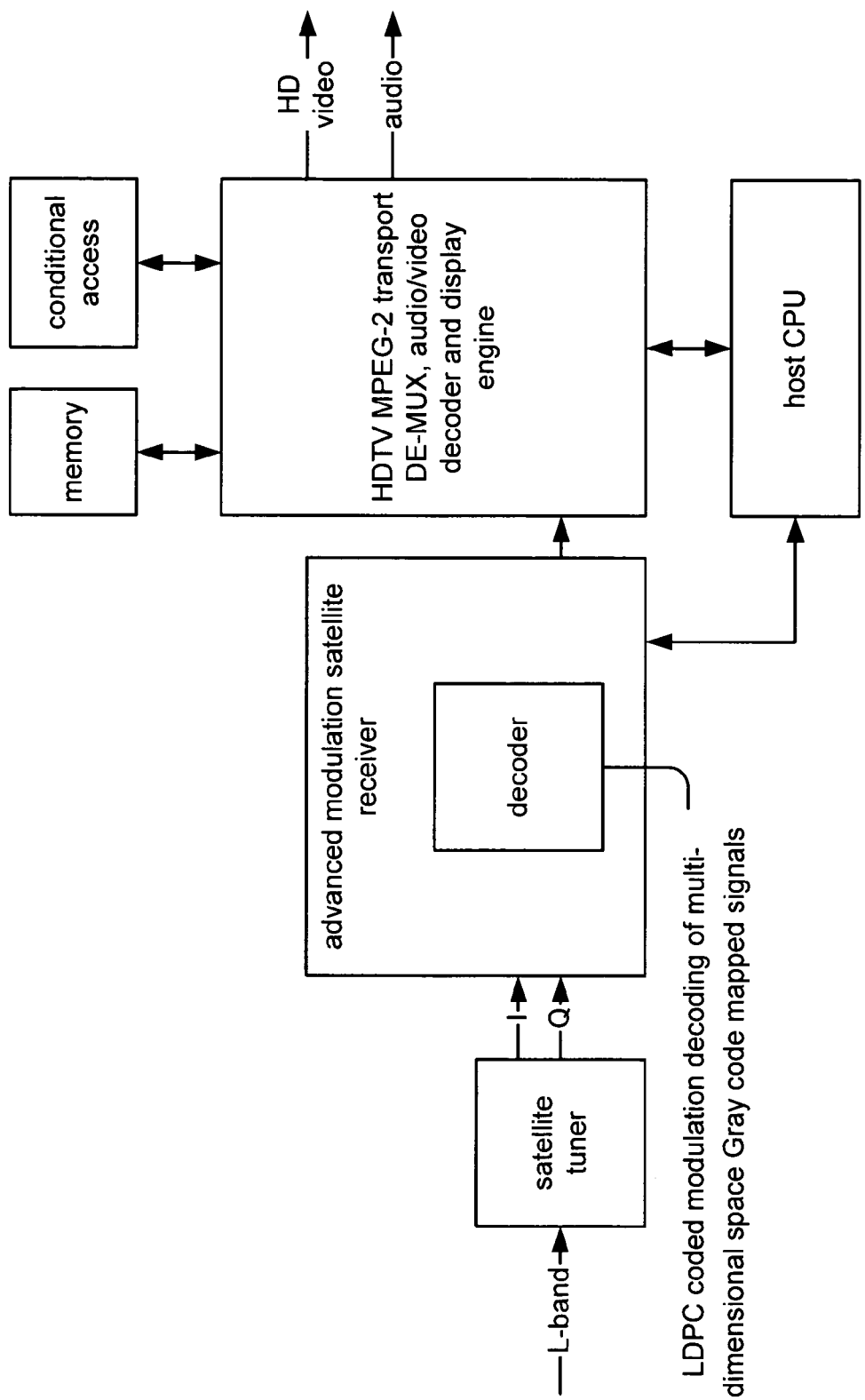
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport DE-MUX (De-Multiplexor), audio/video decoder and display engine. The advanced modulation satellite receiver and the HDTV MPEG-2 transport DE-MUX, audio/video decoder and display engine communicatively couple to a host CPU (Central Processing Unit). The HDTV MPEG-2 transport DE-MUX, audio/video decoder and display engine also communicatively couples to a memory module and a conditional access functional block. The HDTV MPEG-2 transport DE-MUX, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

Figure 16:
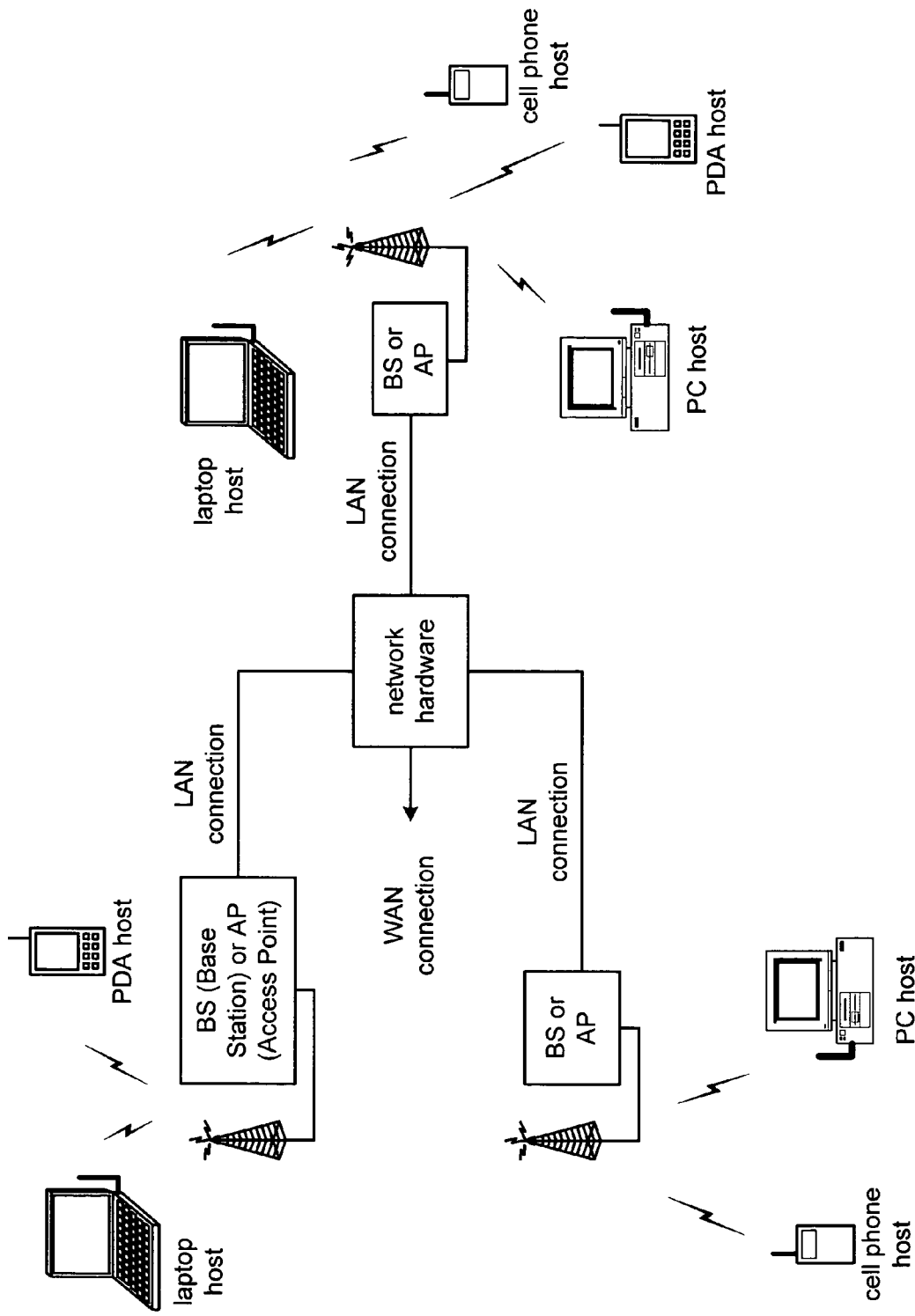
FIG. 16 is a schematic block diagram illustrating a communication system that includes a plurality of base stations and/or access points, a plurality of wireless communication devices and a network hardware component in accordance with certain aspects of the invention.

FIG. 16 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/or cellular telephone hosts. The details of any one of these wireless communication devices is described in greater detail with reference to FIG. 17 below.

The BSs (Base Stations) or APs (Access Points) are operably coupled to the network hardware via the respective LAN (Local Area Network) connections. The network hardware, which may be a router, switch, bridge, modem, system controller, etc., provides a WAN (Wide Area Network) connection for the communication system. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 17:
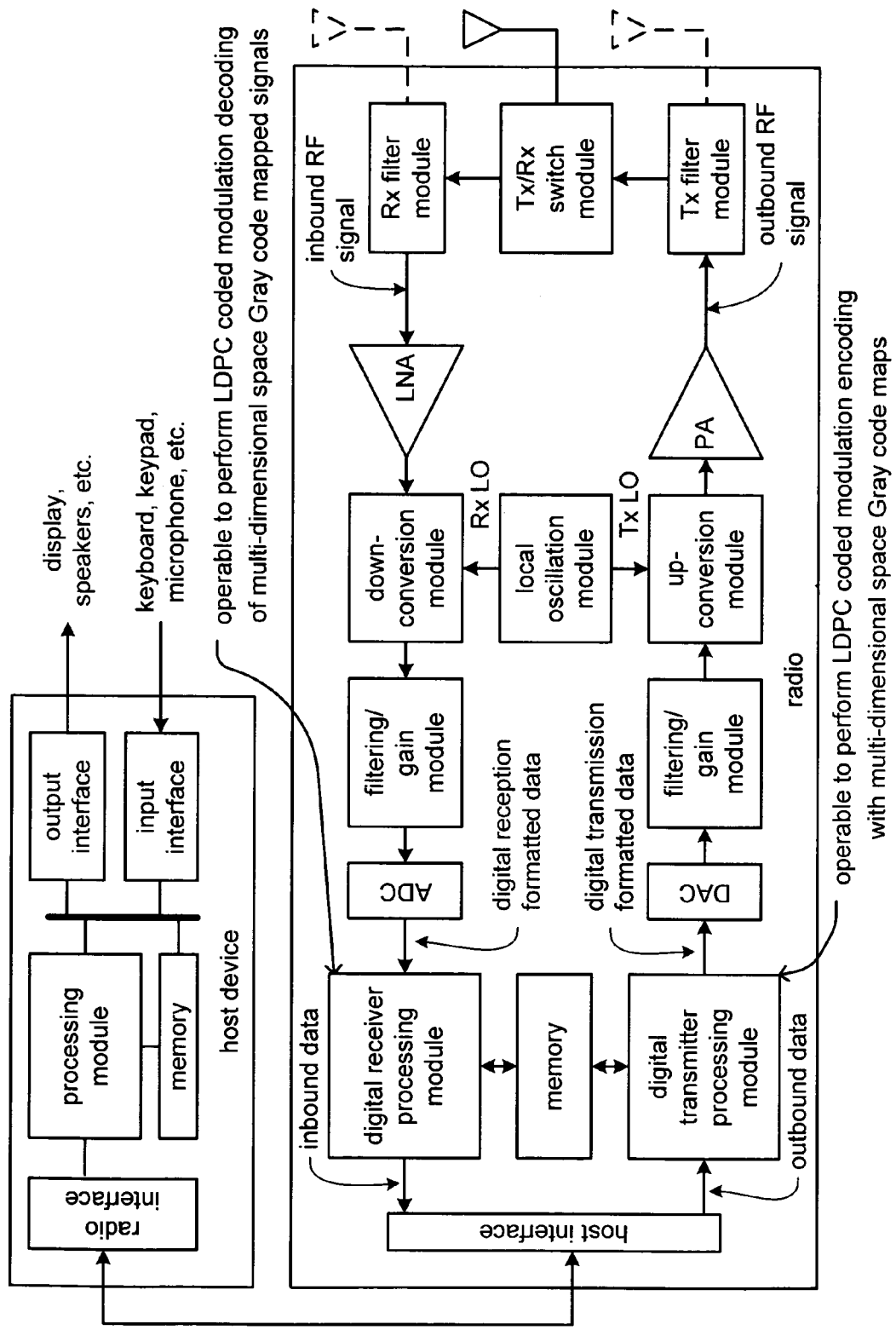
FIG. 17 is a schematic block diagram illustrating a wireless communication device that includes the host device and an associated radio in accordance with certain aspects of the invention.

FIG. 17 is a schematic block diagram illustrating a wireless communication device that includes the host device and an associated radio in accordance with certain aspects of the invention. For cellular telephone hosts, the radio is a built-in component. For PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, etc., such that the received data may be displayed or appropriately used. The radio interface also provides data from the processing module to the radio. The processing module may receive the outbound data from an input device such as a keyboard, keypad, microphone, etc., via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (Intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation de-mapping, decoding, and/or descrambling. The digital transmitter functions include, but are not limited to, scrambling, encoding, constellation mapping, modulation, and/or digital baseband to IF conversion.

Similarly to other embodiments that employ an encoder and a decoder (or perform encoding and decoding), the encoding operations that may be performed by the digital transmitter processing module may be implemented in a manner in accordance with the functionality and/or processing of at least some of the various aspects of the invention to assist in generating a signal that is to be launched into the communication channel coupling to the wireless communication device. Analogously, the decoding operations of the operations that may be performed by the digital transmitter processing module may be implemented in a manner in accordance with the functionality and/or processing of at least some of the various aspects of the invention. For example, the encoding operations performed by the digital transmitter processing module may be performed using LDPC coding as described and presented herein thereby generating a multi-dimensional space Gray code mapped LDPC coded modulation signal, and the decoding operations that may be performed by the digital receiver processing module may be performed using any of the various decoding approaches to LDPC coded signal that is presented in more detail below.

The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth®, etc.) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. In other words, the ADC samples the incoming continuous-time signal thereby generating a discrete time signal (e.g., the digital reception formatted data). The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 17 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 18:
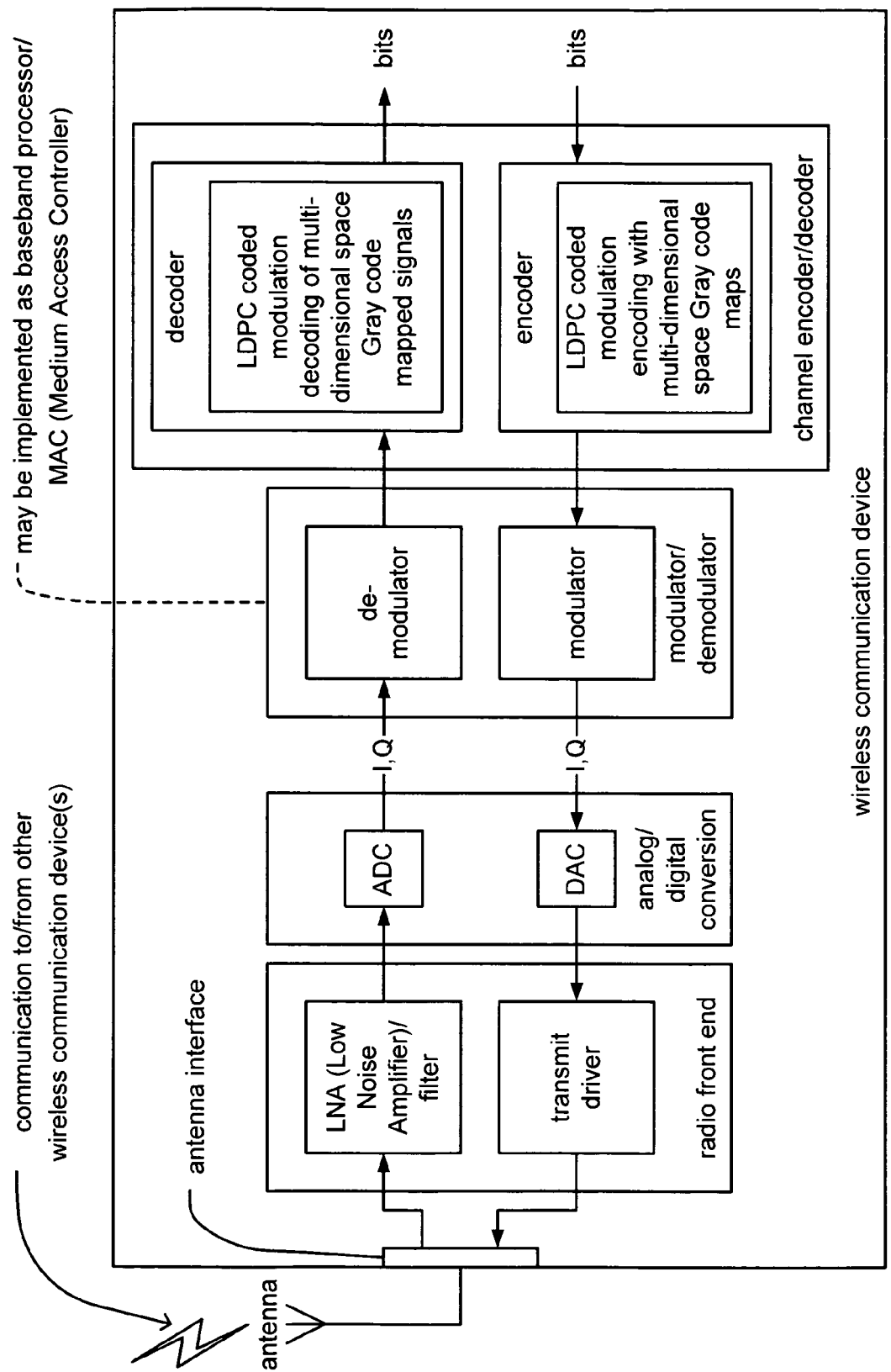
FIG. 18 is a diagram illustrating an alternative embodiment of a wireless communication device that is constructed according to the invention.

FIG. 18 is a diagram illustrating an alternative embodiment of a wireless communication device that is constructed according to the invention. This embodiment of a wireless communication device includes an antenna that is operable to communicate with any 1 or more other wireless communication devices. An antenna interface communicatively couples a signal to be transmitted from the wireless communication device or a signal received by the wireless communication device to the appropriate path (be it the transmit path or the receive path).

A radio front end includes receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the front end includes a LNA (Low Noise Amplifier)/filter. The filtering performed in this receiver functionality may be viewed as the filtering that is limiting to the performance of the device, as also described above. The receiver functionality of the front end performs any down-converting that may be requiring (which may alternatively include down-converting directly from the received signal frequency to a baseband signal frequency). The general operation of the front end may be viewed as receiving a continuous-time signal, and performing appropriate filtering and any down conversion necessary to generate the baseband signal. Whichever manner of down conversion is employed, a baseband signal is output from the receiver functionality of the front end and provided to an ADC (Analog to Digital Converter) that samples the baseband signal (which is also a continuous-time signal, though at the baseband frequency) and generates a discrete time signal baseband signal (e.g., a digital format of the baseband signal); the ADC also extracts and outputs the digital I, Q (In-phase, Quadrature) components of the discrete time signal baseband signal.

These I, Q components are provided to a demodulator portion of the modulator/demodulator where any modulation decoding/symbol mapping is performed where the I, Q components of the discrete time signal baseband signal. The appropriate I, Q components are then mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even higher order modulation types. These demodulated symbols are then provided to a decoder portion of the channel encoder/decoder where best estimates of the information bits contained within the originally received continuous-time signal are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block to transforms the I, Q components into a continuous-time transmit signal (e.g., an analog signal). The continuous-time transmit signal is oftentimes referred to as having a baseband frequency within the communication device. The now continuous-time transmit signal to be transmitted is then passed to a transmit driver that performs any necessary up-converting/modification to the continuous-time transmit signal (e.g., amplification and/or filtering) to comport it to the communication channel over which the signal is to be transmitted to another piconet operable device via the antenna. For example, the frequency of the continuous-time transmit signal may need to be up-converted from a baseband frequency to a carrier frequency that comports with the communication channel. This may be performed directly or via an IF (Intermediate Frequency) as well.

As within other embodiments that employ an encoder and a decoder, the encoder of this wireless communication device may be implemented to encode information in a manner in accordance with the functionality and/or processing of at least some of the various aspects of the invention to assist in generating a signal that is to be launched into the communication channel coupling to the wireless communication device. The decoder of the wireless communication device may be implemented to decode a received signal in a manner in accordance with the functionality and/or processing of at least some of the various aspects of the invention. This diagram shows yet another embodiment where one or more of the various aspects of the invention may be found.

In addition, several of the following Figures describe particular embodiments (in more detail) that may be used to implement some of the various aspects of invention that include generating a multi-dimensional space Gray code mapped LDPC coded modulation signal for use within various types of communication systems. Various details by which such multi-dimensional space Gray code mapped LDPC coded modulation signals may be generated are provided as well as some possible alternatives by which such signals may undergo receive processing (including decoding). Initially, a general description of LDPC codes is provided.

Figure 19:
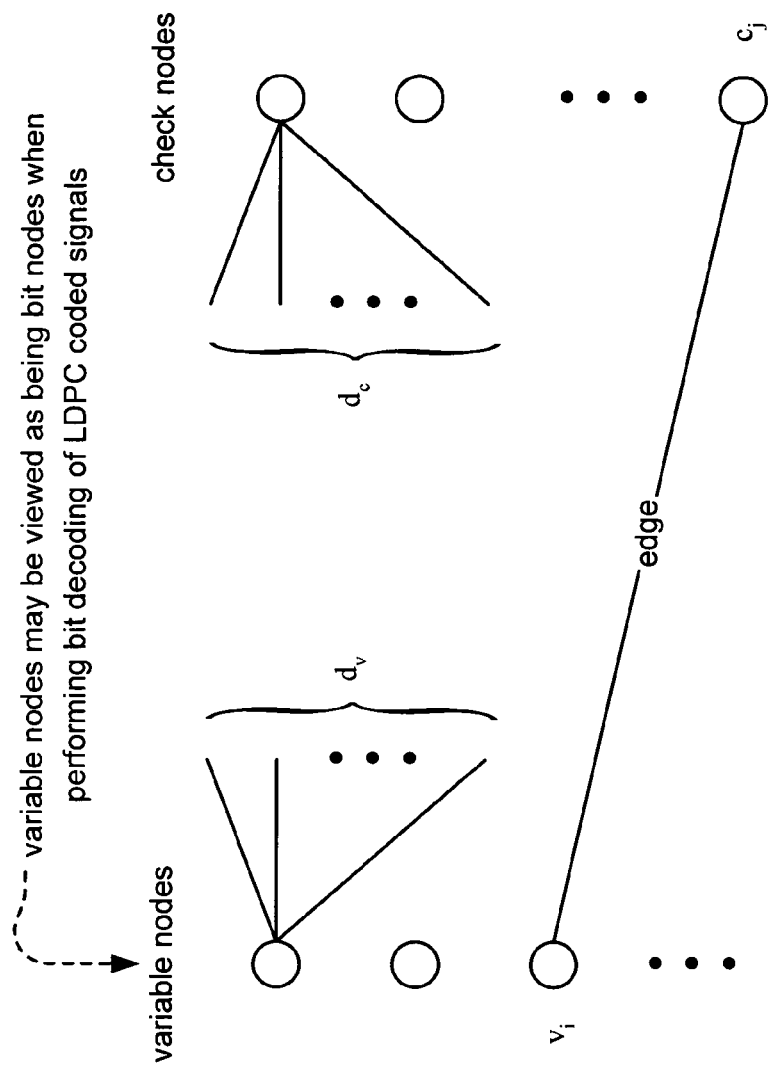
FIG. 19 is a diagram illustrating an embodiment of an LDPC (Low Density Parity Check) code bipartite graph.

FIG. 19 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [2] referenced below and by M. Luby et al. in [3] also referenced below.

[2] R. Gallager, *Low-Density Parity-Check Codes*, Cambridge, Mass.: MIT Press, 1963.

[3] M. Lugy, M. Mitzenmacher, M. A. Shokrollahi, D. A. Spielman, and V. Stemann, "Practical loss-resilient codes," *Proc. 29th Symp. on Theory of Computing*, 1997, pp. 150-159.

A regular LDPC code can be represented as a bipartite graph by its parity check matrix with left side nodes representing variable of the code bits (or alternatively as the "bit nodes"), and the right side nodes representing check equations (or alternatively as the "check nodes"). The bipartite graph of the code defined by H may be defined by N variable nodes (e.g., N bit nodes) and M check nodes. Every variable node of the N variable nodes has exactly $d_v(i)$ edges connecting this node to one or more of the check nodes (within the M check nodes). This number of $d_v$ edges may be referred to as the degree of a variable node i. Analogously, every check node of the M check nodes has exactly $d_c(j)$ edges connecting this node to one or more of the variable nodes. This number of $d_c$ edges may be referred to as the degree of the check node j.

An edge between a variable node $v_i$ (or bit node $b_i$) and check node $c_j$ may be defined by $e=(i, j)$. However, on the other hand, given an edge $e=(i, j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy et al. in [3] referenced above.

In general, with a graph of an LDPC code, the parameters of an LDPC code can be defined by a degree of distribution, as described within M. Lugy et al. in [3] referenced above and also within the following reference:

[4] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is used to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, within the sent signal having the form of $((-1)^{v_{0i}}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric, $L_{metric}(i)$, will then be defined as follows:

$$L_{metric}(i) = \ln \frac{p(y_i | v_i = 0)}{p(y_i | v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 | y_i)}{p(v_i = 1 | y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)};$$

may be replaced by the following $$\ln \frac{p(v_i = 0, vH^T = 0 | y)}{p(v_i = 1, vH^T = 0 | y)} = \sum_{(i,j) \in E_v(i)} \ln \frac{p(v_i = 0, vh_j^T = 0 | y)}{p(v_i = 1, vh_j^T = 0 | y)}$$

where $E_v(i)$ is a set of edges starting with $v_i$ as defined above.

When performing the BP (Belief Propagation) decoding approach in this context, then the value of $$\ln\frac{p(v_i = 0, vh_j^T = 0 \mid y)}{p(v_i = 1, vh_j^T = 0 \mid y)}$$

may be replaced by the following relationship $$L_{check}(i, j) = \ln\frac{p\left(\sum_{e \in E_c(j)\setminus\{(i,j)\}} v_{v(e)} = 0 \mid y\right)}{p\left(\sum_{e \in E_c(j)\setminus\{(i,j)\}} v_{v(e)} = 1 \mid y\right)}$$

$L_{check}(i, j)$ is called the EXT (extrinsic) information of the check node $c_j$ with respect to the edge (i, j). In addition, it is noted that $e \in E_c(j)\setminus\{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge (i, j) may be defined as follows:

$$L_{var}(i, j) = L_{metric}(i) + \sum_{(i,k) \in E_v(i)\setminus\{(i,j)\}} L_{check}(i, k).$$

From certain perspectives, the invention may also be implemented within communication systems that involve combining modulation coding with LDPC coding to generate LDPC coded modulation signals. These LDPC coded modulation signals may also be of the type that they have a code rate and/or modulation (constellation and mapping) that varies as frequently as on a symbol by symbol basis.

Up to now, there have been some attempts to combine modulation encoding with LDPC coding, yet they are all limited to employing only a single code rate or modulation (constellation and mapping) symbols generated thereby. Nevertheless, some of the possible approaches to combine modulation coding and LDPC coding are described below.

Figure 20A:
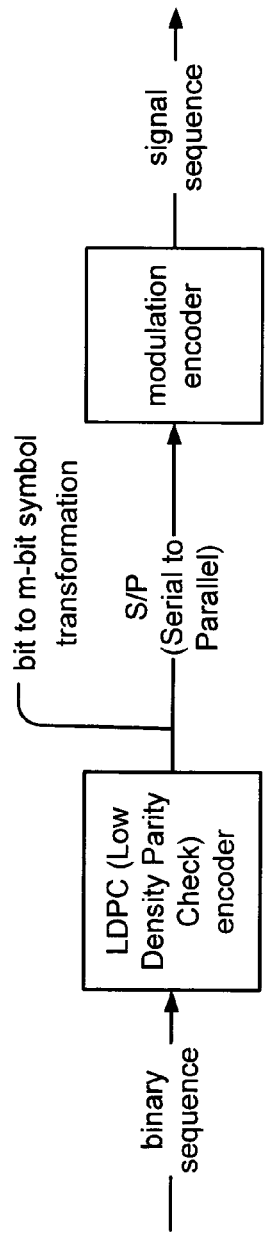
FIG. 20A is a diagram illustrating an embodiment of direct combining of LDPC (Low Density Parity Check) coding and modulation encoding.

FIG. 20A is a diagram illustrating an embodiment of direct combining of LDPC (Low Density Parity Check) coding and modulation encoding. A binary sequence (e.g., a bit stream) is provided to an LDPC (Low Density Parity Check) encoder. The LDPC encoder introduces a degree of redundancy (or parity) within the bit sequence provided thereto. These LDPC coded bits are then provided to a S/P (Serial to Parallel) path such that the output symbols may be provided to a modulation encoder. This S/P path performs the bit to m-bit symbol transformation. The modulation encoder outputs a signal sequence that includes symbols (composed of LDPC coded bits) that correspond to a modulation having a constellation and a corresponding mapping.

Figure 20B:
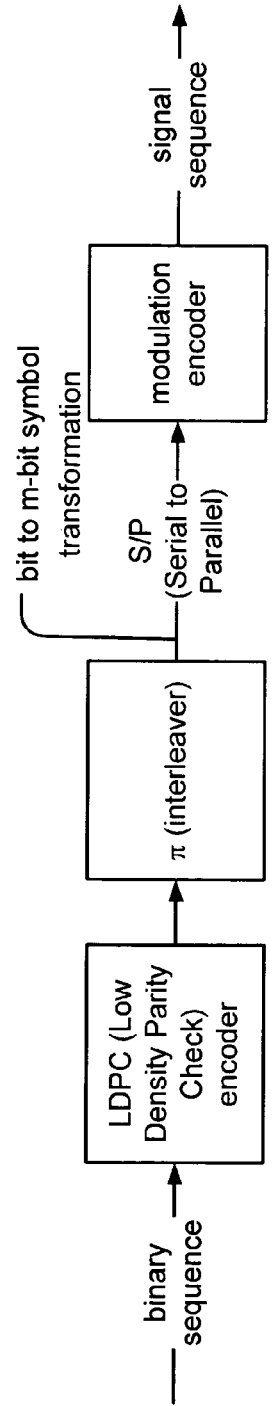
FIG. 20B is a diagram illustrating an embodiment of BICM (Bit Interleaved Coded Modulation) that is employed in conjunction with LDPC (Low Density Parity Check) coding and modulation encoding.

FIG. 20B is a diagram illustrating an embodiment of BICM (Bit Interleaved Coded Modulation) that is employed in conjunction with LDPC (Low Density Parity Check) coding and modulation encoding. This embodiment is similar to the embodiment described above that performs direct combining of LDPC coding and modulation encoding, with the exception that a π (interleaver) is interposed between the LDPC encoder and the modulation encoder.

A binary sequence (e.g., a bit stream) is provided to an LDPC encoder. The LDPC encoder introduces a degree of redundancy (or parity) within the bit sequence provided thereto. These LDPC coded bits are then provided to the π (interleaver) to generate a degree of randomness within the LDPC coded bits thereby (hopefully) making that LDPC coded bit sequence to be more robust to interference, noise, and other deleterious effects. This LDPC coded bit sequence that has been interleaved is then provided to a S/P (Serial to Parallel) path such that the output symbols may be provided to a modulation encoder. Again, this S/P path performs the bit to m-bit symbol transformation. The modulation encoder outputs a signal sequence that includes symbols (composed of the interleaved LDPC coded bits) that correspond to a modulation having a constellation and a corresponding mapping.

Figure 20C:
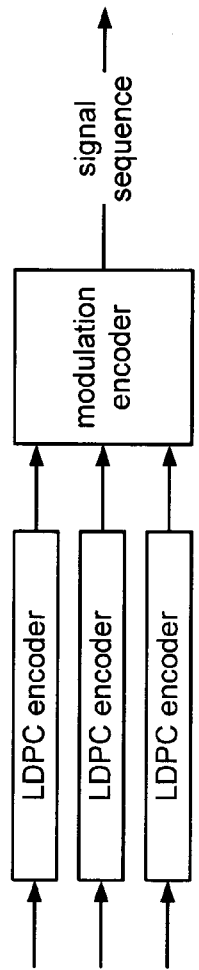
FIG. 20C is a diagram illustrating an embodiment of multilevel coded modulation encoding.

FIG. 20C is a diagram illustrating an embodiment of multilevel coded modulation encoding. Rather than require a S/P (Serial to Parallel) path between a single LDPC encoder and a modulation encoder, this embodiment shows a plurality of LDPC encoders operating in parallel such that the outputs of each of the LDPC encoder is already within parallel format (thereby obviating the need for the S/P (Serial to Parallel) path employed within the embodiments described above). The outputs of these LDPC encoders are provided to a modulation encoder. The modulation encoder outputs a signal sequence that includes symbols (composed of the LDPC coded bits provided by the various LDPC encoders) that correspond to a modulation having a constellation and a mapping.

All 3 of these embodiments, described above that perform the combination of LDPC coding and modulation encoding, typically operate using a single code rate and also use a single modulation (constellation and mapping) to map the binary bits to a given constellation. That is to say, they all typically employ a single code rate and a single modulation (having a single constellation type and a single mapping) for that single constellation. This approach inherently limits the maximal performance that may be achieved using these approaches.

However, the invention is also operable to operate on LDPC coded signals having a code rate and/or a modulation (constellation and mapping) that may vary as frequently as on a symbol by symbol basis. To illustrate further the single modulation approach of these 3 embodiments, a specific implementation is provided below that uses different modulations for various symbols within an LDPC coded signal. In some instances, this may involve changing only the mapping of the constellation shape used for different symbols. In alternative embodiments, this may involve changing both the constellation shapes and/or their corresponding mappings that are used for different symbols.

Figure 21:
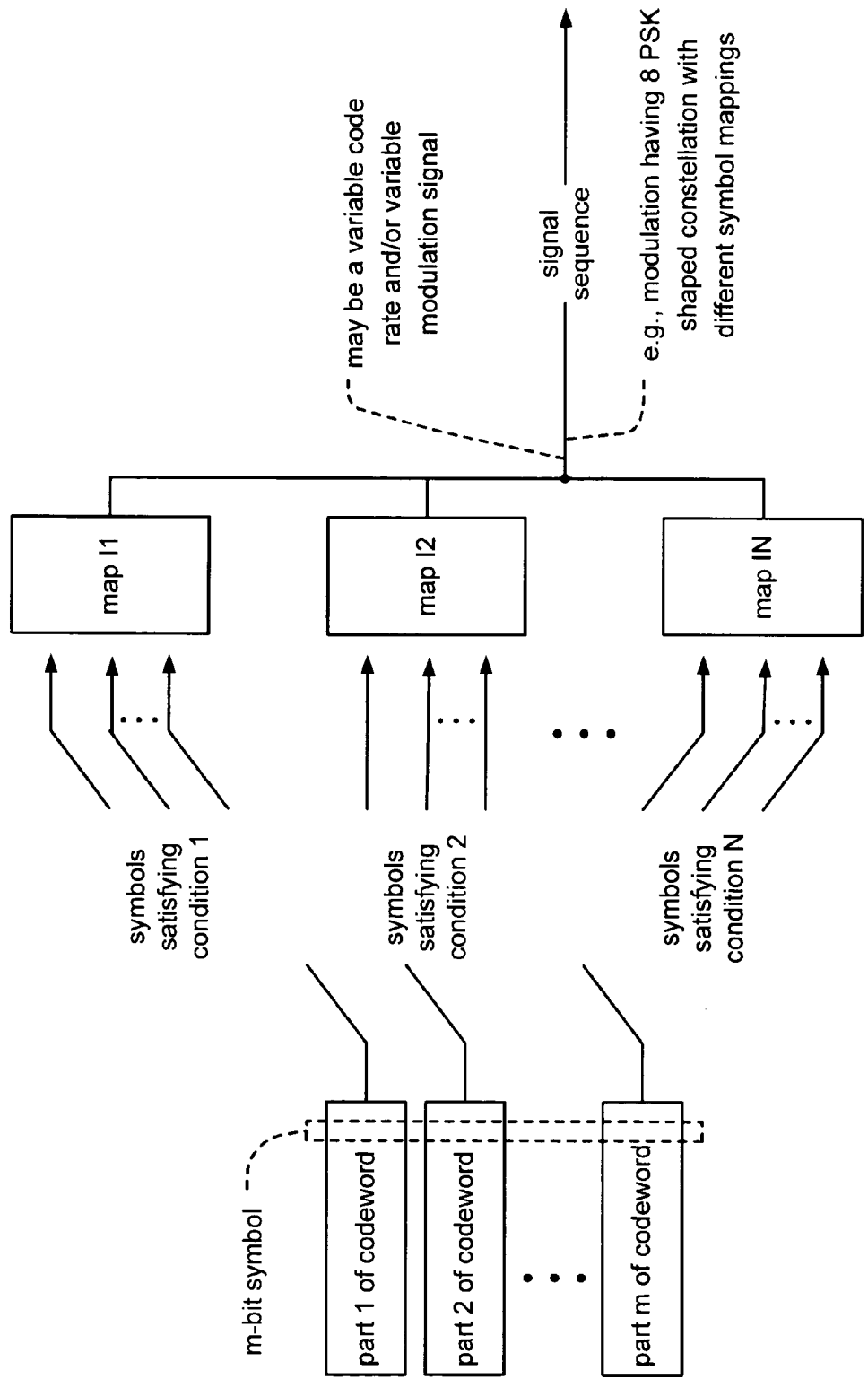
FIG. 21 is a diagram illustrating an embodiment of a variable signal mapping LDPC (Low Density Parity Check) coded modulation system that is built in accordance with invention.

FIG. 21 is a diagram illustrating an embodiment of a variable signal mapping LDPC (Low Density Parity Check) coded modulation system that is built in accordance with invention. This embodiment shows how a general implementation may be made for mapping an LDPC block coded modulation signal thereby generating LDPC coded signals having a modulation (constellation and mapping) that may vary as frequently as on a symbol by symbol basis.

In general, for any modulation, one can select as many as possible constellations and corresponding mappings, to construct an LDPC coded signal having a modulation (constellation and mapping) that may vary as frequently as on a symbol by symbol basis. This diagram illustrates a possible implementation for an m-bit constellation modulation. Moreover, it is also noted that the code employed herein can be any one of a variety of block codes; LDPC code represented one type of block code that can benefit from this aspect of the invention.

In a very general illustration, a plurality of different encoders is employed. A first encoder employs a part 1 of a codeword, a second encoder employs a part 2 of a codeword, . . . , and a final encoder (of the plurality of encoders) employs a part m of a codeword. Those symbols that satisfy a condition 1 are provided to a map I1. Similarly, those symbols that satisfy a condition 2 are provided to a map I2, and those symbols that satisfy a condition N are provided to a map IN. The various conditions employed to govern the direction of which mapping to which the symbols are provided may be selected by a designer implementing the invention.

The signal sequence generated by this embodiment, or any of the other embodiments for which the decoding approaches of the invention may operate, may be a variable code rate and/or a variable modulation signal. For example, the code rate of the symbols of the signal sequence may vary as frequently as on a symbol by symbol basis. A first symbol may be encoded according to a first code rate, and a second symbol may be encoded according to a second code rate.

In addition, the modulation of the symbols of the signal sequence may vary as frequently as on a symbol by symbol basis. More specifically, for the variable modulation type signal, either one or both of the constellation or mapping of the symbols of the signal sequence may vary as frequently as on a symbol by symbol basis. As yet another example, multiple symbols of the signal sequence may all be mapped to a similarly shaped constellation, yet various symbols may also have different mappings to the same constellation. As one specific example, two symbols may each be associated with an 8 PSK (8 Phase Shift Key) shaped constellation, yet each of the symbols may be mapped differently within that 8 PSK shaped constellation. Clearly, other types of modulations may also be employed without departing from the scope and spirit of the invention.

Figure 22:
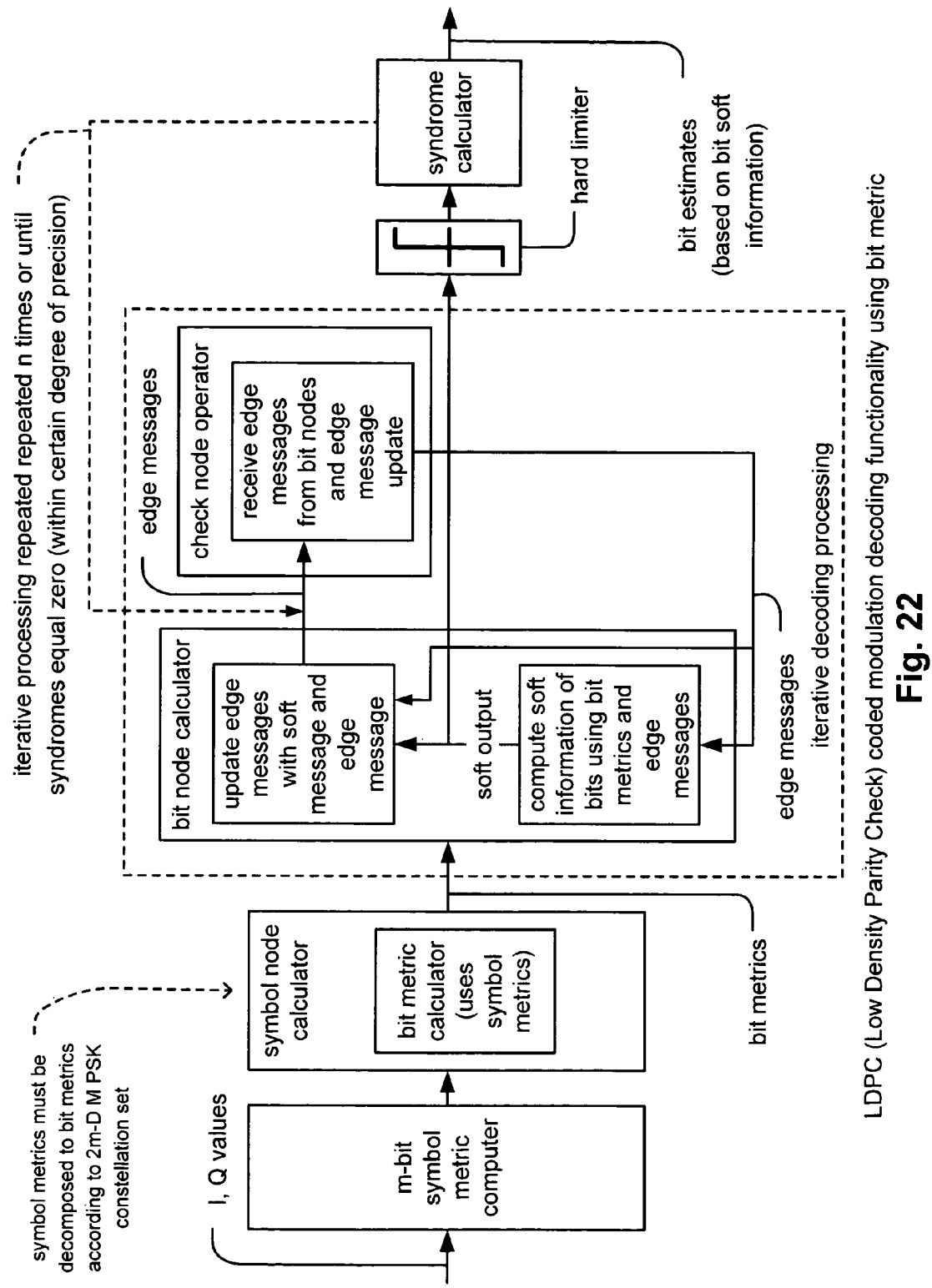
FIG. 22 is a diagram illustrating an embodiment of LDPC (Low Density Parity Check) coded modulation decoding functionality using bit metric according to the invention.

FIG. 22 is a diagram illustrating an embodiment of LDPC (Low Density Parity Check) coded modulation decoding functionality using bit metric according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 23:
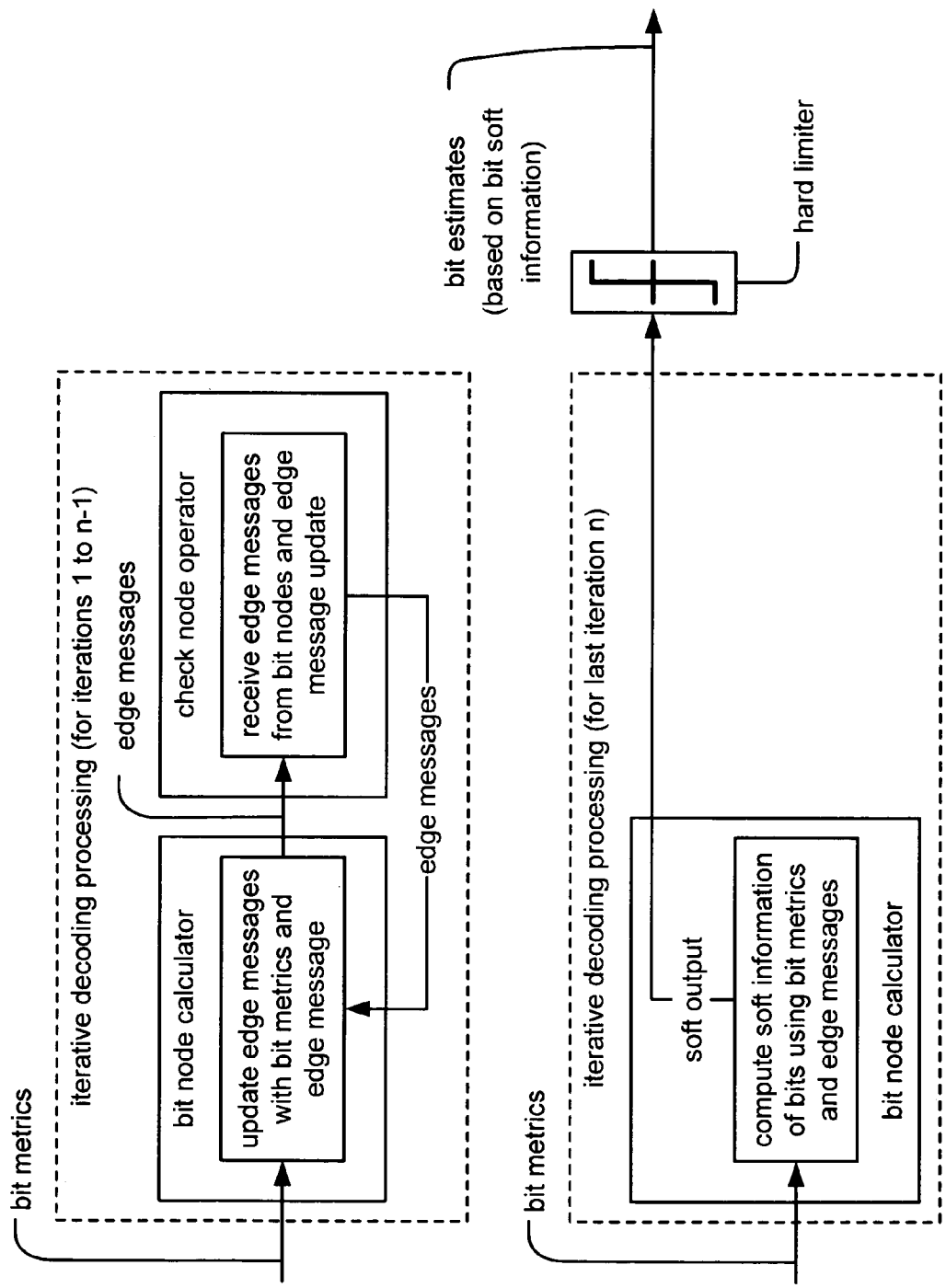
FIG. 23 is a diagram illustrating an alternative embodiment of LDPC coded modulation decoding functionality using bit metric according to the invention (when performing n number of iterations).

FIG. 23 is a diagram illustrating an alternative embodiment of LDPC coded modulation decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 24:
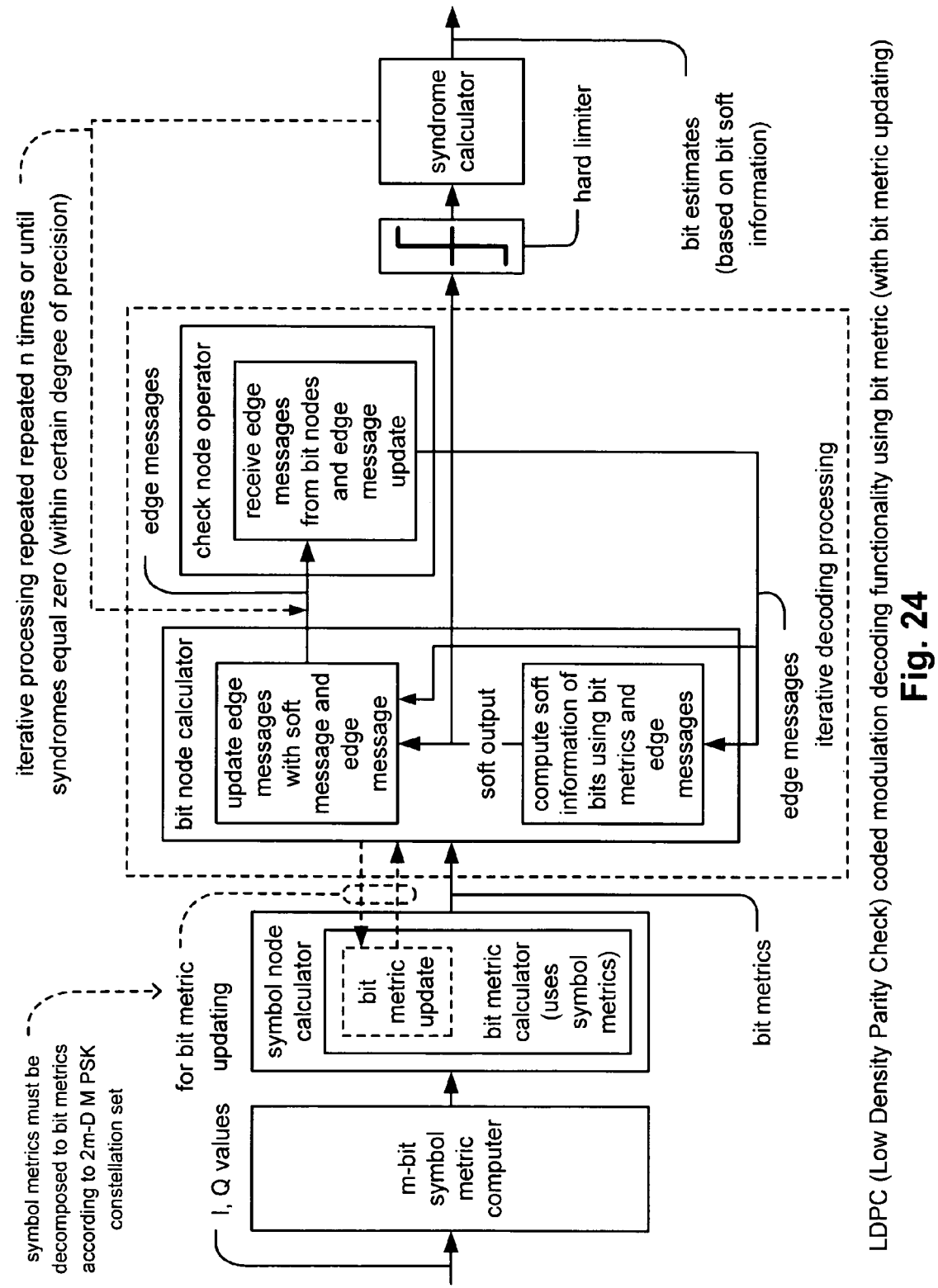
FIG. 24 is a diagram illustrating an alternative embodiment of LDPC (Low Density Parity Check) coded modulation decoding functionality using bit metric (with bit metric updating) according to the invention.

FIG. 24 is a diagram illustrating an alternative embodiment of LDPC (Low Density Parity Check) coded modulation decoding functionality using bit metric (with bit metric updating) according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When they are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 25:
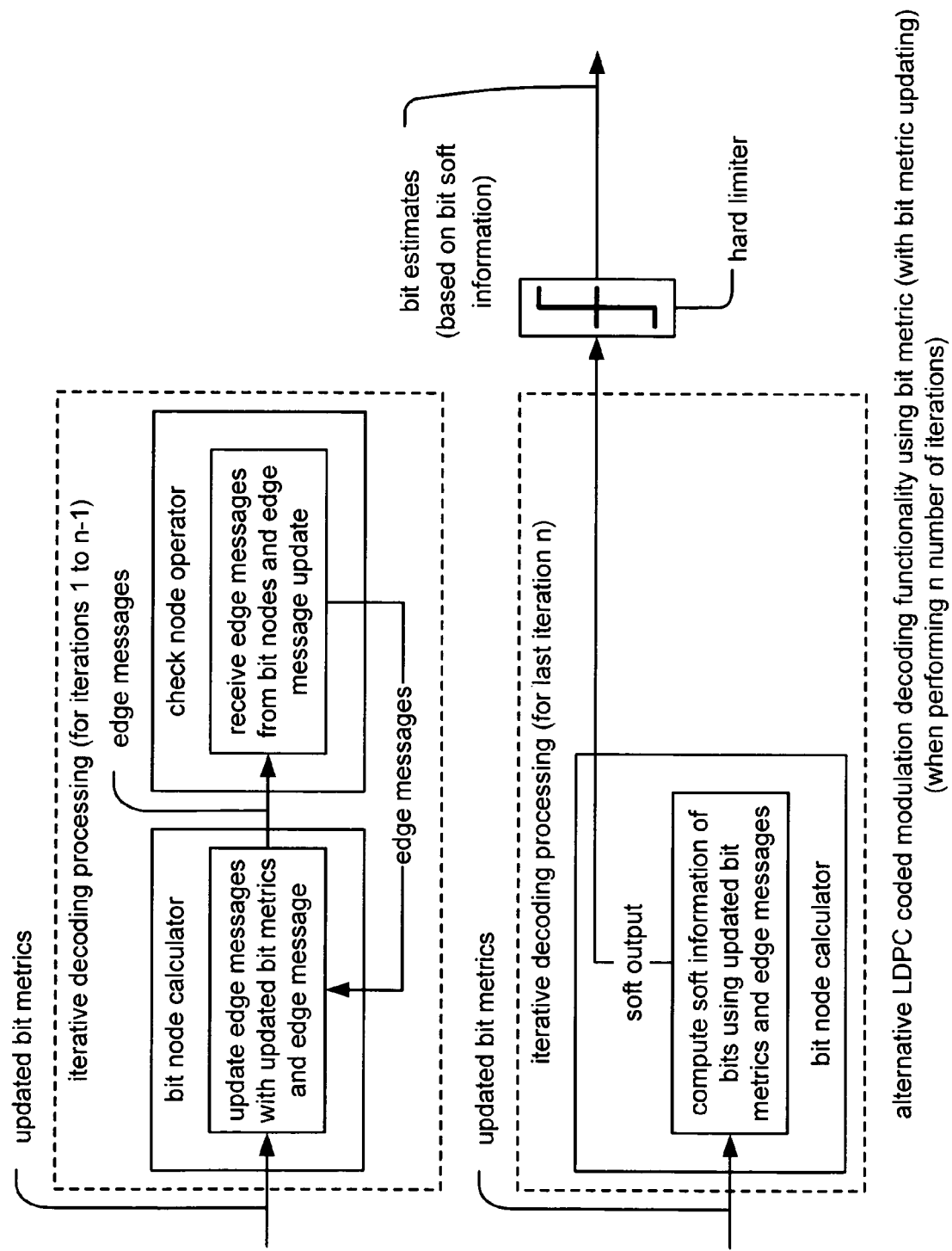
FIG. 25 is a diagram illustrating an alternative embodiment of LDPC coded modulation decoding functionality using bit metric (with bit metric updating) according to the invention (when performing n number of iterations).

FIG. 25 is a diagram illustrating an alternative embodiment of LDPC coded modulation decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

FIG. 26A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 26B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

FIG. 27A is a diagram illustrating an LDPC (Low Density Parity Check) coded modulation tripartite graph with symbol nodes connected to bit nodes according to the invention. In this embodiment, it can be seen that the bit nodes are connected to the symbol nodes. The appropriately corresponding bit nodes are also connected to the check nodes according to the LDPC code being employed. However, it is noted that the symbols to be decoded are solely determined by the bits connected to the corresponding symbol. This property is capitalized upon such that the bit nodes may be removed from the LDPC tripartite graph, so that the symbol nodes may be directly connected to the check nodes thereby generating an LDPC coded modulation bipartite graph.

As one example, 3 symbol nodes, $s_0, s_1, s_2$, are connected to the 9 bit nodes, $b_0, b_1, b_2, \ldots, b_8$, according to the following mapping:

$$s_0 \leftrightarrow (b_0, b_3, b_6), s_1 \leftrightarrow (b_1, b_4, b_7), s_2 \leftrightarrow (b_2, b_5, b_8) \quad \text{(EQ 1)}$$

The connections between the 9 bit nodes, $b_0, b_1, b_2, \ldots, b_8$, and the 3 check nodes, $c_0, c_1, c_2$, are made according to the following mapping:

$$b_0 \leftrightarrow (c_0, c_2), b_1 \leftrightarrow (c_0, c_1), b_2 \leftrightarrow (c_1, c_2),$$

$$b_3 \leftrightarrow (c_0, c_1), b_4 \leftrightarrow (c_1, c_2), b_5 \leftrightarrow (c_0, c_2),$$

$$b_6 \leftrightarrow (c_0, c_1), b_7 \leftrightarrow (c_1, c_1), b_8 \leftrightarrow (c_0, c_1)$$

FIG. 27B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 27A). One aspect of the invention is the ability to reduce the number of nodes within an LDPC bipartite graph by directly connecting the symbols nodes to the check nodes (e.g., by modifying an LDPC coded modulation tripartite graph to generate an LDPC coded modulation bipartite graph). However, this must be performed very carefully to ensure proper decoding of such LDPC coded signals. As is described herein, the labeling of the edges connected the symbols nodes to the check nodes needs to be done carefully to ensure proper decoding of symbols.

Within this LDPC code bipartite graph, the edges are only connected between the symbol nodes and the check nodes. In doing so, every edge connecting the symbol nodes and the check nodes is labeled by a value according to EQ 1 shown above. In some embodiments, these edges are labeled using octal values.

For example, using an octal labeling approach, the edge connecting the symbol node $s_0$ to the check node $c_0$, depicted as $(s_0, c_0)$, is labeled as 7 since all three bits $b_0, b_3, b_6$ are connected to $c_0$ (e.g., labeled as 7 because $b_0, b_3, b_6 = 111$).

Similarly, the edge connecting the symbol node $s_0$ to the check node $c_1$, depicted as $(s_0, c_1)$, is labeled as 6 since only the two bits $b_0, b_3$ are connected to $c_1$ (e.g., labeled as 6 because $b_0, b_3, b_6 = 110$). As another example, the edge connecting the symbol node $s_0$ to the check node $c_2$, depicted as $(s_0, c_2)$, is labeled as 1 since only the one bit $b_0$ is connected to $c_2$ (e.g., labeled as 1 because $b_0, b_3, b_6 = 100$). The additional edges that communicatively couple the symbols nodes to the check nodes may also be labeled according to this convention.

One of the advantages of the symbol node to check node LDPC code bipartite graph is that a decoder may use symbol metrics when performing the decoding processing of the LDPC coded symbols instead of bit metrics. In this way of performing the decoding processing, there is therefore no need to perform metric updating; the metric updating within the decoding processing may have the undesirable effect of requiring an increased amount of memory to be used. Moreover, the decoding based on the LDPC code bipartite graph (sometimes referred to as a symbol LDPC code bipartite graph) actually out-performs decoding processing that is based on an LDPC code tripartite graph (whose bit nodes are connected to check nodes). In addition, the LDPC symbol decoding provides comparable or better performance of LDPC bit decoding that involves updating of the bit metrics.

FIG. 28A is a diagram illustrating symbol decoding (shown with respect to an LDPC (Low Density Parity Check) coded modulation bipartite graph) according to the invention. The symbol decoding processing performed according to the invention may be performed using an LDPC coded modulation bipartite graph in which the symbol nodes are connected directly to the check nodes. In general, the I, Q values of a symbol are provided to the symbol nodes, and the iterative decoding processing is performed according to the manner in which the labeled edges communicatively couple the symbol nodes to the check nodes.

As an example of how the decoding processing may be performed using such an LDPC coded modulation bipartite graph, a rate 2/3 LDPC code with an 8 PSK (8 Phase Shift Key) modulation signal is decoded and explained in detail. This LDPC code may be a regular LDPC code or an irregular LDPC code without departing from the scope and spirit of the invention. The block length of the LDPC code is 3N and a 3 bit symbol $s_i$ is mapped (e.g., using a symbol mapper) according to the following notation:

$$s_i = (b_i, b_{N+i}, b_{2N+i})$$

The parity check matrix of such an LDPC code may be represented as $[h_{ij}]_{N \times 3N}$. The estimated symbols $r_i$ corresponding to the 3 bit symbol $S_i$ may be represented as $r_i = (r_{0i}, r_{1i}, r_{2i})$. The partial syndromes $S^m(i)$ and $S_m(i)$ (which may generally be referred to as syndromes, as they are up above in other embodiments) that are calculated using the estimated symbols and the parity check matrix of the LDPC code may be represented as follows:

$$S^m(i) = \sum_{j=0}^{m-1} (r_{0j} h_{ij} + r_{1j} h_{i(N+j)} + r_{2j} h_{i(2N+j)}) \quad \text{(EQ 2)}$$

$$S_m(i) = \sum_{j=m}^{N-1} (r_{0j} h_{ij} + r_{1j} h_{i(N+j)} + r_{2j} h_{i(2N+j)})$$

The following decoding processing description is described as being performed on a signal sequence Y. The probability of the signal sequence Y satisfying the partial syndrome, $p(S^j(i) = m | Y)$, to be equal to $A_{i,j}(m)$ is calculated (e.g., the probability of $p(S^j(i)=m|Y)=A_{i,j}(m)$). In addition, other probabilities are calculated; namely, the probability of the signal sequence Y satisfying the partial syndrome, $p(S_j(i)=m|Y)$, to be equal to $B_{i,j}(m)$ is calculated (e.g., the probability of $p(S_j(i)=m|Y)=B_{i,j}(m)$).

These probabilities are all calculated based on the following conditions:

$$A_{i,0}(0)=1$$

$$B_{i,deg(c_j)-1}(0)=1, \text{ and}$$

$$A_{i,0}(m)=0$$

$$B_{i,deg(c_j)-1}(m)=0, \text{ where } m \neq 0.$$

Since the decoding may be performed in the logarithmic domain thereby enabling multiplication operations to be performed using addition and division operations to be performed using subtraction, these variables may be redefined within the logarithmic domain as follows:

$$\alpha_{i,j}(m)=\log(A_{i,j}(m))$$

$$\beta_{i,j}(m)=\log(B_{i,j}(m)).$$

These values may be referred to as the alphas, or forward metrics, ($\alpha_{i,j}(m)$) and betas, or backward metrics, ($\beta_{i,j}(m)$) to be employed within the decoding processing.

The edge messages being passed from the check nodes to the symbol nodes may be represented as Medge[i] [j] [k], where i runs according to the appropriately labeled edges within the LDPC coded modulation bipartite graph.

As some examples:
1. if the label is 7, then k runs from 0 to 7,
2. if the label is 3, 5, or 6, then k runs from 0 to 3, and
3. if the label is 1, 2, or 6, then k runs between 0 to 1.

In addition, a new function x(v) that varies from $\{0, \ldots, 7\}$ to $\{0,1\}$ may be employed. The value v may be viewed as being an integer represented in octal. Then, the value of v may be represented as $v=(v_0, v_1, v_2)$. This new function x(v) may be represented as follows:

$$x(v)=v_0 \oplus v_1 \oplus v_2 \quad \text{(EQ 3)}$$

where $\oplus$ is an exclusive-or (XOR) function (e.g., binary addition).

The notation and definitions provided above are also employed to describe the symbol decoding processing in other embodiments whose decoding processing and/or functionality are described in more detail below. More specifically, the embodiments described in more detail below show how the check node updating and symbol sequence estimation, as well as symbol node updating, is performed using these various values.

FIG. 28B is a diagram illustrating an embodiment of symbol decoding functionality (supported with an LDPC (Low Density Parity Check) coded modulation bipartite graph) according to the invention. This embodiment shows in more detail how the check node updating and symbol sequence estimation, as well as symbol node updating, is performed.

The decoding processing described in this embodiment may be better understood in the context of the check node updating and symbol sequence estimation, including the symbol node updating, that may be performed within in at least 2 different embodiments that are described herein in accordance with the invention: (1) symbol decoding and (2) hybrid decoding (that performs a combination of bit level and symbol level decoding). One possible embodiment of symbol decoding is described in this diagram (FIG. 28B), and various possible embodiments by which hybrid decoding may be implemented are described below with respect to the remaining diagrams of this disclosure.

Beginning from the left hand side of the diagram, input information corresponding to the calculated partial syndromes, that also includes the initial values of the alphas ($\alpha_{i,j}(m)$) and the betas ($\beta_{i,j}(m)$) (e.g., forward and backward metrics), are provided to a check node update functional block. Iterative decoding processing is performed within the check node update functional block over the total number of check nodes. For example, M iterations are performs over i (where i varies from 0 to M−1, and where M is the total number of check nodes of the LDPC bipartite graph).

In doing this iterative decoding processing, the check node updating initially involves calculating the values of the alphas ($\alpha_{i,j}(m)$) and the betas ($\beta_{i,j}(m)$) (beyond merely the initial values that are provided during the initial iteration) for each of the symbols of a received symbol block. This iterative decoding processing in calculating the alphas and betas may be performed using a forward-backward procedure through the received symbol block.

The calculation of the alphas and betas is described below. For j=0 to deg($c_i$)−1 and m=0,1, the forward-backward processing procedure may be employed to calculate the alphas ($\alpha_{i,j}(m)$) and the betas ($\beta_{i,j}(m)$) as follows:

$$\alpha_{i,j}(m) = \min^*\{\text{Medge}[i]\ [j-1]\ [k] + \alpha_{i,j-1}(m \oplus x(k)) | \text{ all possible } k\}$$

$$\beta_{i,j}(m) = \min^*\{\text{Medge}[i]\ [j+1]\ [k] + \beta_{i,j+1}(m \oplus x(k)) | \text{ all possible } k\}$$

Now that these values of alpha and beta are available for each of the symbols within a received symbol block, the edge messages Medge[i] [j] [k] (that communicatively couple the symbol nodes to the check nodes) are updated using these calculated alphas and betas values.

For j=0 to deg($c_i$)−1 and all possible k, the updating of the edge messages Medge[i] [j] [k] may be performed as follows:

$$\text{Medge}[i]\ [j]\ [k] = \min^*\{\lfloor\alpha_{i,j}(0)+\beta_{i,j}(x(k))\rfloor, \lfloor\alpha_{i,j}(1)+\beta_{i,j}(x(k)\oplus 1)\rfloor\}$$

The min* processing functionality described herein may be better understood by the following description. The min* processing includes determining a minimum value from among two values (e.g., shown as min(A,B) in min* processing) as well as determining a logarithmic correction factor (e.g., shown as $\ln(1+e^{-|A-B|})$ in min* processing) in selecting the smaller metric. In addition, it is also noted that max* processing may alternatively be performed in place of min* processing. The max* processing operation also includes a logarithmic correction in selecting the larger metric. It is noted that the various embodiments of the invention may be implemented using the max* operations in lieu of the min* operation when preferred in a given implementation.

The min* processing, when operating on inputs A and B, may be expressed as follows:

$$\min^*(A,B) = \min(A,B) - \ln(1+e^{-|A-B|})$$

Again, the min* processing may alternatively be performed using max* processing. The max* processing, when operating on inputs A and B, may be expressed as follows:

$$\max^*(A,B) = \max(A,B) + \ln(1+e^{-|A-B|})$$

Moreover, when multiple min* operations are to be performed on multiple values (e.g., more than 2), the min* processing may be expressed as follows:

$$\min^*(x_1, \ldots, x_N) = \min^*(\min^*(x_1, \ldots, x_{N-1}), x_N) \quad \text{(EQ 4)}$$

After the check node processing has been completed, a symbol sequence estimate and symbol node update functional block operates using the check node update messages to continue the decoding processing.

Since the total number of edges is the same count from either side (e.g., from either the symbol node side or the check node side), the edges are intrinsically re-ordered according to the symbols that are being decoded. This re-ordering may be intrinsically performed using a LUT (Look-Up Table) to ensure the proper ordering of the check node updating. In other words, the LUT may be implemented to perform the function of which edge information to take when performing the symbol sequence estimate and symbol node update. In addition, this re-ordering functionality may be inherently implemented in hardware for proper ordering of the check node updating such that it corresponds to an order that is appropriate to the symbol node updating. For proper decoding of the symbols of the sequence (e.g., first symbol to last symbol), there needs to be some ordering of the symbols. However, this symbol ordering is not critical when performing the check node updating. That is to say, the ordering of the check node updating may then be performed according to any desired ordering, and to ensure proper decoding of the symbols according to the desired order (e.g., first symbol to last symbol), the check node updating is performed to ensure that the edge messages are inherently appropriately ordered according to the desired order for the decoding processing.

More specifically, this decoding processing may be understood with respect to the edge messages Medge[i] [j] [k], where i runs across all of the symbol nodes, where j runs according to the degree of the edges from the symbol nodes, and where k runs according to the labels of the LDPC bipartite graph.

This embodiment described with respect to this diagram is shown with respect to a code that includes 3 bit symbols, coded according to 8 PSK (8 Phase Shift Key) modulation. However, it is noted that such a decoding approach may also be adapted very easily to decoding signals having an even larger number of bits. For example, this decoding approach may be adapted to perform decoding of signals having symbols of higher order modulations including 16 QAM (16 Quadrature Amplitude Modulation), 16 APSK (16 Asymmetric Phase Shift Keying), 64 QAM, and even other modulation types without departing from the scope and spirit of the invention.

The label on the j-th edge from the check node i may be denoted as $L_{i,j}$. A new function, sh(L,v), may be defined and employed to assist in the decoding processing describer herein. This new function sh(L,v) may be defined as follows:

$$sh(L, (v_0, v_1, v_2)) = \begin{cases} v_2 & L = 1 \\ v_1 & L = 2 \\ (v_1, v_2) & L = 2 \\ v_0 & L = 4 \\ (v_0, v_2) & L = 5 \\ (v_0, v_1) & L = 6 \\ (v_0, v_1, v_2) & L = 7 \end{cases} \quad (EQ\ 5)$$

After the edge messages have been intrinsically and appropriately re-ordered using the approach described above, the symbol sequence estimate and symbol node update functional block continues to operate according to the following procedure.

For m=0, . . . , 7, the possible values for the soft symbol estimates are computed (e.g., the possible values for the soft information of the symbols is calculated) as follows:

$$p_i(m) = Metric_i[m] + \sum_{j=0}^{deg(s_i)-1} \left( \sum_{L_{i,j}} Medge[i][j][sh(L_{i,j}, m)] \right)$$

where $Metric_i[m]$ is the appropriate symbol metric obtained from the received signal according to its appropriate modulation (constellation and mapping values).

The symbol sequence estimate and symbol node update functional block continues by estimating the symbols using the soft symbol estimates. More specifically, the estimate of the symbol $s_i$ to m is made such that $p_i$ (m) is the smallest value selected from among all of the possible values of $p_i(0)$, $p_i(1)$, . . . , $p_i(7)$.

After the estimate of the symbols is made using the soft symbol estimates, the edge messages are updated within the symbol sequence estimate and symbol node update functional block using the older edge messages. More specifically, the edge message are updated as follows:

The processing may be better understood by considering the edge label $L_{i,j}$.

1. if $L_{i,j}$=7,then for m=0, . . . , 7, Medge[i] [j] [k]=$p_i$[m]−Medge[i] [j] [m].

2. alternatively, if $L_{i,j}$=3,5,6, then for $m_0,m_1 \in \{0,1\}$, then the values of the edge messages may be defined as:

$$Medge[i][j][(m_0, m_1)] = \begin{cases} \min*(p_i(0, m_0, m_1), p_i(1, m_0, m_1)) - Medge[i][j][(m_0, m_1)] & L_{i,j} = 3 \\ \min*(p_i(m_0, 0, m_1), p_i(m_0, 1, m_1)) - Medge[i][j][(m_0, m_1)] & L_{i,j} = 5 \\ \min*(p_i(m_0, m_1, 0), p_i(m_0, m_1, 1)) - Medge[i][j][(m_0, m_1)] & L_{i,j} = 6 \end{cases}$$

3. alternatively, if $L_{i,j}=1,2,4$, then for $m=0,1$, then the values of the edge messages may be defined as:

$$Medge[i][j][(m)] = \begin{cases} \min*(p_i(k_0, k_1, m) | k_0, k_1 \in \{0, 1\}) - Medge[i][j][m] & L_{i,j} = 1 \\ \min*(p_i(k_0, m, k_1) | k_0, k_1 \in \{0, 1\}) - Medge[i][j][m] & L_{i,j} = 2 \\ \min*(p_i(m, k_0, k_1) | k_0, k_1 \in \{0, 1\}) - Medge[i][j][m] & L_{i,j} = 4, \end{cases}$$

where the right hand side edge of these equations is the old edge message passed from the check node.

Continuing on with the iterative decoding processing, using the updated edge messages (that are updated either a predetermined number of times and/or until convergence of the edge messages has been met within a certain degree of precision), then the best estimates of the symbols of a received symbol block may be made.

Figure 29:
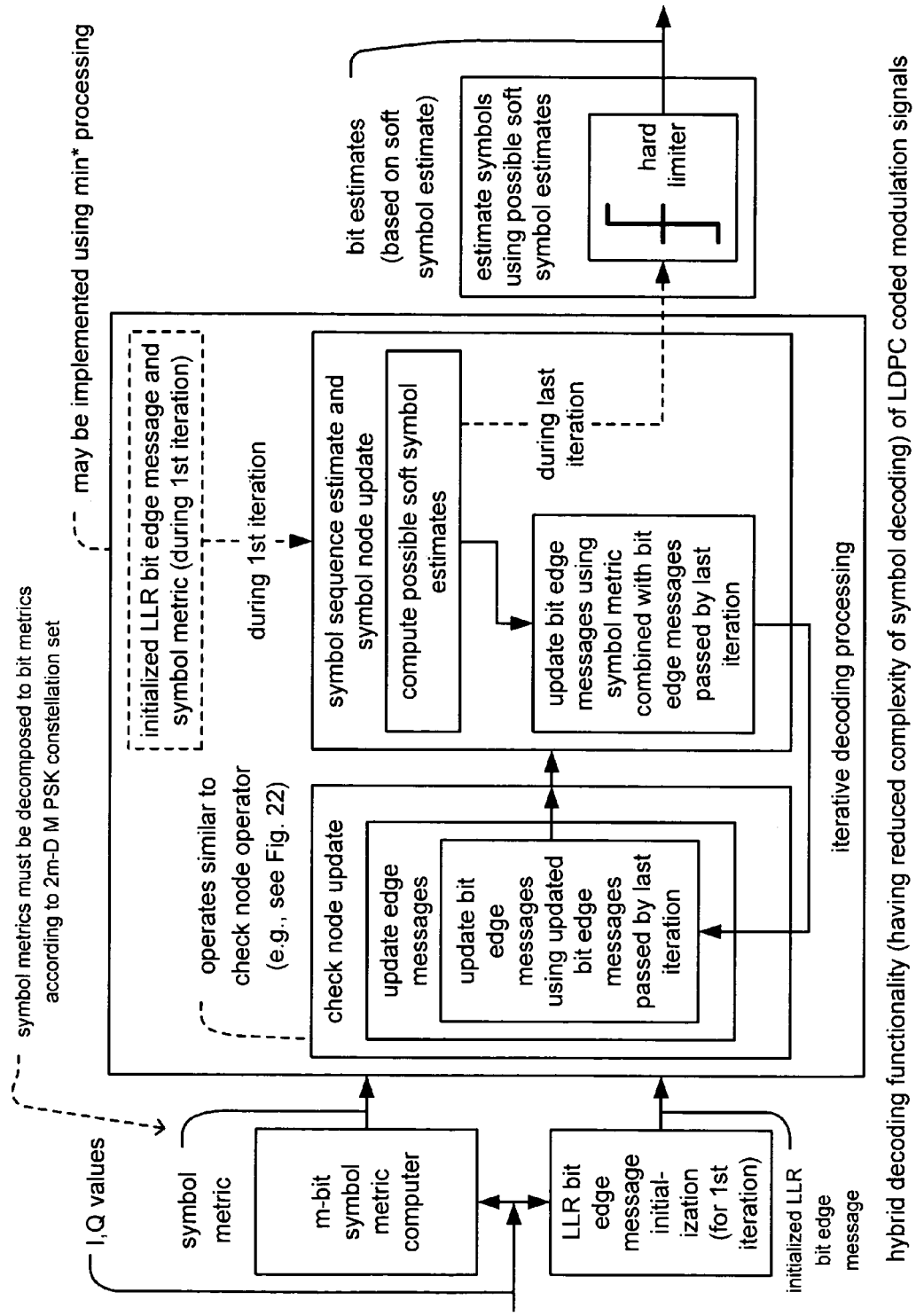
FIG. 29 is a diagram illustrating an embodiment of hybrid decoding functionality (having a reduced complexity when compared to symbol decoding) of LDPC (Low Density Parity Check) coded modulation signals according to the invention.

FIG. 29 is a diagram illustrating an embodiment of hybrid decoding functionality (having a reduced complexity when compared to symbol decoding) of LDPC (Low Density Parity Check) coded modulation signals according to the invention. This embodiment showing hybrid decoding processing may be viewed as being a modification (e.g., a departure) of the previous decoding processing approaches described up to now. In general, similar decoding functional blocks are employed within the iterative decoding processes as shown within the symbol decoding embodiments described above, but the manner in which these functional blocks operate is different; these differences provide for a less complex decoding approach, and (as is seen below with respect to comparing the performance of various decoding approaches) the hybrid decoding approach also provides for a significant improvement in performance (e.g., when compared to bit decoding only).

This hybrid decoding functionality begins by receiving the I, Q values of the received signal. Thereafter, an m-bit symbol metric computer functional block calculates the corresponding symbol metrics using the I, Q values. Also, a functional block performs the LLR (log likelihood ratio) bit edge message initialization for use in the first decoding iteration; this initialization need only be performed once. If desired, this initial LLR bit edge message may be initialized to a value of 0 for the initial iteration (e.g., iteration i=0). From these functional blocks, the symbol metric and the initialized LLR bit edge message are passed to an iterative decoding processing functional block that includes a check node update functional block and a symbol sequence estimate and symbol node update functional block. These initial conditions (or initial values) of the LLR bit edge message and the symbol metric are employed by the symbol sequence estimate and symbol node update functional block during a $1^{st}$ decoding iteration of the iterative decoding processing.

The check node update functional block operates in a relatively similar manner as the check node operator functional block that is described above with respect to the LDPC coded modulation decoding functionality using bit metric approach (e.g., see FIG. 22). In general, the check node update functional block performs updating of the edge messages received from a symbol sequence estimate and symbol node update functional block. This symbol sequence estimate and symbol node update functional block (of the hybrid decoding approach) differs from the symbol sequence estimate and symbol node update functional block (of the symbol decoding approach).

When performing the update of the edge messages within the check node update functional block, the check node update functional block updates the bit edge messages using the updated bit edge messages passed by the last iteration. During a first decoding iteration, this may include using the initialized values of the bit edge message. However, during the iterative decoding processing, the check node update functional block passed the updated edge messages to the symbol sequence estimate and symbol node update functional block.

Again, it is noted that the symbol sequence estimate and symbol node update functional block uses the initial conditions of the LLR bit edge message during its first iteration of the iterative decoding processing. It also uses the initially received symbol metric value during subsequent iterations of the iterative decoding processing. The symbol sequence estimate and symbol node update functional block initially performs computation of the possible soft symbol estimates. Then, the symbol sequence estimate and symbol node update functional block uses this information to assist in the updating of the edge messages. More specifically, the symbol sequence estimate and symbol node update functional block updates the bit edge messages using the computed symbol metric (from the m-bit symbol metric computer) combined with the bit edge message passed by the last iteration from the check node update functional block. From one perspective, this shows the hybrid decoding functionality such that a combined use of bit level information and symbol level information are both used in a manner that (as is also described below) that provides a significant reduction in complexity and ease of implementation while providing performance that may be as good as the symbol decoding approach in some embodiments. In general, the performance of the hybrid decoding approach is as good as or worse than the symbol decoding approach; however, the hybrid decoding approach may be implemented significantly easier than the symbol decoding approach (e.g., with significantly reduced processing, memory, and memory management resources).

The iterative decoding processing continues between the symbol sequence estimate and symbol node update functional block and the check node update functional block such that the edge messages are continually, successively and alternatively updated in an effort to converge on a final value of the bit edge messages (either after performing a predetermined number of iterations or after a sufficient degree of accuracy is achieved and the bit edge messages have converged on a final value, that meets the sufficient degree of accuracy). The updating is successive and alternative from the perspective that the symbol sequence estimate and symbol node update functional block performs an updating, and then the check node update functional block performs an updating, and then the iterative decoding processing continues.

During a last decoding iteration, the symbol sequence estimate and symbol node update functional block may be implemented to perform an estimate of the symbols using the possible soft symbol estimates that have been calculated. This soft symbol estimate is then output from the symbol sequence estimate and symbol node update functional block to a hard limiter where hard decisions may be made for the individual bits within the soft symbol estimate. This final output may be viewed as being the individual bit estimates of the bits within the symbol that is being decoded using the hybrid decoding approach. That is to say, the hard limiter makes bit estimates based on the best estimate for each of the symbols such that the bit estimates are hard decisions for each of the individual bits of those respective symbols.

In one implementation (described here with respect to the FIG. 29), these iterative decoding processing steps, performed by the symbol sequence estimate and symbol node update functional block and the check node update functional block, are repeated a predetermined number of iterations (e.g., repeated n times, where n is selectable).

Figure 30:
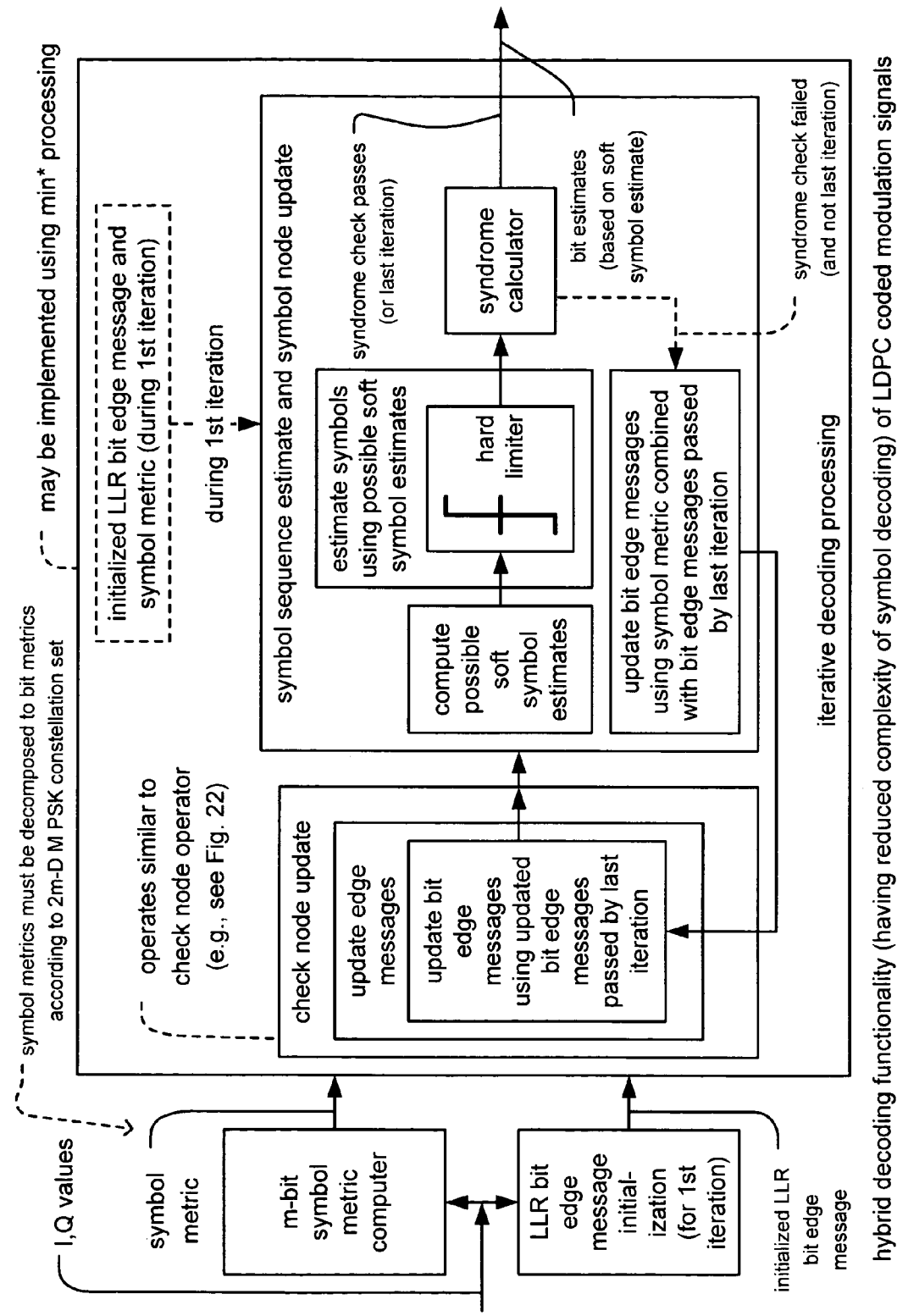
FIG. 30 is a diagram illustrating another embodiment of hybrid decoding functionality (having a reduced complexity when compared to symbol decoding) of LDPC coded modulation signals according to the invention.

FIG. 30 is a diagram illustrating another embodiment of hybrid decoding functionality (having a reduced complexity when compared to symbol decoding) of LDPC coded modulation signals according to the invention. In this alternative implementation, these iterative decoding processing steps are repeated until the syndromes of the LDPC code are all equal to zero (within a certain degree of precision). As mentioned above, soft symbol estimate is generated within the symbol sequence estimate and symbol node update functional block. This soft output information may be provided to a hard limiter where hard decisions may be made, and that hard information may be provided to a syndrome calculator to determined whether the syndromes of the LDPC code are all equal to zero (within a certain degree of precision). When they are not, a syndrome check failed signal may be provided to the iterative decoding processing functional block (and when it is determined that this decoding iteration is not the last decoding iteration), and the iterative decoding processing continues again by appropriately updating and passing the bit edge messages between the check node update functional block and the symbol sequence estimate and symbol node update functional block. After all of these iterative decoding processing steps have been performed, then the best estimates of the bits are output based on the soft symbol estimates. It is also noted that some additional decisions and/or operations may be implemented when the situation arises where the syndromes of the LDPC code are not converging substantially to zero (within a certain degree of precision) and yet the last decoding iteration has in fact been performed.

This functionality diagrams described above with respect to the FIG. 29 and the FIG. 30 show at least two possible ways in which the hybrid decoding approach may be performed to allow for the decoding of LDPC coded signals using both bit level and symbol level information (e.g., thereby being hybrid). Other possible embodiments are also described below to show how this type of hybrid decoding may be performed.

It is also noted that this functionality (within the FIG. 29 and/or FIG. 30) may be implemented in the logarithmic domain thereby enabling multiplication operations to be performed using addition and division operations to be performed using subtraction. Moreover, many of the calculations may be performed using min* processing as is also described in greater detail below in other of the various embodiments.

With respect to each of the decoding approaches described above within FIG. 22-30, it is noted that any of these decoding approaches may be employed to perform decoding of multi-dimensional space Gray code mapped LDPC coded modulation signals according to the invention. That is to say, any of the various means of performing LDPC decoding may be employed with the exception that the appropriate bit metric needs to be obtained from the originally computed multi-dimensional symbol metric that has been obtained with respect to the multi-dimensional constellation set. That is to say, the symbol metrics that are initially computed (that correspond to the multi-dimensional constellation set) must be decomposed to generate the appropriate bit metrics to allow for decoding with respect to the various bit decoding approaches described above. This is at least one necessary for using the hybrid decoding approach (as the bit metrics are used in conjunction with the symbol metrics).

In the remaining discussion, more detail is provided as how to construct multi-dimensional space Gray code maps for multi-dimensional modulation and how they may be applied to LDPC coded modulation systems. Generally speaking, some more detail is provided by which multi-dimensional space Gray code mapped LDPC coded modulation signals may be generated.

In one possible embodiment that is described in more detail below, a rate 5/6 LDPC coded modulation system with a 2-D (2-dimensional) Gray code map is presented that provides for better performance than LDPC coded modulation systems using a single-dimensional (e.g., 1-D) space Gray code map. Since the core features of the iterative decoding processing that may be employed to decode such multi-dimensional space Gray code mapped LDPC coded modulation signals is similar to that employed with respect to LDPC coded modulation systems using a 1-D space Gray code map, the complexity of LDPC coded modulation decoding of multi-dimensional space Gray code mapped signals only increases slightly (e.g., with respect to the bit metric decomposition from the symbol metrics that accommodate for the 2-D).

Generally speaking, for any dimensional (e.g., m-D space Gray code map), as long as the symbol metrics are appropriately decomposed to bit metrics, then the functionality of any of the various decoding approaches described above may be employed to perform decoding of multi-dimensional space Gray code mapped LDPC coded modulation signals. That is to say, so long as the symbol metrics associated with the m-D space Gray code map used for constructing 2m-D M PSK modulation symbols are appropriately decomposed to bit metrics, then the same decoding functionality employed in any of the various embodiments described above can be used to decode signals that have been generated according to many of the various aspects of the invention.

Various ways by which multi-dimensional constellations may be generated are described below. In general, the principles presented below for some specific examples may be extended to generate any the m-D space Gray code map that may be used for constructing a corresponding 2m-D M PSK modulation.

Figure 31A:
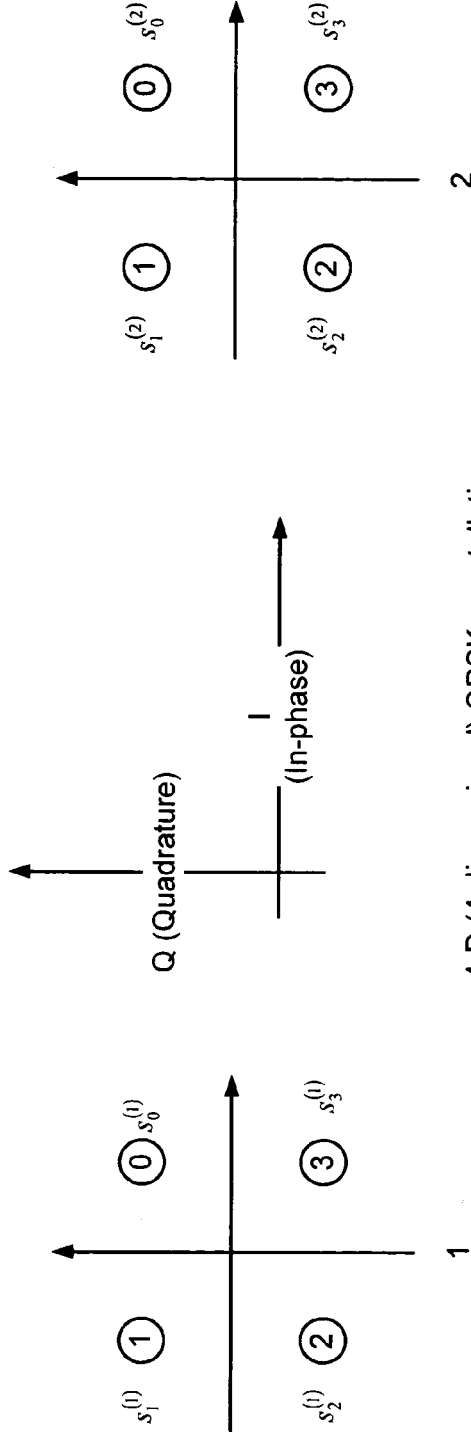
FIG. 31A is a diagram illustrating an embodiment of a 4-D (4-dimensional) QPSK (Quadrature Phase Shift Key) constellation that is constructed according to the invention.

FIG. 31A is a diagram illustrating an embodiment of a 4-D (4-dimensional) QPSK (Quadrature Phase Shift Key) constellation that is constructed according to the invention. This 4-D QPSK constellation embodiment is provided to show the general construction of a 4-D constellation type. The I, Q (In-phase, Quadrature) axes form 2 of the dimensions in a 2-D Euclidean space (I being a first dimension, and Q being a second dimension), which constellation is being referenced (e.g., either the QPSK constellation shape on the left hand side of the diagram of the QPSK constellation shape on the right hand side of the diagram) is a third dimension, and time is the fourth dimension of the 4-D QPSK constellation. For example, a symbol may be formed to include 4 bits. These 4 bits may be decomposed to form 2 sets of 2 bits each. The first set of 2 bits may correspond to the QPSK constellation on the left hand side of the diagram, and the second set of 2 bits may correspond to the QPSK constellation on the right hand side of the diagram.

Each of the constellation points is indexed appropriately. For example, the constellation points on the QPSK constellation on the left hand side of the diagram are indexed as follows:

0 constellation point ($s_0^{(1)}$),
1 constellation point ($s_1^{(1)}$),
2 constellation point ($s_2^{(1)}$), and
3 constellation point ($s_3^{(1)}$).

The constellation points on the QPSK constellation on the right hand side of the diagram are indexed as follows:

0 constellation point ($s_0^{(2)}$),
1 constellation point ($s_1^{(2)}$),
2 constellation point ($s_2^{(2)}$), and
3 constellation point ($s_3^{(2)}$).

The superscript indicates to which constellation (1 for the constellation on the left hand side and 2 for the constellation on the right hand side) the set of bits corresponds, and the subscript indicates which constellation point within that particular constellation. This example shows a very generic manner by which constellation shape may be extended to be support multi-dimensional phase modulation coding. This diagram is provided to show the generic applicability of multi-dimensional phase modulation and the adaptability of it to a variety of constellation shapes.

Many of the other examples and embodiments that are provided below are depicted with respect to using a 4-D 8 PSK modulation type, but it is noted that the multi-dimensional aspects of the invention may be extended to a wide variety of constellation shapes beyond simply 4-D modulation types.

Figure 31B:
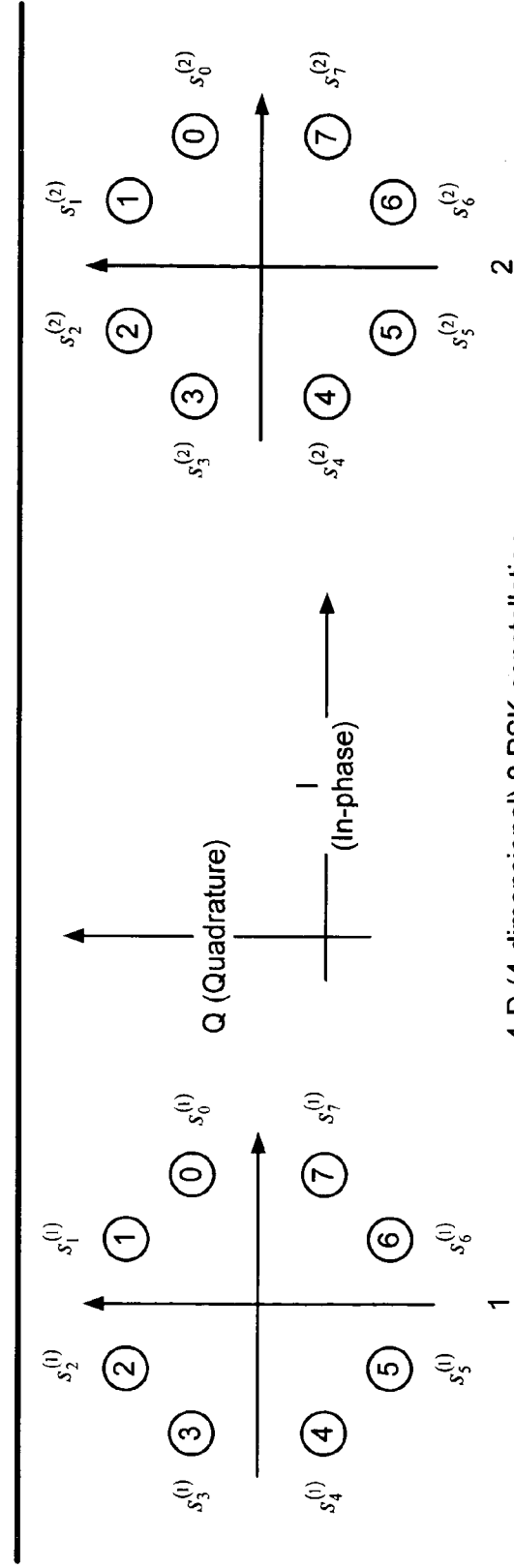
FIG. 31B is a diagram illustrating an embodiment of a 4-D (4-dimensional) 8 PSK (8 Phase Shift Key) constellation that is constructed according to the invention.

FIG. 31B is a diagram illustrating an embodiment of a 4-D (4-dimensional) 8 PSK (8 Phase Shift Key) constellation that is constructed according to the invention. An 8 PSK modulation is shown to have 8 2-D signals in a 2-D Euclidean space. Any such signal may be represented as a 3-tuple binary symbol (e.g., as a 3 bit symbol). Then, in order to represent a 6 bit symbol using this 8 PSK modulation scheme, 2 consecutive 8 PSK constellation signals are needed. These 2 consecutive 8 PSK constellation signals become a 4-D signal. Therefore, this entire modulation scheme is in fact a 4-D modulation scheme.

Each of the constellation points of these 2 8 PSK constellation is indexed. For example, the constellation points on the 8 PSK constellation on the left hand side of the diagram are indexed as follows:

0 constellation point ($s_0^{(1)}$),
1 constellation point ($s_1^{(1)}$),
2 constellation point ($s_2^{(1)}$),
3 constellation point ($s_3^{(1)}$),
4 constellation point ($s_4^{(1)}$),
5 constellation point ($s_5^{(1)}$),
6 constellation point ($s_6^{(1)}$), and
7 constellation point ($s_7^{(1)}$).

The constellation points on the 8 PSK constellation on the right hand side of the diagram are indexed as follows:

0 constellation point ($s_0^{(2)}$),
1 constellation point ($s_1^{(2)}$),
2 constellation point ($s_2^{(2)}$),
3 constellation point ($s_3^{(2)}$),
4 constellation point ($s_4^{(2)}$),
5 constellation point ($s_5^{(2)}$),
6 constellation point ($s_6^{(2)}$), and
7 constellation point ($s_7^{(2)}$).

As with the previous embodiment described above, the superscript indicates to which constellation (1 for the constellation on the left hand side and 2 for the constellation on the right hand side) the set of bits corresponds, and the subscript indicates which constellation point within that particular constellation. This example also shows a very generic manner by which constellation shape may be extended to be support multi-dimensional phase modulation coding.

The constellation signals (each having I, Q components) of the 2 separate 8 PSK constellation sets are provided as follows:

$$S_0^{(v)}, S_1^{(v)}, S_2^{(v)}, S_3^{(v)}, S_4^{(v)}, S_5^{(v)}, S_6^{(v)}, S_7^{(v)}, \text{ where } v=1, 2.$$

Adjacent signals may be represented as being separated by 1 in the subscript notation. For example, $S_j^{(v)}$ is adjacent to $S_{j+1}^{(v)}$, where $(i)_8 = i \mod(8)$. In addition, it is noted that the 4-D 8 PSK constellation set shown within the FIG. 31B may be viewed as having 64 points that may be denoted as follows: $(S_i^{(1)}, S_j^{(2)})$, where $i,j \in \{0,1,2,\ldots,7\}$. Every point $(S_i^{(1)}, s_j^{(2)})$ has 4 adjacent points which may be denoted as follows:

$$(S_{(i-1)_8}^{(1)}, S_j^{(2)}), (S_{(i+1)_8}^{(1)}, S_j^{(2)}), (S_i^{(1)}, S_{(j-1)_8}^{(2)}), (S_i^{(1)}, S_{(j+1)_8}^{(2)}).$$

In fact, it is also noted that these 4 points are the only points that have a minimum Euclidean distance to $(S_i^{(1)}, S_j^{(2)})$ in the 4-D Euclidean space. From certain perspectives, this 64 4-D 8 PSK constellation set may be viewed as being a 64 QAM (64 Quadrature Amplitude Modulation) constellation set with top and bottom edges that are connected together as well as left and right edges.

Figure 32:
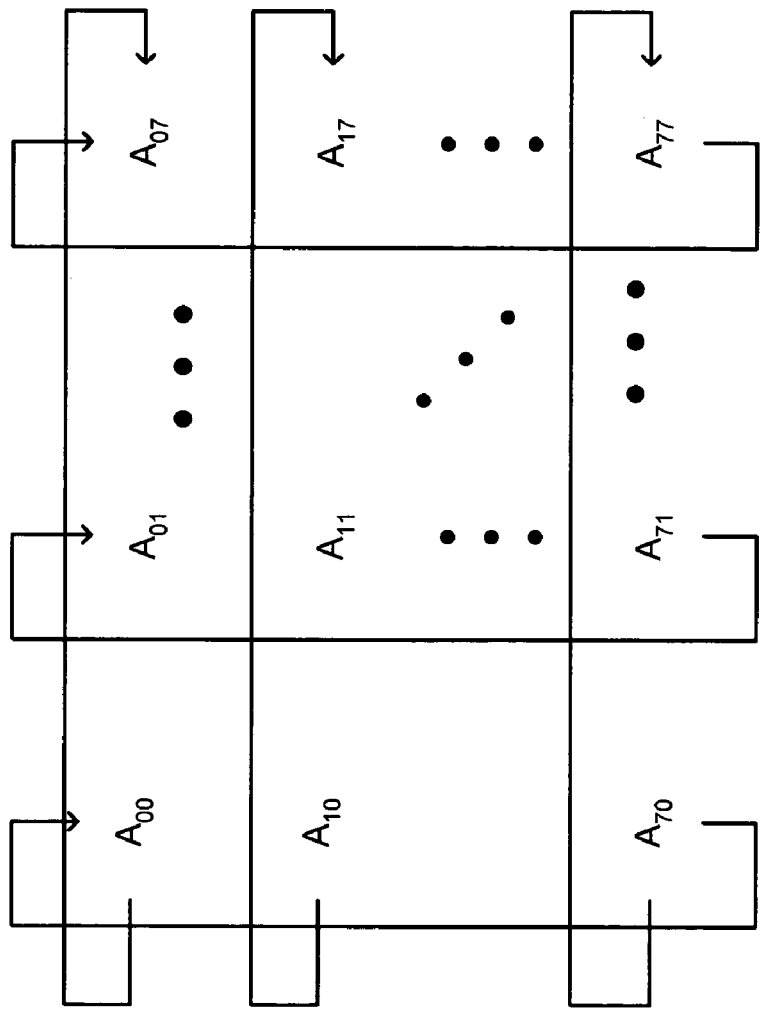
FIG. 32 is a diagram illustrating an alternative representation of the 4-D 8 PSK constellation, shown within FIG. 31B, that is constructed according to the invention.

FIG. 32 is a diagram illustrating an alternative representation of the 4-D 8 PSK constellation, shown within FIG. 31B, that is constructed according to the invention. For example, the top edge of the constellation point, $A_{00}$, is connected to the bottom edge of the constellation point, $A_{70}$. Similarly, the top edge of the constellation point, $A_{01}$, is connected to the bottom edge of the constellation point, $A_{71}$. Analogously, the left edge of the constellation point, $A_{00}$, is connected to the right edge of the constellation point, $A_{07}$, and the left edge of the constellation point, $A_{10}$, is connected to the bottom edge of the constellation point, $A_{17}$. Also, any of the constellation points may be represented using the convention introduced above as shown below:

$$A_{i,j} = (S_i^{(1)}, S_j^{(2)})$$

In general, a 2m-D (2m-dimensional) M PSK modulation scheme (where m and M are integers) with its constellation signals in a 2m-D Euclidean space may be constructed using the principles presented herein. In addition, a 2m-D modulation signal may be denoted as follows:

$A_{s_1, \ldots, s_m}$, where $0 \le s_l \le M-1$ and $0 \le l \le m$. The signal, $A_{s_1, \ldots, s_m}$, has 2m adjacent signals which are shown as follows:

$A_{s_1, \ldots, (s_k-1)_M, \ldots, s_m}$, and $A_{s_1, \ldots, (s_k+1)_M, \ldots, s_m}$, where $k=1, \ldots, m$.

A great deal of description is provided below showing a manner in which a Gray code map may be constructed to support LDPC coded modulation signals that to be mapped using multi-dimensional space Gray code maps. A more compressed description is provided with respect to FIG. 33 as well, and a more thorough description of how to construct Gray code maps to support LDPC coded modulation multi-dimensional space Gray code mapped signals is presented here.

One approach by which a symbol having mn bits (e.g., an mn-tuple binary symbol having mn bits) may be mapped to a 2m-D modulation scheme having $2^n$ constellations signals is, first, to separate the binary symbol into n-bit symbols and then independently map the m symbols to m distinct constellation signals. As mentioned above, this approach has already been presented with respect to TCM (Trellis Coded Modulation) by the Pietrobon et al. reference provided above:

[1] Pietrobon et al.

Pietrobon et al. introduced joint mapping for multi-D modulation based on Euclidean distance. However, for coded modulation employing block codes, this kind of mapping does not work very well to provide for good performance. Specifically, this kind of mapping introduced by Pietrobon et al. does not work very well to provide for good performance for LDPC coded signals.

However, as shown above with respect to variable signal mapping LDPC coded modulation systems, 1-D Gray code mappings work very well to provide for an improved performance over conventional LDPC coding systems. However, certain aspects of the invention are operable to extend and to generalize the principles from 1-D Gray code maps to m-D (multi-dimensional) Gray code maps.

An n-bit Gray code is a scheme for listing all n-bit vectors such that successive elements that differ in exactly one bit as presented in the following reference:

[5] F. Gray, "Pulse code communications," U.S. Pat. No. 2,632,058, March 1953.

That is to say, an n-bit Gray code is a scheme for listing all n-bit vectors such that the Hamming distance, $d_H$, of the any adjacent elements is one. A cycle Gray code is a Gray code such that the first element and the last element also differ in one bit. An example ordered sequence of symbols is provided as follows:

$A_0, \ldots, A_{N-1}$, where $N=2^n$. One example of which would be where all 8 PSK signals with $N=8$.

A cycle Gray code map, G, to this sequence is a map from these N elements to all n-bit vectors such that the mapped sequence, $G(A_0), \ldots, G(A_{N-1})$, is a cycle Gray code. Therefore, for any $i \in \{0, \ldots, N-1\}$, then the Hamming distance, $d_H$, of the two adjacent elements of the mapped sequence is as follows:

$$d_H(G(A_i), G(A_{(i-1)_N})) = d_H(G(A_i), G(A_{(i+1)_N})) = 1 \quad (EQ\ 6)$$

where $(i)_N = i \pmod{N}$.

Since the ordered sequence of symbols, $A_0, \ldots, A_{N-1}$, may be considered as a 1-D sequence, this particular cycle Gray code map may be referred to as a cycle Gray code map. In the remaining discussion, the focus is on cycle Gray code maps, so the term "cycle" is omitted, since all of the Gray code maps of interest are in fact cycle Gray code maps.

An m-D sequence is considered as follows:

$A_{s_1, \ldots, s_m}$, where $0 \leq s_l \leq N-1$, and $0 \leq l \leq m$, where $N=2^n$.

Definition 1

A map $G: \{A_{s_1, \ldots, s_m}\} \to \{0,1\}^{mn}$ is an m-D (m-dimensional) Gray code if:

1. All $2^{mn}$ mn-bit vectors $G(A_{i_1, \ldots, i_m})$ are distinct, i.e., $\{G(A_{s_1, \ldots, s_m}) | 0 \leq s_l \leq N, 1 \leq l \leq m\} = \{0,1\}^{mn}$, therefore the map in one to one and onto (or bijection).

2. For any $(S_1, \ldots, s_m) \in \{0, \ldots, N-1\}^m$ and any $1 \leq k \leq m$ $$d_H(G(A_{s_1, \ldots, s_k, \ldots, s_m}), G(A_{s_1, \ldots, (s_k-1)_N, \ldots, s_m})) = d_H(G(A_{s_1, \ldots, s_k, \ldots, s_m}), G(A_{s_1, \ldots, (s_k+1)_N, \ldots, s_m})) = 1.$$

To present the necessary and sufficient condition of an m-D Gray code map, some additional concept and notations are provided below.

1. Partition: consider a set of M elements $B = \{B_1, \ldots, B_M\}$. A set of its subsets, $\{T_1, \ldots, T_k\}$, is called a partition of the set of M elements B if $$\bigcup_{i=1}^{k} T_i = B$$

and $T_i \cap T_j = \emptyset$ if $i \neq j$.

2. Projection: let $U = \{u_1, \ldots, u_L\}$ be a subset of $\{1, \ldots, K\}$ with $L \leq K$. A projection P of a K-bit vector $v = (v_1, \ldots, v_K)$ onto L-dimensional binary space with respect to U is defined by $P(v, U) = (v_{u_1}, \ldots, v_{u_L})$.

3. N-adic integer ring: let $Z_N = \{0, 1, \ldots, N-1\}$ be a N-adic integer ring with addition, subtraction, and multiplication all carried out under mod(N). Consider an m-D space, $Z_N^m$. An elementary vector may be defined as, $E_i = (0, \ldots, 0, 1, 0, \ldots, 0)$, with 1 in the position i and $0 \leq i \leq m$. Then for any integer $\mu \in Z_N$ $$\mu E_i = (0, \ldots, 0, \mu, 0, \ldots, 0) \quad (EQ\ 7)$$

Moreover, every element $(s_1, \ldots, S_m) \in Z_N^m$ can be represented as follows:

$$(s_1, \ldots, s_m) = \sum_{i=1}^{m} s_i E_i \quad (EQ\ 8)$$

The following theorem may be employed subsequently to allow the generation of the Gray code maps that may be employed when generating LDPC coded modulation signals that to be mapped using those multi-dimensional space Gray code maps.

Theorem 1 Let G be a map of $A_{s_1, \ldots, s_m}$, $s_i \in \{0, \ldots, 2^n - 1\}$ to an n-bit vector. G is an m-D Gray code map if and only if there exists a partition of the set $\{1, 2, \ldots, nm\}$ into m sets, $T_1, \ldots, T_m$, with $|T_1| = |T_2| = \ldots |T_m| = n$ such that for any $k \in \{1, \ldots, m\}$ $$P(G(A_0), T_k), P(G(A_{E_k}), T_k), P(G(A_{2E_k}), T_k), \ldots, P(G(A_{2^n-1)E_k}), T_k), \quad (EQ\ 9)$$

is a 2-D n-bit Gray code, where $A_0 = A_{0, \ldots, 0}$; and if $j \neq k$ $$P(G(A_0), T_j) = P(G(A_{E_k}), T_j) = \ldots = P(G(A_{(2^n-1)E_k}), T_j), \quad (EQ\ 10)$$

moreover, for any $(s_1, \ldots, s_m) \in Z_{2^n}^m$ $$G(A_{s_1, \ldots, s_m}) = \left(\frac{1 + (-1)^m}{2}\right) G(A_0) + \sum_{k=1}^{m} G(A_{s_k E_k}) \quad (EQ\ 11)$$

That is to say, the Gray code map, $G(A_{s_1, \ldots, s_m})$, may be generated by using the map of the zero vector, $G(A_0)$, and the sums of the maps of the elementary vector, $G(A_{s_k E_k})$.

The proof of the Theorem 1 is supplied here. In the following, N may be denoted as $2^n$ (e.g., $N = 2^n$).

A sufficient condition is as follows: if G satisfies the condition given in the theorem then 1. It is assumed that there exist two distinct vectors, $(s_1, \ldots, s_m), (t_1, \ldots, t_m) \in Z_N^m$, with $s_j \neq t_j$ for some j, such that $G(A_{s_1, \ldots, s_m}) = G(A_{t_1, \ldots, t_m})$. Then by EQ 11 shown above, the following relationship may be made.

$$\sum_{i=1}^{m} G(A_{s_i E_i}) = \sum_{i=1}^{m} G(A_{t_i E_i})$$

This relationship then implies the following:

$$\sum_{k=1}^{m} P(G(A_{s_k E_k}), T_k) = \sum_{k=1}^{m} P(G((A_{t_i E_i}), T_k)), \text{ for } k \in \{1, \ldots, m\} \quad \text{(EQ 12)}$$

On the other hand, by EQ 12 above, $$P(G(A_{s_k E_k}), T_j) = P(G(A_{t_k E_k}), T_j) \text{ if } k \neq j$$

Thus, EQ 12 becomes the following:

$$P(G(A_{s_j E_j}), T_j) = P(G(A_{t_j E_j}), T_j). \quad \text{(EQ 13)}$$

Since $s_j \neq t_j$, then EQ 14 contradicts the condition of EQ 9 which states that $P(G(A_{s_j E_j}), T_j)$ and $P(G(A_{t_j E_j}), T_j)$ are two distinct elements in a 1-D n-bit Gray code. This proves the following relationship:

$$G(A_{s_1, \ldots, s_m}) \neq G(A_{t_1, \ldots, t_m}) \text{ if } (s_1, \ldots, s_m) \neq (t_1, \ldots, t_m).$$

2. Let $(S_1, \ldots, s_m) \in Z_N^m$ and $1 \leq k \leq m$. With EQ 11 the following relationship is provided.

$$G(A_{s_1, \ldots, s_k, \ldots, s_m}) + G(A_{s_k E_k}) = G(A_{s_1, \ldots, (s_k-1)_N, \ldots, s_m}) + G(A_{(s_k-1)_N E_k}).$$

Thus $$d_H(G(A_{s_1, \ldots, s_k, \ldots, s_m}), G(A_{s_1, \ldots, (s_k-1)_N, \ldots, s_m})) = d_H(G(A_{s_k E_k}), G(A_{(s_k-1)_N E_k})) \quad \text{(EQ 14)}$$

Substituting EQ 10 to this EQ 14, then the following relationship can be made:

$$d_H(G(A_{s_1, \ldots, s_k, \ldots, s_m}), G(A_{s_1, \ldots, (s_k-1)_N, \ldots, s_m})) = d_H(P(G(A_{s_k E_k}), T_k), P(G(A_{(s_k-1)_M E_k}), T_k)) = 1 \quad \text{(EQ 15)}$$

since $P(G(A_{s_k E_k}), T_k)$, $P(G(A_{(s_k-1)_M E_k}), T_k)$ are two adjacent elements in the 1-D Gray code. Similarly, it may also be proven that:

$$d_H(G(A_{s_1, \ldots, s_k, \ldots, s_m}), G(A_{s_1, \ldots, (s_k+1)_N, \ldots, s_m})) = 1 \quad \text{(EQ 16)}$$

The conclusions provided above with respect to 1. and 2. prove that G is an m-D Gray code map.

A necessary condition is also described as follows:

Suppose that G is an m-D Gray code map. Then, for any $k \in \{1, \ldots, m\}$ the adjacent elements of $G(A_0), G(A_{E_k}), \ldots, G(A_{(N-1)E_k})$ differ in exactly one bit. A mn-bit elementary vector may be defined as follows:

$$e_i = (0, \ldots, 0, 1, 0, \ldots, 0) \quad \text{(EQ 17)}$$

where 1 is in the position $k \in \{1, \ldots, mn\}$. Then, for any $k \in \{1, \ldots, m\}$ there exists N-1 elementary vectors, $e_{i_1}^{(k)}, \ldots, e_{i_{N-1}}^{(k)}$, such that $$G(A_{s_k E_k}) = G(A_0) + \sum_{l=0}^{s} e_{i_l}^{(k)}, \text{ where } s \in Z_N / \{0\} \quad \text{(EQ 18)}$$

where $A_0 = A_{0, \ldots, 0}$. All of the binary zero vectors may be defined as $e_{i_0}^{(k)} = (0, \ldots, 0)$ for any k. EQ 18 now may be expressed as follows:

$$G(A_{s_k E_k}) = G(A_0) + \sum_{l=0}^{s} e_{i_l}^{(k)}, \text{ where } s \in Z_N \quad \text{(EQ 19)}$$

It may now be asserted that for any $(s_1, \ldots, s_m) \in Z_N^m$, the following relationship holds true:

$$G(A_{s_1, \ldots, s_m}) = G(A_0) + \sum_{k=1}^{m} \left( \sum_{l=0}^{s_k} e_{i_l}^{(k)} \right) \quad \text{(EQ 20)}$$

This assertion may be proven using induction as described below:
1. when $(s_1, \ldots, s_m) = sE_k$, then EQ 19 implies EQ 20.
2. consider a vector, $(s_1, \ldots, s_m) \in Z_N^m$, with at least two non-zero components. Without loss of generality, it is supposed that $s_1 \neq 0$ and $s_2 \neq 0$.
   2.1 it is assumed that EQ 20 is true for $G(A_{t_1, s_2, \ldots, s_m})$ and $G(A_{s_1, t_2, \ldots, s_m})$ with any $t_1 < s_1$ and any $t_2 < s_2$.
   2.2 using the assumption provided above within 2.1, then the following relationships may be made:

$$G(A_{s_1-1, s_2, \ldots, s_m}) = G(A_0) + \sum_{l=0}^{s_1-1} e_{i_l}^{(1)} + \sum_{l=0}^{s_2} e_{i_l}^{(2)} + \sum_{k=3}^{m} \left( \sum_{l=0}^{s_k} e_{i_l}^{(k)} \right) \quad \text{(EQ 21)}$$

$$G(A_{s_1, s_2-1, \ldots, s_m}) = G(A_0) + \sum_{l=0}^{s_1} e_{i_l}^{(1)} + \sum_{l=0}^{s_2-1} e_{i_l}^{(2)} + \sum_{k=3}^{m} \left( \sum_{l=0}^{s_k} e_{i_l}^{(k)} \right) \quad \text{(EQ 22)}$$

However, since $G(A_{s_1-1, s_2, \ldots, s_m}) \neq G(A_{s_1, s_2-1, \ldots, s_m})$, then EQ 21 and EQ 22 imply the following:

$$e_{i_{s_1}}^{(1)} \neq e_{i_{s_2}}^{(2)} \quad \text{(EQ 23)}$$

Since $A_{s_1-1, s_2, \ldots, s_m}$ and $A_{s_1, s_2, \ldots, s_m}$ are adjacent as well as $A_{s_1, s_2-1, \ldots, s_m}$ and $A_{s_1, s_2, \ldots, s_m}$, there exist two elementary vectors, $e_a$ and $e_b$, such that $$G(A_{s_1-1, s_2, \ldots, s_m}) + e_a = G(A_{s_1, s_2, \ldots, s_m}) = G(A_{s_1, s_2-1, \ldots, s_m}) + e_b \quad \text{(EQ 24)}$$

Thus, $e_{i_{s_1}}^{(1)} + e_b = e_{i_{s_2}}^{(2)} + e_a$, and by using EQ 21 and EQ 22 as well as EQ 24, this induces the following: $e_a \neq e_b$ (per EQ 23).

Therefore, the following relationship is supported:
either $e_{i_{s_1}}^{(1)} = e_a$ or $e_{i_{s_2}}^{(2)} = e_a$ If it is assumed that $e_{i_{s_1}}^{(2)} = e_a$, then by EQ 24 and by the assumption provide above with respect to 2.1, then the following relationship may be made:

$$G(A_{s_1, \ldots, s_m}) = G(A_{s_1-1, s_2, \ldots, s_m}) + e_{i_{s_2}}^{(2)} \quad \text{(EQ 22)}$$

$$= G(A_0) + \sum_{l=0}^{s_1-1} e_{i_l}^{(1)} + \sum_{l=0}^{s_2} e_{i_l}^{(2)} + \sum_{k=3}^{m} \left( \sum_{l=0}^{s_k} e_{i_l}^{(k)} \right)$$

$$G(A_{s_1, \ldots, s_m}) = G(A_{s_1-1, s_2-1, \ldots, s_m})$$

This relationship, however, contradicts the definition of an m-D Gray code map. Thus, $e_{i_{s_1}}^{(1)} = e_a$. This conclusion may be combined with the conclusions of EQ 21 and EQ 24 to provide the following relationship:

$$G(A_{s_1,s_2,\ldots,s_m}) = G(A_{s_1,s_2-1,\ldots,s_m}) + e_{i_{s_1}}^{(1)} \qquad \text{(EQ 26)}$$

$$= G(A_0) + \sum_{k=1}^{m}\left(\sum_{l=0}^{s_k} e_{i_l}^{(k)}\right)$$

This is the end of the induction proof.

If EQ 19 is substituted into EQ 20, then the following relationship may be provided:

$$G(A_{s_1,s_2,\ldots,s_m}) = \left(\frac{1+(-1)^m}{2}\right)G(A_0) + \sum_{i=1}^{m} G(A_{s_i E_i})$$

which provides the final part of the necessary condition described above.

To prove the first two parts of the necessary condition, the following two sets of elementary vectors may be considered: $\{e_{i_1}^{(j)},\ldots,e_{i_{N-1}}^{(j)}\}$ and $\{e_{i_1}^{(k)},\ldots,e_{i_{N-1}}^{(k)}\}$ with $j \ne k$. If there exists $s,t \in Z_N/\{0\}$ such that $e_{i_s}^{(j)} = e_{i_t}^{(j)}$ then by EQ 20, the following relationship may be made:

$$G(A_{sE_j+tE_k}) = G(A_0) + \sum_{l=0}^{s} e_{i_l}^{(j)} + \sum_{l=0}^{t} e_{i_l}^{(k)} \qquad \text{(EQ 27)}$$

$$= G(A_0) + \sum_{l=0}^{s-1} e_{i_l}^{(j)} + \sum_{l=0}^{t-1} e_{i_l}^{(k)}$$

$$= G(A_{(s-1)E_j+(t-1)E_k})$$

However, this relationship also contradicts the definition of an m-D Gray code map. Thus, $$\{e_{i_1}^{(j)},\ldots,e_{i_{N-1}}^{(j)}\} \cap \{e_{i_1}^{(k)},\ldots,e_{i_{N-1}}^{(k)}\} = \emptyset, \text{ when } j \ne k \qquad \text{(EQ 28)}$$

Therefore, the m sets, $\{e_{i_1}^{(k)},\ldots,e_{i_{N-1}}^{(k)}\}$, where $l=1,\ldots,m$, are mutual disjoint.

Although every set, $\{e_{i_1}^{(k)},\ldots,e_{i_{N-1}}^{(k)}\}$, has N-1 elementary vectors, these N-1 elementary vectors may not be distinct. When $n=1$ (N-1=1), the set of elementary vectors only has $n=1$ element. When considering the situation where $n>1$, it may then be assumed that among m mutual disjoint elementary vector sets, there is a set having more than n distinct elements. Then there is another set, e.g., $\{e_{i_1}^{(j)},\ldots,e_{i_{N-1}}^{(j)}\}$, which has at most n-1 distinct elements since there are a total of nm distinct elementary vectors.

Thus, the $2^n-1$ vectors, $$e_{i_l}^{(j)}, \sum_{l=1}^{2} e_{i_l}^{(j)}, \ldots, \sum_{l=1}^{N-1} e_{i_l}^{(j)}$$

(which are in a subspace generated by those n-1 distinct elementary vectors) has at most $2^{n-1} < 2^n - 1 < N-1$ distinct vectors. Therefore, there are at least two vectors among $$e_{i_l}^{(j)}, \sum_{l=1}^{2} e_{i_l}^{(j)}, \ldots, \sum_{l=1}^{N-1} e_{i_l}^{(j)}$$

that are equal.

This conclusion, along with the relationship provided with respect to EQ 19, implies that there are two equal vectors among the following: $G(A_{E_j}),\ldots,G(A_{(N-1)E_j})$.

However, this relationship also contradicts the definition of an m-D Gray code map. Therefore, every set, $\{e_{i_1}^{(k)},\ldots,e_{i_{N-1}}^{(k)}\}$, has exactly n distinct elements. This set of distinct elementary vectors may be denoted as $V_k$. The following relationship may then be made:

$$\bigcup_{k=1}^{m} V_k = \{e_1, e_2, \ldots, e_{mn}\}, \text{ and } V_k \cap V_j = \emptyset, \text{ if } j \ne k \qquad \text{(Eq 29)}$$

Moreover, the sum of the following elementary vectors, $$\sum_{l=0}^{s} e_{i_l}^{(k)},$$

is in the space $\langle V_k \rangle$ (a binary subspace by $V_k$) and $$\bigcup_{k=1}^{m} \langle V_k \rangle = \{0,1\}^{mn}, \text{ and } \langle V_j \rangle \cap \langle V_k \rangle = \{0\}, \text{ if } j \ne k \qquad \text{(EQ 30)}$$

The set of distinct elementary vectors, $V_k$, may be denoted as follows:

$V_k = \{e_{i_{k,1}},\ldots,e_{i_{k,n}}\}$ and $T_k = \{i_{k,1},\ldots,i_{k,n}\}$. Then, by EQ 29, $T_1,\ldots,T_m$ is a partition of the set $\{1,2,\ldots,mn\}$ with $|T_k|=n$. Moreover, since $$P(G(A_{sE_k}),T_j) = P\left(G(A_0) + \sum_{l=0}^{s} e_{i_j}^{(k)}, T_j\right) \in \langle V_j \rangle \text{ and } \sum_{l=0}^{s} e_{i_l}^{(k)} \in \langle V_k \rangle,$$

then the following relationship may be made:

$$P(G(A_{sE_k}),T_j) = P(G(A_0),T_j), \text{ if } j \ne k. \qquad \text{(EQ 31)}$$

This proves the part 2. of the proof provided for the sufficient condition of Theorem 1 shown above.

In addition, EQ 31 also implies that the nm-tuple binary vectors $G(A_0), G(A_{E_k}),\ldots,G(A_{(N-1)E})$ have the same values at position, $$\bigcup_{j \ne k} T_j.$$

With the conclusion and the fact that $d_H(G(A_{sE_k}), G(A_{(s+1)_N E_k})) = 1$ for $S \in Z_N$ given by the definition of m-D Gray code maps, it may then be concluded that the following is in fact a 1-D n-bit Gray code map.

$$P(G(A_0), T_k), P(G(A_{E_k}), T_k), P(G(A_{2E_k}), T_k), \ldots, P(G(A_{(M-1)E_k}), T_k)$$

This proves the part 1. of the proof provided for the sufficient condition of Theorem 1 shown above.

It is also noted that the Theorem 1 provided above may be implemented to present a method to generate all of the possible m-D Gray code maps for any 2m-D M PSK modulation. This is illustrated and described below with respect to the following diagram.

Figure 33:
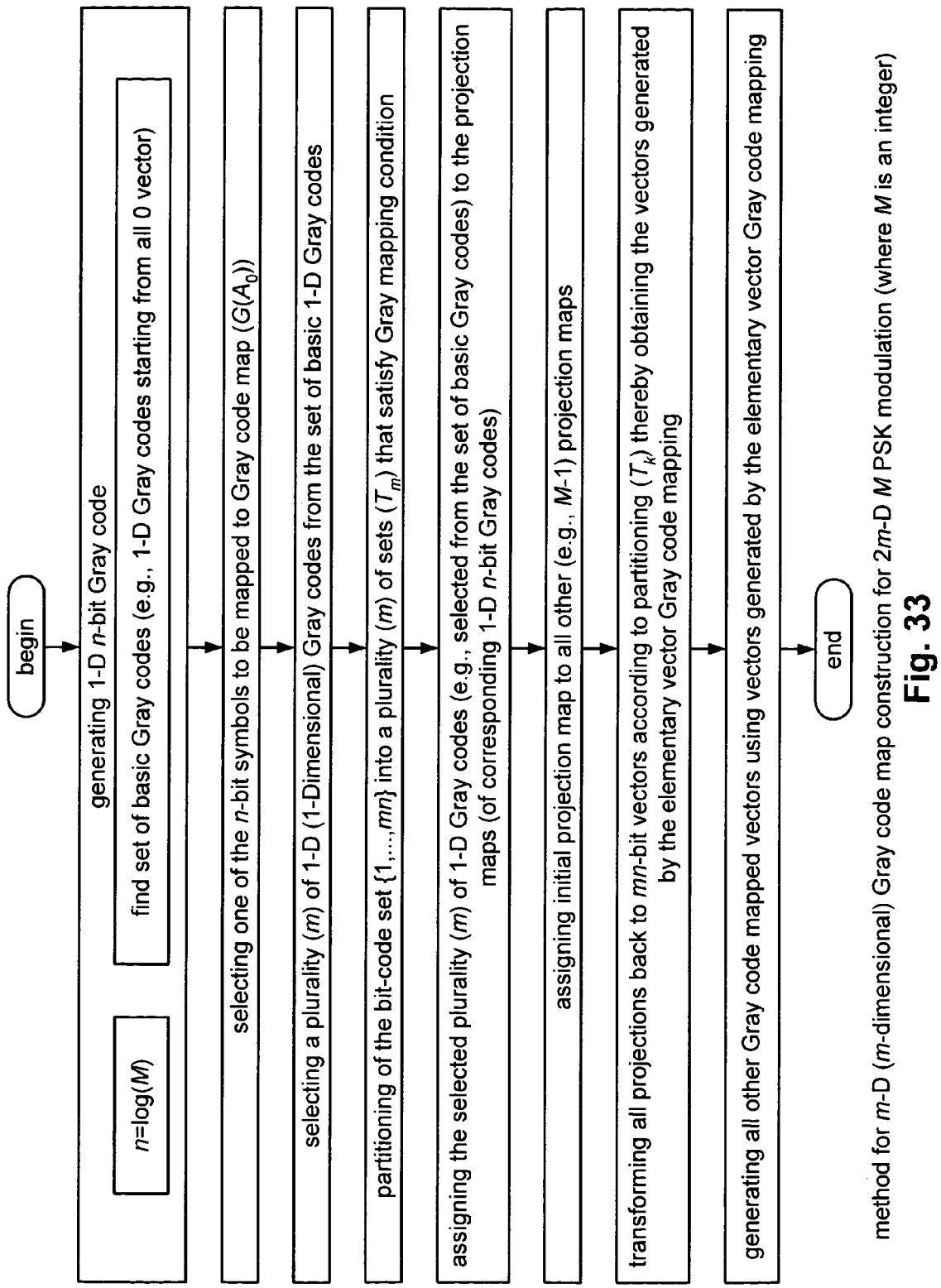
FIG. 33 is a flowchart illustrating an embodiment of a method for m-D (m-dimensional) Gray code map construction for 2m-D M PSK modulation (where m and M are integers) according to the invention.

FIG. 33 is a flowchart illustrating an embodiment of a method for m-D (m-dimensional) Gray code map construction for 2m-D M PSK modulation (where m and M are integers) according to the invention. The method initially involves generating a 1-D n-bit Gray code. This may be performed using any of a variety of means, including that which is described within the above mentioned reference:

[6] W. H. Press, S. A. Teukolsky, W. T. Vetterling and B. P. Flannery, "Chapter 20," *Numerical Recipes in C, The art of scientific computing*, Cambridge University, 1992.

Regardless of the manner in which the 1-D n-bit Gray code is generated, the number of bits within the Gray code (e.g., n) meets the following relationship.

n=$\log_2$(M), logarithm of M using log base 2. In other words, n is equal to the base 2 logarithm of M.

From a plurality of available 1-D n-bit Gray codes, one of the 1-D n-bit Gray codes may be found such that it starts from the 0 valued vector. Gray codes meeting this condition may be referred to as basic Gray codes.

The method then continues by selecting a given n-bit to be mapped according to the mapping of $G(A_0)$; this mapping may be referred to as a cycle Gray code map. The method then continues by selecting a plurality (m) of 1-D Gray codes from the set of basic 1-D Gray codes. The method then involves partitioning of the bit code set $\{1, \ldots, mn\}$ into a plurality (m) of sets $T_1, \ldots, T_m$ that satisfy the Gray code mapping condition (e.g., as described above with respect to Theorem 1).

The method then proceeds to assign the selected plurality (m) of basic Gray 1-D Gray codes to the projection maps (of the corresponding 1-D n-bit Gray codes) as indicated in the following:

$$P(G(A_0), T_k), P(G(A_{E_k}), T_k), P(G(A_{2E_k}), T_k), \ldots, P(G(A_{(M-1)E_k}), T_k) \quad \text{(EQ32)}$$

where k=1, ..., m. The initial projection term, $P(G(A_0), T_k)$, may not be the real projection portion of the mapping of $G(A_0)$ if $G(A_0)$ is not an all 0 valued vector. In the instance that the initial projection term, $P(G(A_0), T_k)$, is in fact the real projection portion of the mapping, $G(A_0)$, then the projection vector elements shown above within EQ 32 should each be modified by adding (in binary addition) the real portion of the initial projection term, $P(G(A_0), T_k)$, to every vector therein.

The method then continues by assigning the initial projection, $P(G(A_0), T_j)$, indexed by j, to all of the other projection maps (e.g., to all M-1 projection maps). This may be shown mathematically as follows:

$$P(G(A_{E_k}), T_j), \ldots, P(G(A_{(M-1)E_k}), T_j), \text{ for all } j \neq k.$$

The method then involves transforming all of the projections back to mn-bit vectors according to the partitioning $(T_k)$. In doing this, the vectors generated by the elementary vector Gray code mapping may be generated; that is to say, the vectors, $G(A_{s_k E_k})$, may be generated for k=1, ..., m and for $s \in Z_M$. Then, the method involves generating all of the other Gray code mapped vectors using the vectors generated by the elementary vector Gray code mapping as described with respect to EQ 11.

$$G(A_{s_1, \ldots, s_m}) = \left(\frac{1+(-1)^m}{2}\right) G(A_0) + \sum_{k=1}^{m} G(A_{s_k E_k}) \quad \text{(EQ 11)}$$

For example, once the vectors, $G(A_{s_k E_k})$, have been generated, and once the mapping of $G(A_0)$ is available, then the remaining Gray code mapped vectors, $G(A_{s_1, \ldots, s_m})$, may all be generated.

Once the Gray code mapping is provided for use in m-D (e.g., multi-dimensional) phase modulation, then it may be applied to LDPC coding to provide for higher performance than is provided by 1-D Gray code mapping. In general, this principle of multi-dimensional Gray code maps, as provided by various aspects of the invention, may be applied to LDPC coding of any code rates. Some of the following examples are provided wherein a rate 5/6 LDPC code is employed. However, some general description is initially provided before further illustrating any particular and specific example.

Figure 34:
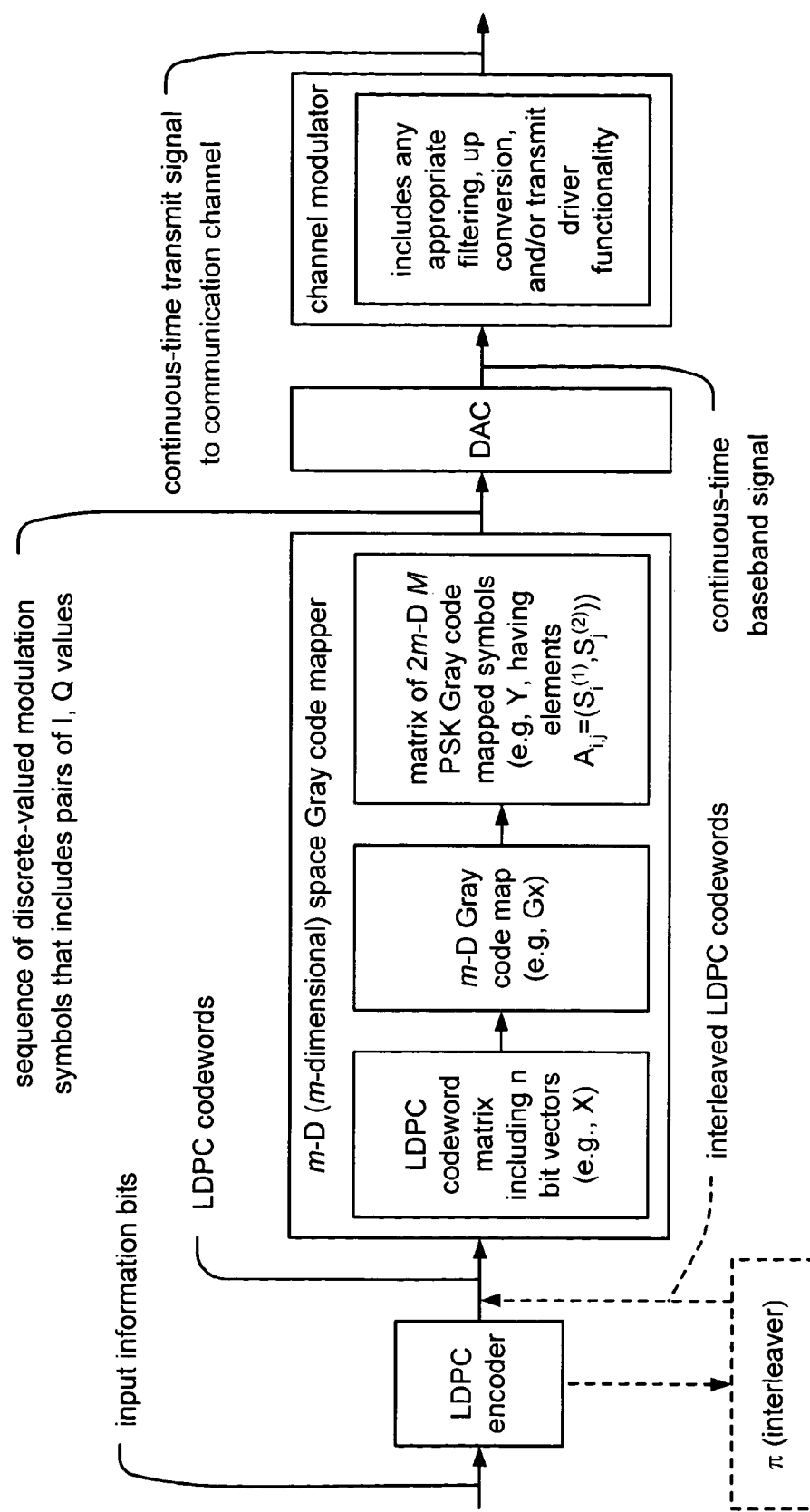
FIG. 34 is a diagram illustrating an embodiment of functionality of LDPC coded modulation encoding with multi-dimensional space Gray code maps according to certain aspects of the invention.

FIG. 34 is a diagram illustrating an embodiment of functionality of LDPC coded modulation encoding with multi-dimensional space Gray code maps according to certain aspects of the invention. This diagram shows very generally the functionality that is employed to generate a multi-dimensional space Gray code mapped LDPC coded modulation signal.

Initially, input information bits are provided to an LDPC encoder to generate an LDPC codeword, that includes a plurality of LDPC coded bits, from which a plurality of symbols are formed. In some instances, the LDPC coded bits of the LDPC codeword are passed through an π (interleaver) such that the LDPC coded bits of the LDPC codeword are arranged in a particular, predetermined manner to form the plurality of symbols. In whichever embodiment is performed, the LDPC coded bits of the at least one LDPC codeword are arranged into a number of symbols such that each symbol has a predetermined number (n) of bits. These symbols may be viewed as being n bit vectors as well.

These symbols are passed to a multi-dimensional (m-D or m-dimensional) space Gray code mapper from which a sequence of discrete-valued modulation symbols that includes pairs of I, Q values is output. At this point, the sequence of discrete-valued modulation symbols may be viewed as being digital data representative of the pairs of I, Q values of the multi-dimensional symbols generated by the m-D space Gray code mapper. The m-D space Gray code mapper transforms the at least one LDPC codeword via an m-D Gray code map to generate a matrix of m-D (m-dimensional) M PSK Gray code mapped symbols. An LDPC codeword matrix including n bit vectors is operated upon within the m-D space Gray code mapper. In a later embodiment, this LDPC codeword matrix including n bit vectors is represented as X. This matrix, X, is mapped using a m-D Gray code map to generate a matrix of 2m-D M PSK Gray code mapped symbols. Again, in a later embodiment, this m-D Gray code map is depicted as being, Gx, and the matrix of 2m-D M PSK Gray code mapped symbols is depicted as being, Y. This matrix, Y, has the elements that may be depicted using the convention provided above, $A_{i,j} = (S_i^{(1)}, S_j^{(2)})$.

These 2m-D M PSK Gray code mapped symbols are output from the multi-dimensional space Gray code mapper according to a predetermined order to generate the sequence of discrete-valued modulation symbols. That is to say, the sequence of discrete-valued modulation symbols is composed of the elements of the matrix of 2m-D M PSK Gray code mapped symbols output according to a predetermined order. This sequence of discrete-valued modulation symbols represented as pairs of I, Q values that is output from the m-D space Gray code mapper is thereafter provided to a DAC (Digital to Analog Converter) that inserts the individual symbols of the sequence of discrete-valued modulation symbols at a modulation rate (e.g., typically a baseband frequency signal rate) to generate a continuous-time baseband signal. If necessary, the continuous-time baseband signal is passed through a channel modulator that is operable to comport the continuous-time baseband signal into a format that is compatible with the communication channel into which the signal is to be launched. This channel modulator may be operable to perform any appropriate filtering, up conversion (e.g., with respect to frequency), and/or transmit driving (including any amplification) that is necessary to comport the continuous-time baseband signal into a format that is compatible with the communication channel. This signal that is launched into the communication channel may be characterized as being a continuous-time transmit signal.

Figure 35:
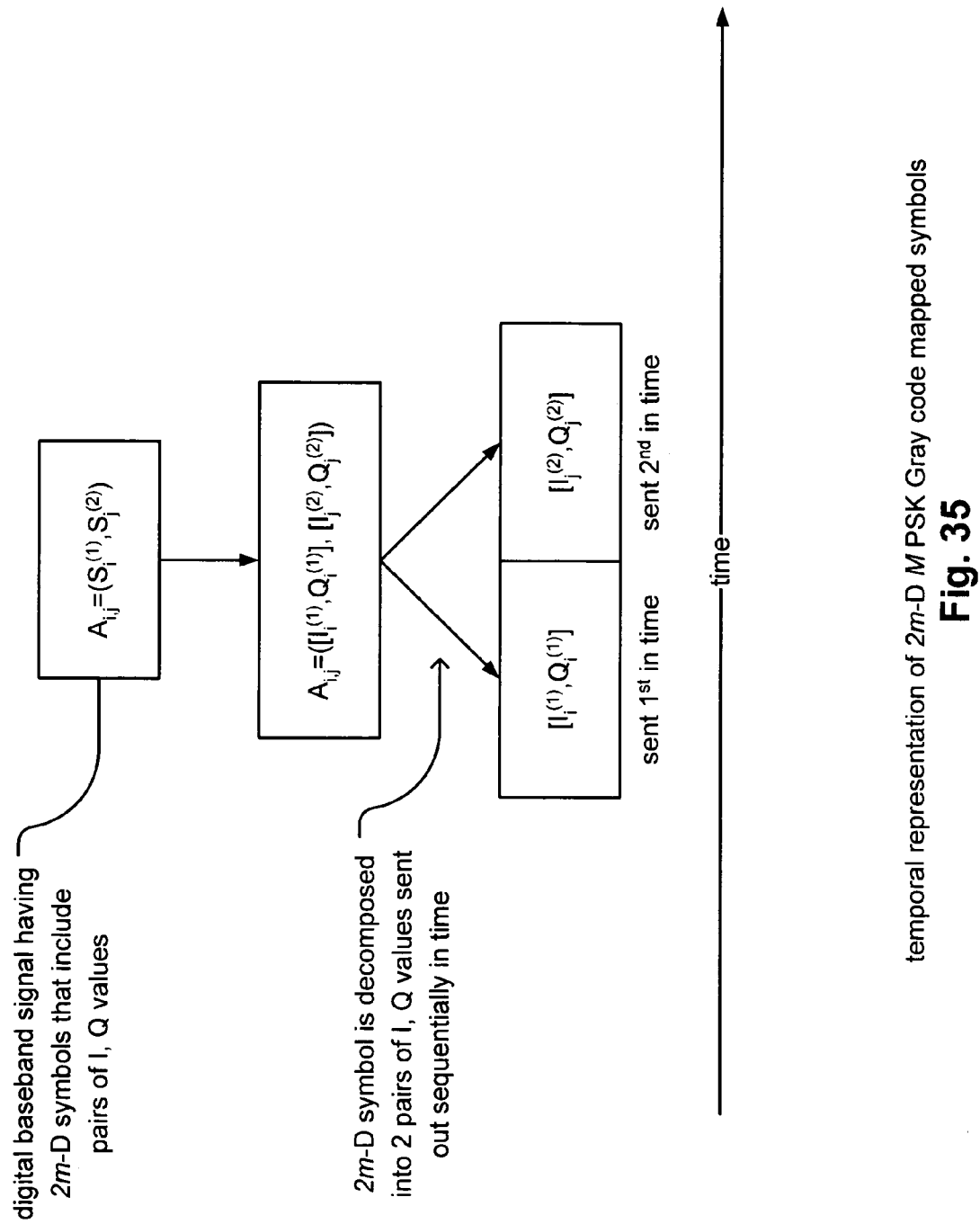
FIG. 35 is a diagram illustrating an embodiment of temporal representation of 2m-D M PSK Gray code mapped symbols according to certain aspects of the invention.

FIG. 35 is a diagram illustrating an embodiment of temporal representation of 2m-D M PSK Gray code mapped symbols according to certain aspects of the invention. This diagram shows the representation of the individual symbols within the matrix of 2m-D M PSK Gray code mapped symbols, that may be depicted as $A_{i,j}=(S_i^{(1)}, S_k^{(2)})$. Again, this matrix of 2m-D M PSK Gray code mapped symbols may be depicted as being, Y. An individual symbol, $A_{i,j}=(S_i^{(1)}, S_j^{(2)})$, within this matrix of 2m-D M PSK Gray code mapped symbols may be viewed as being a pair of I, Q values as follows:

$$A_{i,j}=(S_i^{(1)}, S_j^{(2)})=([I_i^{(1)}, Q_i^{(1)}], [I_j^{(2)}, Q_j^{(2)}]).$$

In other words, the symbol, $A_{i,j}$, may be represented as including two separate symbols arranged temporally (e.g., one is provided $1^{st}$ in time, and another is provided $2^{nd}$ in time). In other words, the symbol $([I_i^{(1)}, Q_i^{(1)}])$ is sent out $1^{st}$ in time, and the symbol $([I_j^{(2)}, Q_j^{(2)}])$ is sent out $2^{nd}$ in time.

As mentioned above, some of the various examples provided herein are provided with respect to a rate 5/6 LDPC code. The examples depicted with respect to the FIG. 36A, FIG. 36B, FIG. 37, and FIG. 41 all operate with respect to such a rate 5/6 LDPC code.

Figure 36A:
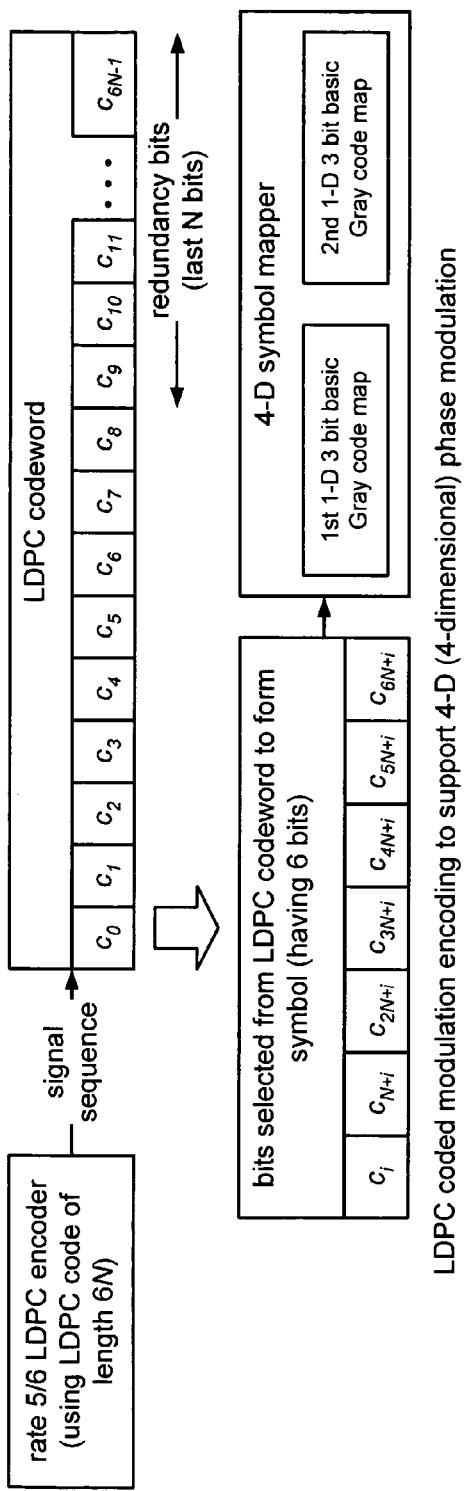
FIG. 36A is a diagram illustrating an embodiment of LDPC coded modulation encoding to support 4-D (4-dimensional) phase modulation according to the invention.

FIG. 36A is a diagram illustrating an embodiment of LDPC coded modulation encoding to support 4-D (4-dimensional) phase modulation according to the invention. as mentioned above, these embodiments employ a rate 5/6 LDPC code. In addition, these embodiments employ a combined 8 PSK coded modulation with the rate 5/6 LDPC code using a 2-D Gray code map. However, again, this approach may be generalized to all other M PSK (where M is an integer) coded modulation with any higher code rate LDPC codes as well without departing from the scope and spirit of the invention.

One approach by which a rate 5/6 LDPC code with an 8 PSK modulation is to group every 3 bits of a codeword together to form 3 bit symbols; these 3 bit symbols are then the appropriate constellation points within a 1-D 3-bit Gray code map. However, as described above with respect to variable signal mapping LDPC coded modulation systems, the use of more than one Gray code map (e.g., the variable signal mapping LDPC coded modulation system of FIG. 21) to map different symbols (e.g., different n-bit symbols) based on the bit in the bipartite graph of the LDPC code is yet another way in which this may be done. However, in the instance where the variable signal mapping LDPC coded modulation system operates on 3-bit symbols, then this may present some difficulty to a rate 5/6 LDPC code since this coding approach is uneven; that is to say, some of the 3 bits symbols may contain redundancy information and some may not.

In one approach by which this may be avoided, a new approach is presented such that 6 bits of an LDPC codeword are grouped to form a symbol with one redundancy bit in every symbol. This may be better understood pictorially by viewing FIG. 36A. A rate 5/6 LDPC encoder, using a code of length 6N) is employed to generate a signal sequence that include an LDPC codeword shown as having bits, $(c_0, c_1, c_2, \ldots, c_{6N-1})$. The redundancy bits are the last N bits of this codeword. From the LDPC codeword, $(c_0, c_1, c_2, \ldots, c_{6N-1})$, the bits, $c_i, c_{N+i}, c_{2N+i}, c_{3N+i}, c_{4N+i}, c_{5N+i}$, are selected there from to form a symbol having 6 bits. This 6 bit symbol, $c_i$, $c_{N+i}, c_{2N+i}, c_{3N+i}, c_{4N+i}, c_{5N+i}$, is then mapped according to a 4-D 8 PSK modulation using a 2-D Gray code map. To construct the 2-D Gray code map, the process may begin by identifying two 1-D basic Gray code maps for 8 PSK modulation. Analogously, as described with respect to the method of FIG. 33, the method begins by generating a 1-D n-bit Gray code; in this instance, n=3.

This approach continues by partitioning the set of 6 bit groups, $\{1,2,3,4,5,6\}$, into two sets (e.g., $T_1=\{1,2,5\}$ and $T_2=\{3,4,6\}$) that satisfy the Gray code mapping condition.

Figure 36B:
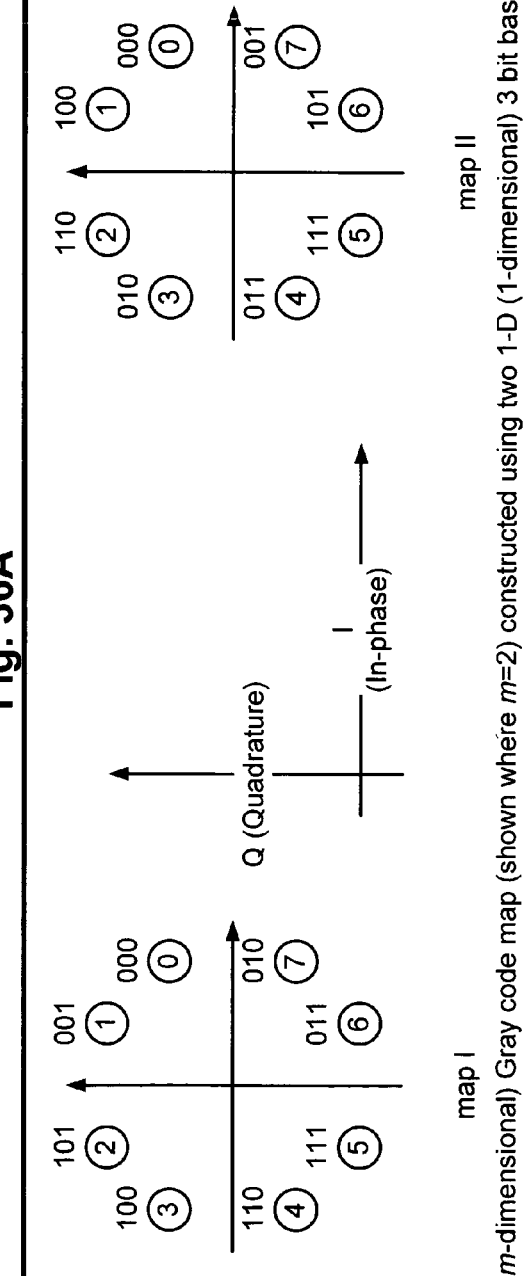
FIG. 36B is a diagram illustrating an embodiment of an m-D (m-dimensional) Gray code map (shown where m=2) constructed using two 1-D (1-dimensional) 3 bit basic Gray code maps (shown using 8 PSK shaped constellations) according to the invention.

FIG. 36B is a diagram illustrating an embodiment of an m-D (m-dimensional) Gray code map (shown where m=2) constructed using two 1-D (1-dimensional) 3 bit basic Gray code maps (shown using 8 PSK shaped constellations) according to the invention. This embodiment specifically shows a 2-D Gray code map that is used to map a 6 bit symbol to a 4-D 8 PSK modulation. This principle can also be generated to higher order values of Gray code maps (e.g. where m is higher than 2). Generally speaking, the combination of multiple 1-D Gray code mapped M PSK shaped constellations (where M is an integer) may be viewed as generating a multi-dimensional M PSK shaped constellation. In various embodiments, the LDPC codewords are mapped to their corresponding multi-dimensional M PSK shaped constellations using an m-D (m-dimensional) Gray code map. That is to say, each of the individual M PSK shaped constellations may also be mapped according to a 1-D space Gray code mapping, but the multi-dimensional M PSK shaped constellation (generated from the combination of the individual M PSK shaped constellations) is mapped using an m-D Gray code map such that LDPC codewords mapped thereto are part of such a multi-dimensional space Gray code mapped LDPC coded modulation signal that is generated according to the various aspects of the invention described herein.

In this particular diagram (FIG. 36B), these 3-bit basic Gray code maps (e.g., map I and map II) satisfy the Gray code mapping condition described above. The symbol value is shown next to the corresponding constellation points within each of the constellations. For example, the symbol 000=0 is shown next to its corresponding constellation point in each of the corresponding map I and map II.

FIG. 37 is a diagram illustrating an embodiment of a 2-D (2-dimensional) Gray code map (Gx) for rate 5/6 8 PSK LDPC coded modulation according to the invention. This 2-D Gray code map (Gx) is generated based on the map I and map II of the FIG. 36B. In this embodiment, the values on the left hand side, $A_{i,j}$, are the same as the values, $A_{i,j}(S_i^{(1)}, S_j^{(2)})$ (those values having the edge connected together as described with respect to FIG. 32), as described above with respect to 2-D Gray code maps. In this embodiment, however, every 6-bit vector on the right hand side of this diagram is represented by an octal number (e.g., as 2 examples in octal: 33=011011 and 54=101100).

Looking at some specific examples within this 2-D Gray code map (Gx):

6-bit symbol, $A_{0,0}$, is mapped according to Gx to 0=000000 (octal);

6-bit symbol, $A_{0,1}$, is mapped according to Gx to 1=000001 (octal);

6-bit symbol, $A_{1,2}$, is mapped according to Gx to 11=001001 (octal);

6-bit symbol, $A_{0,3}$, is mapped according to Gx to 10=001000 (octal); and so on.

As mentioned above with respect to some of the other embodiments, any number of decoding approaches may be employed to decode the LDPC coded modulation decoding of multi-dimensional space Gray code mapped signals. However, there is one additional concern: the bit metric needs to be obtained from the symbol metric obtained.

Looking at the particular embodiment that employs a 4-D 8 PSK modulation using a 2-D Gray code map, the bit metric must be obtained in a 4-D 8 PSK constellation set. Therefore, one hardware modification is that dealing with the symbol metric computation. These computed symbol metrics are then decomposed to bit metrics. With respect to a 2-D Gray code map to a single 8 PSK constellation, 8 symbol metrics need to be computed for a symbol block size of 2N. However, when using a 2-D Gray code map, then 64 symbol metrics need to be computed for a block of length N. While this may appear to be a relatively large increase in computational complexity, it is noted that the symbol metrics need only to be calculated once. Therefore, if the same hardware is used as within any of the other decoding approaches presented above that perform decoding of LDPC coded modulation systems using a 1-D Gray code map, then the latency of computing the bit metrics (which are decomposed from the symbol metrics) in increased. However, as mentioned, this step need only be performed once before the iterative decoding processing continues to decode the signal of interest.

In an alternative embodiment, where such latency in computational processing is undesired, then a small amount of additional hardware may be implemented to carry out these additional computations. It is noted again that this "additional hardware" is in comparison to such a hardware implementation that has been designed originally to perform decoding of LDPC coded modulation systems using a 1-D Gray code map. With the foresight of this type of a system that employs a 2-D Gray code map, a more efficient design may be achieved.

Moreover, with an intelligent selection of the 2-D Gray code map to be employed, the performance improvement provided by such a system (when compared to a system employing a 1-D Gray code map) may be significantly improved. The FIG. 41 provided below provides a comparison of two rate 5/6 8 PSK coded modulation systems with block length 43200 bit LDPC code are presented.

Figure 38:
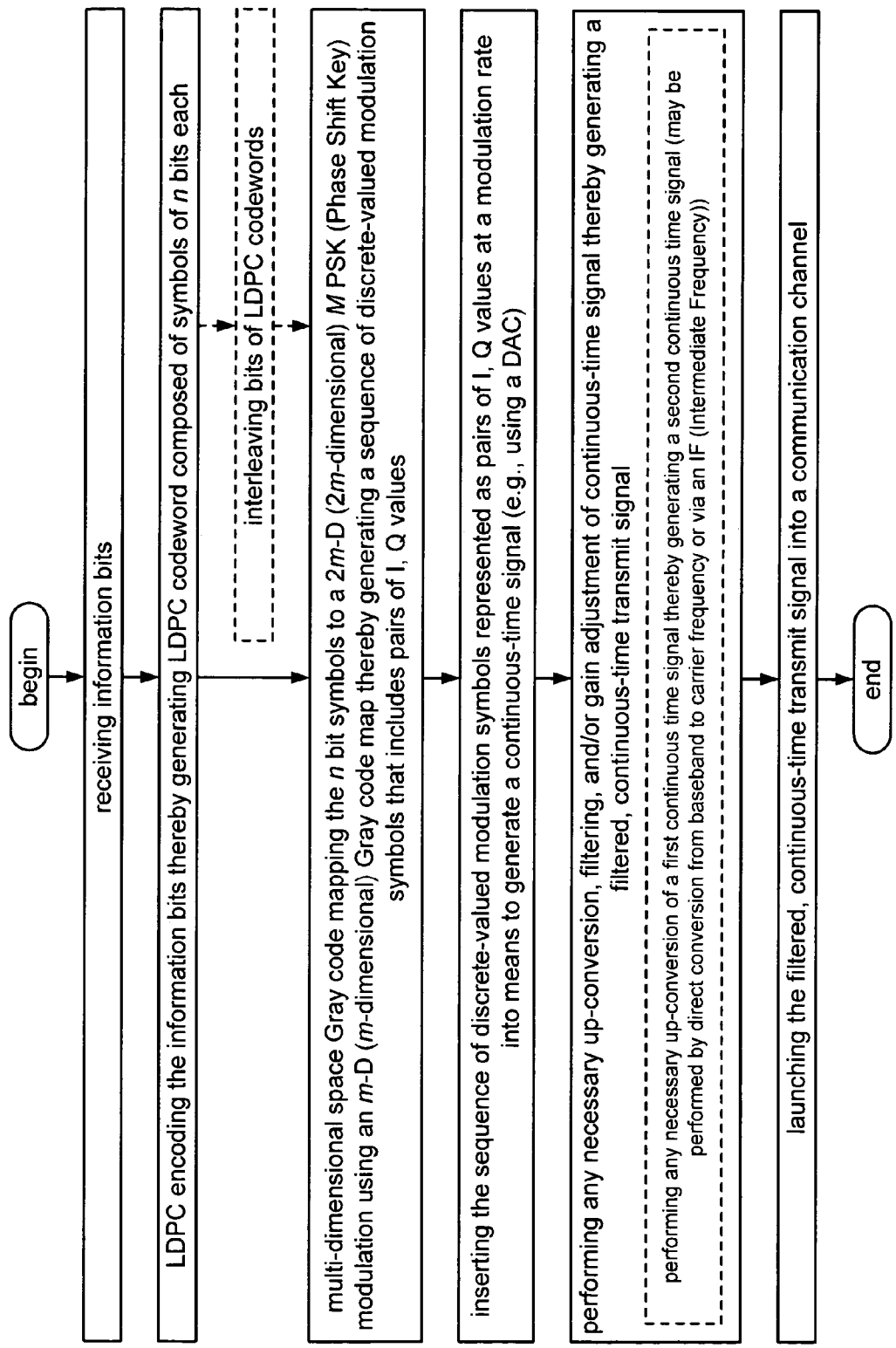
FIG. 38 is a diagram illustrating an embodiment of a method for transmit processing multi-dimensional space Gray code mapped LDPC coded modulation signals according to certain aspects of the invention.

FIG. 38 is a diagram illustrating an embodiment of a method for transmit processing multi-dimensional space Gray code mapped LDPC coded modulation signals according to certain aspects of the invention. This diagram shows a method that may be viewed as being performed at a transmitter end of a communication channel. This method involves the generation of a multi-dimensional space Gray code mapped LDPC coded modulation signal as well as any operations to that multi-dimensional space Gray code mapped LDPC coded modulation signal to comport it to a communication channel into which a corresponding continuous-time transmit signal is to be launched.

Initially, this method involves receiving information bits. These information bits correspond to the actual information that is desired to be transmitted from one end of a communication channel to the other. At the other end, an effort to making best estimates of these original information bits is made. Continuing on, this method involves LDPC encoding the information bits thereby generating an LDPC codeword composed of symbols of n bits each. In some instances, the method may also involve interleaving the bits of a LDPC codeword after encoding them using an LDPC code.

The method then continues on by multi-dimensional space Gray code mapping each symbol (that is generated from the LDPC codeword) to a 2m-D (2m-dimensional) M PSK (Phase Shift Key) modulation using an m-D (m-dimensional) Gray code map thereby generating a sequence of discrete-valued modulation symbols that includes pairs of I, Q values. It is also noted that n, m, and M are all integers. Each symbol within the sequence of discrete-valued modulation symbols may be viewed as including more than one corresponding I, Q value. At this point, the sequence of discrete-valued modulation symbols may be viewed as being a multi-dimensional space Gray code mapped LDPC coded modulation signal (being in completely digital form at this point).

The method then involves inserting each symbol of the sequence of discrete-valued modulation symbols represented as pairs of I, Q values at a modulation rate into means to generate a continuous-time signal. For example, this may be performed using a DAC (Digital to Analog Converter).

Afterwards, once this continuous-time signal (typically at a baseband frequency) is output from the DAC or substantially equivalent means, the method may involve performing any necessary up-conversion, filtering, and/or gain adjustment of the continuous-time signal (e.g., the continuous-time baseband signal) thereby generating a filtered, continuous-time transmit signal. There may be some instances where no up-conversion, filtering, and/or gain adjustment needs to be made, and the continuous-time signal output from a DAC or equivalent means is already in a format that comports to a communication channel into which it is to be launched.

In some instances, this up-conversion, filtering, and/or gain adjustment of the continuous-time signal involves performing any necessary up-conversion of a first continuous-time signal thereby generating a second continuous-time signal. As an example, this up-conversion may be performed by direct conversion from a baseband frequency to a carrier frequency, or this up-conversion may be performed via an IF (Intermediate Frequency) before generating a filtered, continuous-time transmit signal that is compatible with a communication channel into which the filtered, continuous-time transmit signal is to be launched. The method then involves launching the filtered, continuous-time transmit signal into a communication channel.

The following 2 diagrams show methods that may be viewed as being performed at a receiver end of a communication channel. These methods involve various alternatives by which a received continuous-time signal (whose information bits have been encoded using LDPC coded modulation encoding with multi-dimensional space Gray code maps) may be processed in an effort to make best estimates of the information bits that had been encoded therein. This received continuous-time signal may be viewed, in some embodiments, is being communication channel modified continuous-time transmit signal that had been launched into a communication channel at a transmitter end. Typically, a communication channel modifies (oftentimes undesirably) a continuous-time transmit signal that has been launched into and transmitted through it. Each of these 2 diagram illustrated and described below show some possible method alternatives by which the receive processing of such a received continuous-time signal (e.g., at a receiver end of a communication channel) may be performed in an effort ultimately to make best estimates of the information bits that had been encoded therein.

Figure 39:
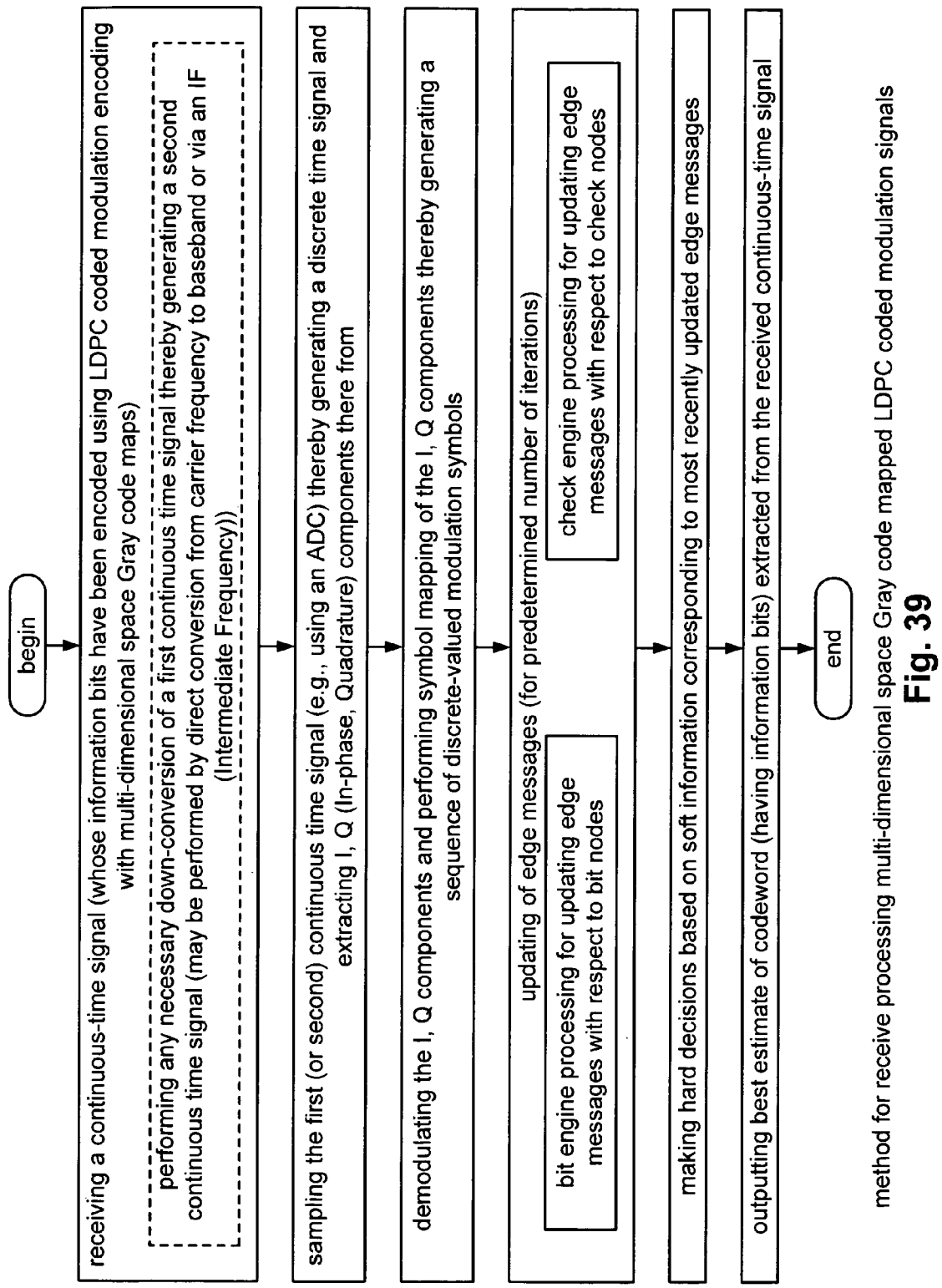
FIG. 39 is a diagram illustrating an embodiment of a method for receive processing multi-dimensional space Gray code mapped LDPC coded modulation signals according to certain aspects of the invention.

FIG. 39 is a diagram illustrating an embodiment of a method for receive processing multi-dimensional space Gray code mapped LDPC coded modulation signals according to certain aspects of the invention. The method initially involves receiving a continuous-time signal. The information bits of this received continuous-time signal have been encoded using LDPC coded modulation encoding with multi-dimensional space Gray code maps. This initially receiving and processing of the continuous-time signal may also involve performing any necessary down-conversion of a first continuous-time signal thereby generating a second continuous-time signal. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method.

The method also involves sampling the first (or second) continuous-time signal thereby generating a discrete time signal and extracting I, Q (In-phase, Quadrature) components there from; This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method then involves demodulating the I, Q components and performing symbol mapping of the I, Q components thereby generating a sequence of discrete-valued modulation symbols.

The next step of the method of this embodiment involves performing updating of edge messages for predetermined number of iterations. This step may be viewed as performing the LDPC decoding in accordance with any of the various embodiments described above. It is again noted that this decoding also involves decomposing the symbol metrics to bit metrics to accommodate the multi-dimensional aspects of the multi-dimensional space Gray code mapped LDPC coded modulation signal from which best estimates of information bits contained therein is to be made. This LDPC decoding generally involves bit engine processing for updating edge messages with respect to bit nodes as well as check engine processing for updating edge messages with respect to check nodes.

After the final decoding iteration of the predetermined number of decoding iterations, the method involves making hard decisions based on soft information corresponding to most recently updated edge messages with respect to the bit nodes. The method ultimately involves outputting a best estimate of the codeword (that includes the information bits) that has bee extracted from the received continuous-time signal.

Figure 40:
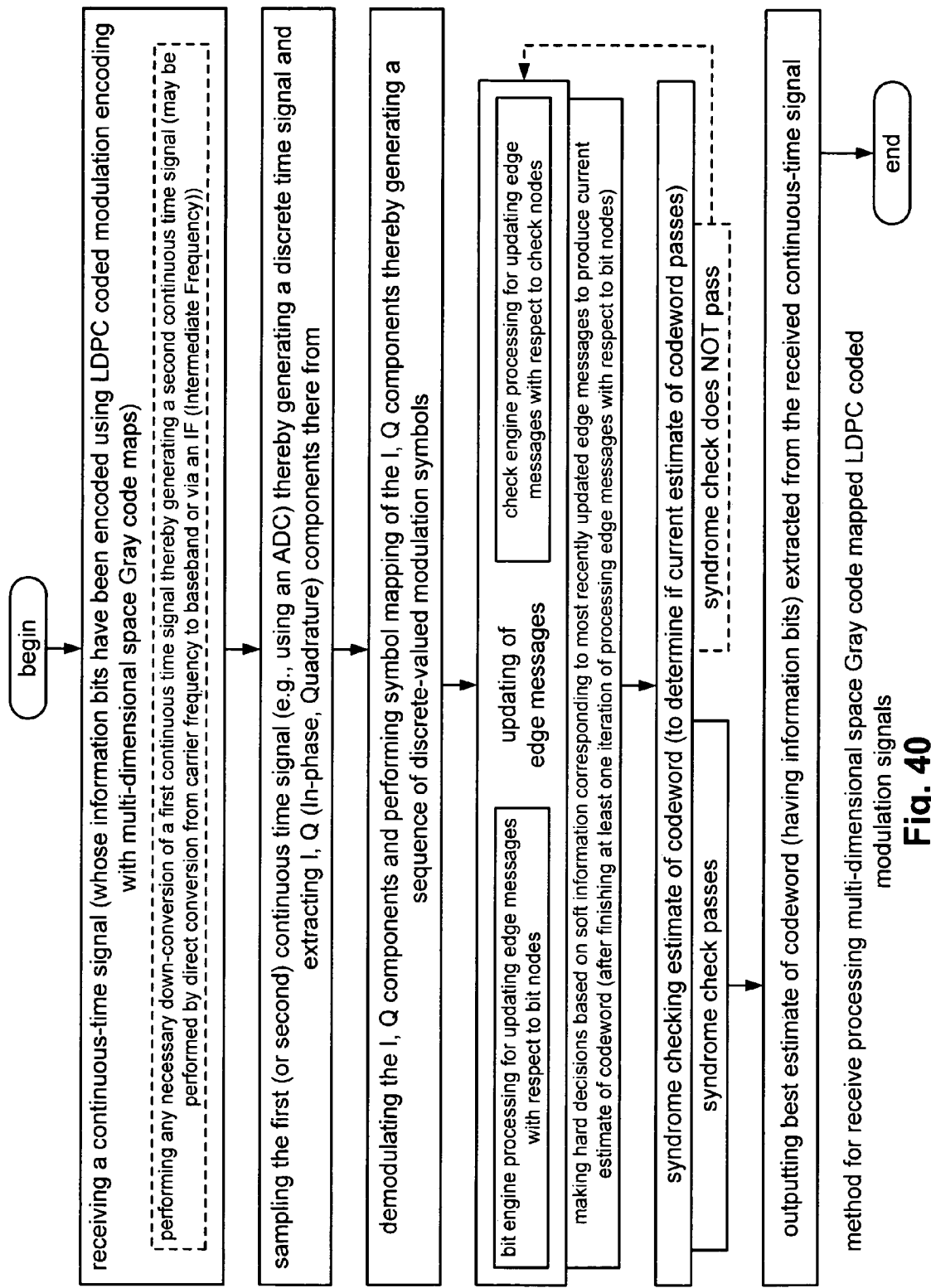
FIG. 40 is a diagram illustrating an alternative embodiment of a method for receive processing multi-dimensional space Gray code mapped LDPC coded modulation signals according to certain aspects of the invention.

FIG. 40 is a diagram illustrating an alternative embodiment of a method for receive processing multi-dimensional space Gray code mapped LDPC coded modulation signals according to certain aspects of the invention. This method initially operates very similarly to the embodiment described with respect to the immediately above referenced method embodiment.

For example, the method initially involves receiving a continuous-time signal. The information bits of this received continuous-time signal have been encoded using LDPC coded modulation encoding with multi-dimensional space Gray code maps. This initially receiving and processing of the continuous-time signal may also involve performing any necessary down-conversion of a first continuous-time signal thereby generating a second continuous-time signal. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method.

The method also involves sampling the first (or second) continuous-time signal thereby generating a discrete time signal and extracting I, Q (In-phase, Quadrature) components there from. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method then involves demodulating the I, Q components and performing symbol mapping of the I, Q components thereby generating a sequence of discrete-valued modulation symbols.

This is where the operation of this method departs from the operation of the method of the previous diagram. The next step of the method of this embodiment involves performing updating of edge messages. The criteria by which to stop performing decoding iterations is governed by performing syndrome checking of a current estimate of the codeword as opposed to simply a predetermined number of decoding iterations as indicated within the previous embodiment. Still, this step may nevertheless be viewed as performing the LDPC decoding in accordance with any of the various embodiments described above. It is again noted that this decoding also involves decomposing the symbol metrics to bit metrics to accommodate the multi-dimensional aspects of the multi-dimensional space Gray code mapped LDPC coded modulation signal from which best estimates of information bits contained therein is to be made. This LDPC decoding generally involves bit engine processing for updating edge messages with respect to bit nodes as well as check engine processing for updating edge messages with respect to check nodes. However, the criteria by which to stop performing decoding iterations is now governed in this embodiment as a function of the syndrome check calculations.

In this particular embodiment, the method involves making hard decisions based on soft information corresponding to edge messages to produce a current estimate of the codeword during each decoding iteration. Also, it is noted that this making of hard decisions is performed only after bit engine processing has finished at least one decoding iteration.

After this current estimate of the codeword is made, then the method involves performing syndrome checking of the current estimate of the codeword. This is performed to determine if this current estimate of the codeword indeed passes the syndrome check. If the syndrome check does NOT pass, then the method involves returning to the updating of edge messages step. However, if it is found that the syndrome check does in fact pass, then the method involves outputting a best estimate of the codeword having the information bits that has been extracted from the received continuous-time signal.

It is also noted that a combination method of decoding such multi-dimensional space Gray code mapped LDPC coded modulation signals may be performed using aspects of each of the decoding methods described above (e.g., using aspects of each of the methods of the FIG. 39 and the FIG. 40). For example, the syndrome check could be made during each decoding iteration. Then, if the syndrome check passes, then the method would operate accordingly to make best estimates of the information bits. However, if the syndrome check continues to fail (i.e., does not pass) during ongoing decoding iterations, then method could cease to perform decoding iterations after a predetermined number of decoding iterations had been performed. That is to say, if the syndrome check passes before a predetermined number of decoding iterations have been performed, then the decoding iteration at which the syndrome check dos in fact pass is then deemed to be the last decoding iteration. However, if a solution fails to be converged upon (i.e., the syndrome check continues NOT to pass), then the method stops performing subsequent decoding iterations after a predetermined number of decoding iterations have been performed.

As mentioned above, with an intelligent selection of the 2-D Gray code map to be employed, the performance improvement provided by such a system (when compared to a system employing a 1-D Gray code map) may be significantly improved as shown with respect to the comparison of two rate 5/6 8 PSK coded modulation systems with block length 43200 bit LDPC code that is presented with respect to FIG. 41.

More specifically, the performances of various decoding approaches of a received symbol block are compared in the following diagram. The following diagram shows the improvement provided by the invention of performing LDPC coded modulation decoding of 2-D space Gray code mapped signals when compared to performing LDPC coded modulation decoding of 1-D space Gray code mapped signals. This performance diagram is described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

FIG. 41 is a diagram illustrating an embodiment of performance comparison of performance comparison of two LDPC (Low Density Parity Check) coded modulation systems according to certain aspects of the invention. As can be seen within this comparative performance diagram, for a variety of values of $E_b/N_o$ (or SNR), the BER that may be achieved when employing LDPC coded modulation signals that have been mapped using multi-dimensional space Gray code maps. More specifically, the performance improvement provided by using LDPC coded modulation signals that have been mapped using 2-D space Gray code maps when compared to using 1-D space Gray code maps is significant— typically more than 2 orders of magnitude improved performance.

Two different decoding approaches are compared when decoding LDPC coded modulation signals. Within this comparison, the block size of the LDPC code is 43200, and the signal is a code rate 5/6 8 PSK (8 Phase Shift Key) LDPC coded modulation signal; the decoding processing performs 50 decoding iterations in this illustrative embodiment.

As one example, the worse performing performance curve corresponds to LDPC coded modulation signals that have been mapped using 1-D space Gray code maps; when operating at an $E_b/N_o$ of approximately 5.4 dB (decibels), the BER of the 1-D approach is approximately $4.5 \times 10^{-6}$.

The better performance curve corresponds to LDPC coded modulation signals that have been mapped using 2-D space Gray code maps; for this decoding approach, when operating at an $E_b/N_o$ of approximately 5.4 dB, the BER of the 2-D approach decreases significantly to approximately $1.25 \times 10^{-8}$.

As can be seen, an improvement of over approximately two orders of magnitude of performance may be achieved when using LDPC coded modulation signals that have been mapped using 2-D space Gray code maps when compared to using 1-D space Gray code maps.

Looking from another perspective, when considering operation of these 2 approaches at a common BER, then the increase of performance, with respect to $E_b/N_o$ (or SNR), provided by the 4-D 8 PSK modulation scheme using a 2-D Gray code map is at least 0.07 dB. Oftentimes, when comparing communication systems, a common BER is selected and it is then determined which system can provide that same BER at the lower $E_b/N_o$ (or SNR). In this case, the 4-D 8 PSK modulation scheme using a 2-D Gray code map provides can operate at a lower $E_b/N_o$ (or SNR) of approximately 0.07 dB less than the scheme using a 1-D Gray code map while still providing a comparable BER.

Various embodiments have been described herein. For example, a novel encoding approach has been shown that includes combining LDPC encoding and modulation encoding that is operable to generate LDPC variable code rate and/or modulation signals. In addition, a novel decoding approach has also been shown where hybrid decoding processing is employed within the iterative decoding processing of LDPC coded signals.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and thereby enabling division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. An encoder that is operable to generate a multi-dimensional space Gray code mapped LDPC (Low Density Parity Check) coded modulation signal, the encoder comprising:
an LDPC encoder that is operable to encode a plurality of information bits thereby generating an LDPC codeword that includes a plurality of LDPC coded bits;
wherein the plurality of LDPC coded bits is arranged into a plurality of symbols such that each symbol has a predetermined plurality (n) of bits, wherein n is an integer;
a multi-dimensional space Gray code mapper that is operable to map each symbol of the plurality of symbols to a 2m-D (2m-dimensional) M PSK (Phase Shift Key) modulation using an m-D (m-dimensional) cycle Gray code map thereby generating a sequence of discrete-valued modulation symbols that comprise a digital format of the multi-dimensional space Gray code mapped LDPC coded modulation signal, wherein m and M are integers; and wherein:

the m-D cycle Gray code map is a one to one and onto map that maps a first matrix, that includes each symbol of the plurality of symbols, to a second matrix that includes a plurality of 2m-D M PSK Gray code mapped symbols;

the sequence of discrete-valued modulation symbols is composed of elements of the second matrix that are output from the multi-dimensional space Gray code mapper according to a predetermined order; and each symbol of the sequence of discrete-valued modulation symbols includes at least two pairs of I, Q (In-phase, Quadrature) values that are output from the multi-dimensional space Gray code mapper sequentially as a function of time.

2. The encoder of claim 1, further comprising:
an interleaver, interposed between the LDPC encoder and the multi-dimensional space Gray code mapper, that interleaves the plurality of LDPC coded bits of the LDPC codeword thereby generating the plurality of symbols.

3. The encoder of claim 1, wherein:
the 2m-D M PSK modulation includes a first 1-D (1-dimensional) M PSK shaped constellation whose constellation points are mapped according to a first 1-D space Gray code mapping; and
the 2m-D M PSK modulation includes a second 1-D M PSK shaped constellation whose constellation points are mapped according to a second 1-D space Gray code mapping.

4. The encoder of claim 1, wherein:
n is equal to 6 such that each symbol of the plurality of symbols includes 6 bits;
m is equal to 2 and M is equal to 8 such that the multi-dimensional space Gray code mapper that maps each 6 bit symbol of the plurality of symbols to a 4-D 8 PSK modulation using a 2-D (2-dimensional) Gray code map;
the 4-D 8 PSK modulation includes a first 1-D (1-dimensional) 8 PSK shaped constellation whose constellation points are mapped according to a first 1-D space Gray code mapping;
the 4-D 8 PSK modulation includes a second 1-D 8 PSK shaped constellation whose constellation points are mapped according to a second 1-D space Gray code mapping; and
each symbol of the discrete-valued modulation symbols includes two pairs of I, Q values.

5. The encoder of claim 1, wherein:
the LDPC encoder employs a rate 5/6 LDPC code;
n is equal to 6 such that each symbol of the plurality of symbols includes 6 bits; and
each symbol within the plurality of symbols includes a redundancy bit.

6. The encoder of claim 1, wherein:
the multi-dimensional space Gray code mapper is operable to generate an LDPC codeword matrix whose elements include each n bit symbol of the plurality of symbols; and
the LDPC codeword matrix is the first matrix.

7. The encoder of claim 1, wherein:
the encoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

8. An encoder that is operable to generate a multi-dimensional space Gray code mapped LDPC (Low Density Parity Check) coded modulation signal, the encoder comprising:
an LDPC encoder that is operable to encode a plurality of information bits thereby generating an LDPC codeword that includes a plurality of LDPC coded bits;
an interleaver that is operable to interleave the plurality of LDPC coded bits of the LDPC codeword thereby generating a plurality of symbols such that each symbol has a predetermined plurality (n) of bits, wherein n is an integer;
a multi-dimensional space Gray code mapper that is operable to map each symbol of the plurality of symbols to a 2m-D (2m-dimensional) M PSK (Phase Shift Key) modulation using an m-D (m-dimensional) cycle Gray code map thereby generating a sequence of discrete-valued modulation symbols that comprise a digital format of the multi-dimensional space Gray code mapped LDPC coded modulation signal, wherein m and M are integers; and wherein:
the m-D cycle Gray code map is a one to one and onto map that maps a first matrix, that includes each symbol of the plurality of symbols, to a second matrix that includes a plurality of 2m-D M PSK Gray code mapped symbols;
the sequence of discrete-valued modulation symbols is composed of elements of the second matrix that are output from the multi-dimensional space Gray code mapper according to a predetermined order;
each symbol of the sequence of discrete-valued modulation symbols includes at least two pairs of I, Q (In-phase, Quadrature) values that are output from the multi-dimensional space Gray code mapper sequentially as a function of time;
the 2m-D M PSK modulation includes a first 1-D (1-dimensional) M PSK shaped constellation whose constellation points are mapped according to a first 1-D space Gray code mapping; and
the 2m-D M PSK modulation includes a second 1-D M PSK shaped constellation whose constellation points are mapped according to a second 1-D space Gray code mapping.

9. The encoder of claim 8, wherein:
n is equal to 6 such that each symbol of the plurality of symbols includes 6 bits;
m is equal to 2 and M is equal to 8 such that the multi-dimensional space Gray code mapper that maps each 6 bit symbol of the plurality of symbols to a 4-D 8 PSK modulation using a 2-D (2-dimensional) Gray code map;
the 4-D 8 PSK modulation includes a first 1-D (1-dimensional) 8 PSK shaped constellation whose constellation points are mapped according to a first 1-D space Gray code mapping;

the 4-D 8 PSK modulation includes a second 1-D 8 PSK shaped constellation whose constellation points are mapped according to a second 1-D space Gray code mapping; and each symbol of the discrete-valued modulation symbols includes two pairs of I, Q values.

10. The encoder of claim 8, wherein:

the LDPC encoder employs a rate 5/6 LDPC code;

n is equal to 6 such that each symbol of the plurality of symbols includes 6 bits; and each symbol within the plurality of symbols includes a redundancy bit.

11. The encoder of claim 8, wherein:

the multi-dimensional space Gray code mapper is operable to generate an LDPC codeword matrix whose elements include each n bit symbol of the plurality of symbols; and the LDPC codeword matrix is the first matrix.

12. The encoder of claim 8, wherein:

the encoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

13. A communication device that is operable to generate a multi-dimensional space Gray code mapped LDPC (Low Density Parity Check) coded modulation signal, the communication device comprising:

an LDPC encoder that is operable to encode a plurality of information bits thereby generating an LDPC codeword that includes a plurality of LDPC coded bits;

an interleaver that interleaves the plurality of LDPC coded bits of the LDPC codeword thereby generating a plurality of symbols such that each symbol has a predetermined plurality (n) of bits, wherein n is an integer;

a multi-dimensional space Gray code mapper that is operable to map each symbol of the plurality of symbols to a 2m-D (2m-dimensional) M PSK (Phase Shift Key) modulation using an m-D (m-dimensional) cycle Gray code map thereby generating a sequence of discrete-valued modulation symbols that comprise a digital format of the multi-dimensional space Gray code mapped LDPC coded modulation signal, wherein m and M are integers;

wherein the m-D cycle Gray code map is a one to one and onto map that maps a first matrix, that includes each symbol of the plurality of symbols, to a second matrix that includes a plurality of 2m-D M PSK Gray code mapped symbols;

wherein the sequence of discrete-valued modulation symbols is composed of elements of the second matrix that are output from the multi-dimensional space Gray code mapper according to a predetermined order;

wherein each symbol of the sequence of discrete-valued modulation symbols includes at least two pairs of I, Q (In-phase, Quadrature) values that are output from the multi-dimensional space Gray code mapper sequentially as a function of time;

a DAC (Digital to Analog Converter) that is operable to generate a continuous-time baseband signal using each pair of I, Q values of the at least two pairs of I, Q values corresponding to each symbol of the sequence of discrete-valued modulation symbols; and a channel modulator that is operable to transform the continuous-time baseband signal to a continuous-time transmit signal and to launch the continuous-time transmit signal into a communication channel to which the communication device is communicatively coupled.

14. The communication device of claim 13, wherein:

channel modulator is operable to perform any one of amplification, filtering, and frequency conversion to the continuous-time baseband signal thereby ensuring that the continuous-time transmit signal comports to the communication channel into which the continuous-time transmit signal is launched.

15. The communication device of claim 13, wherein:

the 2m-D M PSK modulation includes a first 1-D (1-dimensional) M PSK shaped constellation whose constellation points are mapped according to a first 1-D space Gray code mapping; and the 2m-D M PSK modulation includes a second 1-D M PSK shaped constellation whose constellation points are mapped according to a second 1-D space Gray code mapping.

16. The communication device of claim 13, wherein:

n is equal to 6 such that each symbol of the plurality of symbols includes 6 bits;

m is equal to 2 and M is equal to 8 such that the multi-dimensional space Gray code mapper that maps each 6 bit symbol of the plurality of symbols to a 4-D 8 PSK modulation using a 2-D (2-dimensional) Gray code map;

the 4-D 8 PSK modulation includes a first 1-D (1-dimensional) 8 PSK shaped constellation whose constellation points are mapped according to a first 1-D space Gray code mapping;

the 4-D 8 PSK modulation includes a second 1-D 8 PSK shaped constellation whose constellation points are mapped according to a second 1-D space Gray code mapping; and each symbol of the discrete-valued modulation symbols includes two pairs of I, Q values.

17. The communication device of claim 13, wherein:

the LDPC encoder employs a rate 5/6 LDPC code;

n is equal to 6 such that each symbol of the plurality of symbols includes 6 bits; and each symbol within the plurality of symbols includes a redundancy bit.

18. The communication device of claim 13, wherein:

the multi-dimensional space Gray code mapper is operable to generate an LDPC codeword matrix whose elements include each n bit symbol of the plurality of symbols; and the LDPC codeword matrix is the first matrix.

19. The communication device of claim 13, wherein:

the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

20. A method for generating a multi-dimensional space Gray code mapped LDPC (Low Density Parity Check) coded modulation signal, the method comprising:

encoding a plurality of information bits according to an LDPC code thereby generating an LDPC codeword that includes a plurality of LDPC coded bits;

arranging the plurality of LDPC coded bits into a plurality of symbols such that each symbol has a predetermined plurality (n) of bits, wherein n is an integer;

multi-dimensional space Gray code mapping each symbol of the plurality of symbols to a 2m-D (2m-dimensional) M PSK (Phase Shift Key) modulation using an m-D (m-dimensional) cycle Gray code map thereby generating a sequence of discrete-valued modulation symbols that comprise a digital format of the multi-dimensional space Gray code mapped LDPC coded modulation signal, wherein m and M are integers, wherein each symbol of the sequence of discrete-valued modulation symbols includes at least two pairs of I, Q (In-phase, Quadrature) values;

employing the m-D cycle Gray code map, that is a one to one and onto map, to map a first matrix, that includes each symbol of the plurality of symbols, to a second matrix that includes a plurality of 2m-D M PSK Gray code mapped symbols; and outputting each pair of I, Q values of the at least two pairs of I, Q values corresponding to each symbol of the sequence of discrete-valued modulation symbols sequentially as a function of time, wherein the sequence of discrete-valued modulation symbols is composed of elements of the second matrix output there from according to a predetermined order.

21. The method of claim 20, further comprising:
interleaving the plurality of LDPC coded bits of the LDPC codeword thereby generating the plurality of symbols.

22. The method of claim 20, wherein:
the 2m-D M PSK modulation includes a first 1-D (1-dimensional) M PSK shaped constellation whose constellation points are mapped according to a first 1-D space Gray code mapping; and
the 2m-D M PSK modulation includes a second 1-D M PSK shaped constellation whose constellation points are mapped according to a second 1-D space Gray code mapping.

23. The method of claim 20, wherein:
n is equal to 6 such that each symbol of the plurality of symbols includes 6 bits;
m is equal to 2 and M is equal to 8 such that each 6 bit symbol of the plurality of symbols is multi-dimensional space Gray code mapped to a 4-D 8 PSK modulation using a 2-D (2-dimensional) Gray code map;
the 4-D 8 PSK modulation includes a first 1-D (1-dimensional) 8 PSK shaped constellation whose constellation points are mapped according to a first 1-D space Gray code mapping;
the 4-D 8 PSK modulation includes a second 1-D 8 PSK shaped constellation whose constellation points are mapped according to a second 1-D space Gray code mapping; and
each symbol of the discrete-valued modulation symbols includes two pairs of I, Q values.

24. The method of claim 20, wherein:
the LDPC code is a rate 5/6 LDPC code;
n is equal to 6 such that each symbol of the plurality of symbols includes 6 bits; and
each symbol within the plurality of symbols includes a redundancy bit.

25. The method of claim 20, further comprising:
generating an LDPC codeword matrix whose elements include each n bit symbol of the plurality of symbols; and wherein:
the LDPC codeword matrix is the first matrix.

26. The method of claim 20, wherein:
the method is performed within an encoder;
the encoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

27. A method for transmit processing a multi-dimensional space Gray code mapped LDPC (Low Density Parity Check) coded modulation signal, the method comprising encoding a plurality of information bits according to an LDPC code thereby generating an LDPC codeword that includes a plurality of LDPC coded bits;

interleaving the plurality of LDPC coded bits of the LDPC codeword thereby generating a plurality of symbols such that each symbol has a predetermined plurality (n) of bits, wherein n is an integer;

multi-dimensional space Gray code mapping each symbol of the plurality of symbols to a 2m-D (2m-dimensional) M PSK (Phase Shift Key) modulation using an m-D (m-dimensional) cycle Gray code map thereby generating a sequence of discrete-valued modulation symbols that comprise a digital format of the multi-dimensional space Gray code mapped LDPC coded modulation signal, wherein m and M are integers, wherein each symbol of the sequence of discrete-valued modulation symbols includes at least two pairs of I, Q (In-phase, Quadrature) values;

employing the m-D cycle Gray code map, that is a one to one and onto map, to map a first matrix, that includes each symbol of the plurality of symbols, to a second matrix that includes a plurality of 2m-D M PSK Gray code mapped symbols;

outputting each pair of I, Q values of the at least two pairs of I, Q values corresponding to each symbol of the sequence of discrete-valued modulation symbols sequentially as a function of time, wherein the sequence of discrete-valued modulation symbols is composed of elements of the second matrix output there from according to a predetermined order;

generating a continuous-time baseband signal using each pair of I, Q values of the at least two pairs of I, Q values corresponding to each symbol of the sequence of discrete-valued modulation symbols channel modulating the continuous-time baseband signal thereby generating a continuous-time transmit signal; and launching the continuous-time transmit signal into a communication channel.

28. The method of claim 27, wherein:

the channel modulating of the continuous-time baseband signal involves performing any one of amplification, filtering, and frequency conversion to the continuous-time baseband signal thereby ensuring that the continuous-time transmit signal comports to the communication channel into which the continuous-time transmit signal is launched.

29. The method of claim 27, wherein:

the 2m-D M PSK modulation includes a first 1-D (1-dimensional) M PSK shaped constellation whose constellation points are mapped according to a first 1-D space Gray code mapping; and the 2m-D M PSK modulation includes a second 1-D M PSK shaped constellation whose constellation points are mapped according to a second 1-D space Gray code mapping.

30. The method of claim 27, wherein:

n is equal to 6 such that each symbol of the plurality of symbols includes 6 bits;

m is equal to 2 and M is equal to 8 such that each 6 bit symbol of the plurality of symbols is multi-dimensional space Gray code mapped to a 4-D 8 PSK modulation using a 2-D (2-dimensional) Gray code map;

the 4-D 8 PSK modulation includes a first 1-D (1-dimensional) 8 PSK shaped constellation whose constellation points are mapped according to a first 1-D space Gray code mapping;

the 4-D 8 PSK modulation includes a second 1-D 8 PSK shaped constellation whose constellation points are mapped according to a second 1-D space Gray code mapping; and each symbol of the discrete-valued modulation symbols includes two pairs of I, Q values.

31. The method of claim 27, wherein:

the LDPC code is a rate 5/6 LDPC code;

n is equal to 6 such that each symbol of the plurality of symbols includes 6 bits; and each symbol within the plurality of symbols includes a redundancy bit.

32. The method of claim 27, further comprising:

generating an LDPC codeword matrix whose elements include each n bit symbol of the plurality of symbols; and wherein:

the LDPC codeword matrix is the first matrix.

33. The method of claim 27, wherein:

the method is performed within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

* * * * *